US012787291B2

(12) United States Patent
Kim et al.

(10) Patent No.: US 12,787,291 B2
(45) Date of Patent: Nov. 3, 2026

(54) SEMICONDUCTOR DEVICES

(71) Applicant: Samsung Electronics Co., Ltd., Suwon-si (KR)

(72) Inventors: Kang Lib Kim, Suwon-si (KR); Sungsu Moon, Suwon-si (KR); Seahoon Lee, Suwon-si (KR); Junhee Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 305 days.

(21) Appl. No.: 18/660,638

(22) Filed: May 10, 2024

(65) Prior Publication Data

US 2025/0024677 A1 Jan. 16, 2025

(30) Foreign Application Priority Data

Jul. 10, 2023 (KR) ........................ 10-2023-0089300

(51) Int. Cl.
*H10B 43/27* (2023.01)
*H10B 43/35* (2023.01)
*H10B 43/40* (2023.01)

(52) U.S. Cl.
CPC ............. *H10B 43/27* (2023.02); *H10B 43/35* (2023.02); *H10B 43/40* (2023.02)

(58) Field of Classification Search
CPC .................... H10B 43/10-50; H10B 51/10-50
See application file for complete search history.

(56) References Cited

U.S. PATENT DOCUMENTS

| | | | | |
|---|---|---|---|---|
| 10,381,081 | B2 | 8/2019 | Sugisaki et al. | |
| 11,296,102 | B2 | 4/2022 | Hwang et al. | |
| 2021/0151462 | A1* | 5/2021 | Baek | H10B 41/50 |
| 2022/0122912 | A1 | 4/2022 | Lim | |
| 2022/0399369 | A1 | 12/2022 | Son et al. | |
| 2024/0135993 | A1* | 4/2024 | Hsu | G11C 16/0483 |

FOREIGN PATENT DOCUMENTS

| | | |
|---|---|---|
| CN | 108899322 A | 11/2018 |
| CN | 110335868 A | 10/2019 |
| CN | 110473875 A | 11/2019 |

* cited by examiner

*Primary Examiner* — Leonard Chang
(74) *Attorney, Agent, or Firm* — Muir Patent Law, PLLC

(57) ABSTRACT

A semiconductor device includes a gate electrode structure, a memory channel structure, and first and second contact plugs. The gate electrode structure includes gate electrodes spaced apart from each other in a first direction, and each of the gate electrodes extends in a second direction. The gate electrode structure has a staircase shape including step layers each of which includes two gate electrodes. The memory channel structure extends through the gate electrode structure. The first contact plug contacts an upper surface of a first gate electrode of the two gate electrodes at an upper level in a corresponding step layer. The second contact plug contacts a sidewall of a second gate electrode of the two gate electrodes at a lower level in the corresponding step layer. The second contact plug extends in the first direction and is electrically insulated from gate electrodes disposed below the second gate electrode.

20 Claims, 63 Drawing Sheets

SEMICONDUCTOR DEVICES

CROSS-REFERENCE TO RELATED APPLICATIONS

This application claims priority under 35 USC § 119 to Korean Patent Application No. 10-2023-0089300, filed on Jul. 10, 2023 in the Korean Intellectual Property Office (KIPO), the contents of which are herein incorporated by reference in their entirety.

TECHNICAL FIELD

Aspects of inventive concept relate to a semiconductor device. More particularly, aspects of the inventive concept relate to a vertical memory device.

DISCUSSION OF RELATED ART

To meet the storage needs of an electronic system requiring data storage, a high capacity semiconductor device that may store high capacity data may be needed. Thus, a method of increasing the data storage capacity of the semiconductor device has been studied. For example, a semiconductor device including memory cells that may be 3-dimensionally stacked has been suggested.

In the semiconductor device, a method of efficiently arranging contact plugs for transferring electrical signals to gate electrodes sequentially stacked in a vertical direction is needed.

SUMMARY

Example embodiments provide a semiconductor device having improved characteristics.

According to an aspect of the inventive concept, there is provided a semiconductor device. The semiconductor device may include a gate electrode structure, a memory channel structure, a first contact plug and a second contact plug. The gate electrode structure may include gate electrodes spaced apart from each other on a substrate in a first direction perpendicular to an upper surface of the substrate, and each of the gate electrodes may extend in a second direction parallel to the upper surface of the substrate. The gate electrode structure may have a staircase shape, and may include step layers each of which includes two gate electrodes neighboring in the first direction among the gate electrodes. Steps of the step layers may be disposed in the second direction. The memory channel structure may extend through the gate electrode structure on the substrate. The first contact plug may contact an upper surface of a first gate electrode of the two gate electrodes included in a corresponding step layer of the step layers. The first gate electrode may be disposed at an upper level between the two gate electrodes, and the first contact plug may extend in the first direction. The second contact plug may contact a sidewall of a second gate electrode of the two gate electrodes in the corresponding step layer of the step layers, and the second gate electrode may be disposed at a lower level between the two gate electrodes. The second contact plug may extend in the first direction, and may be electrically insulated from gate electrodes disposed below the second gate electrode.

According to an aspect of the inventive concept, there is provided a semiconductor device. The semiconductor device may include a gate electrode structure, a memory channel structure, a first contact plug and a second contact plug. The gate electrode structure may include gate electrodes spaced apart from each other on a substrate in a first direction perpendicular to an upper surface of the substrate, and each of the gate electrodes may extend in a second direction parallel to the upper surface of the substrate. The memory channel structure may extend through the gate electrode structure on the substrate. The first contact plug may contact an upper surface of a first gate electrode of the gate electrodes, and the first contact plug may extend in the first direction. The second contact plug may contact a sidewall of a second gate electrode of the gate electrodes, and the second gate electrode may be directly under the first gate electrode. The second contact plug may extend in the first direction, and may be electrically insulated from gate electrodes disposed below the second gate electrode. The second contact plug may be disposed within an area defined by a contour of the first contact plug in a plan view.

According to an aspect of the inventive concept, there is provided a semiconductor device. The semiconductor device may include a lower circuit pattern, a common source plate (CSP), a gate electrode structure, a memory channel structure, a first contact plug and a second contact plug. The lower circuit pattern may be disposed on a substrate. The CSP may be disposed on the lower circuit pattern. The gate electrode structure may include gate electrodes spaced apart from each other on a substrate in a first direction perpendicular to an upper surface of the substrate, and each of the gate electrodes may extend in a second direction parallel to the upper surface of the substrate. The gate electrode structure may have a staircase shape, and may include step layers each of which includes two gate electrodes neighboring in the first direction among the gate electrodes. Steps of the step layers may be disposed in the second direction. The memory channel structure may extend through the gate electrode structure on the CSP. The first contact plug may contact an upper surface of a first gate electrode of the two gate electrodes included in a corresponding step layer of the step layers. The first gate electrode may be disposed at an upper level between the two gate electrodes, and the first contact plug may extend in the first direction. The second contact plug may contact a sidewall of a second gate electrode of the two gate electrodes in the corresponding step layer of the step layers, and the second gate electrode may be disposed at a lower level between the two gate electrodes. The second contact plug may extend through in the first direction, and may be electrically insulated from the CSP and gate electrodes disposed below the second gate electrode.

In the method of manufacturing a semiconductor device in accordance with example embodiments, when the gate electrode structure having a staircase shape is formed, instead of forming the step layer including a single gate electrode, the step layer may be formed to include a pair of gate electrodes neighboring in the first direction. Thus, the number of photo processes for forming the step layers may be reduced.

Additionally, the gate electrodes neighboring in the first direction may be electrically connected to the first and second upper contact plugs, respectively. The first upper contact plug may be electrically connected to the lower circuit pattern, while the second upper contact plug may be electrically connected to the upper wiring. Thus, the first and second contact plugs and the wirings for transferring and applying electrical signals to the gate electrodes may be disposed at lower and upper portions, respectively, of the semiconductor device so as to reduce the area for forming the first and second contact plugs and the wirings. Accordingly, the semiconductor device may have enhanced integration degree.

DETAILED DESCRIPTION

Hereinafter, a semiconductor device, a method for manufacturing the same, and a mass data storage system including the semiconductor device in accordance with example embodiments will be described in detail with reference to the accompanying drawings. It will be understood that, although the terms "first," "second," and/or "third" may be used herein to describe various elements, these elements should not be limited by these terms. These terms are only used to distinguish one element from another element.

In the specification (and not necessarily in the claims), a vertical direction substantially perpendicular to an upper surface of a substrate may be referred to as a first direction D1, and two directions crossing each other among horizontal directions substantially parallel to the upper surface of the substrate may be referred to as second and third directions D2 and D3, respectively. In example embodiments, the second and third directions D2 and D3 may be substantially perpendicular to each other.

FIGS. 1 to 6 are plan views and cross-sectional views illustrating a semiconductor device, for example, a vertical channel NAND flash memory device in accordance with example embodiments.

Figure 1:
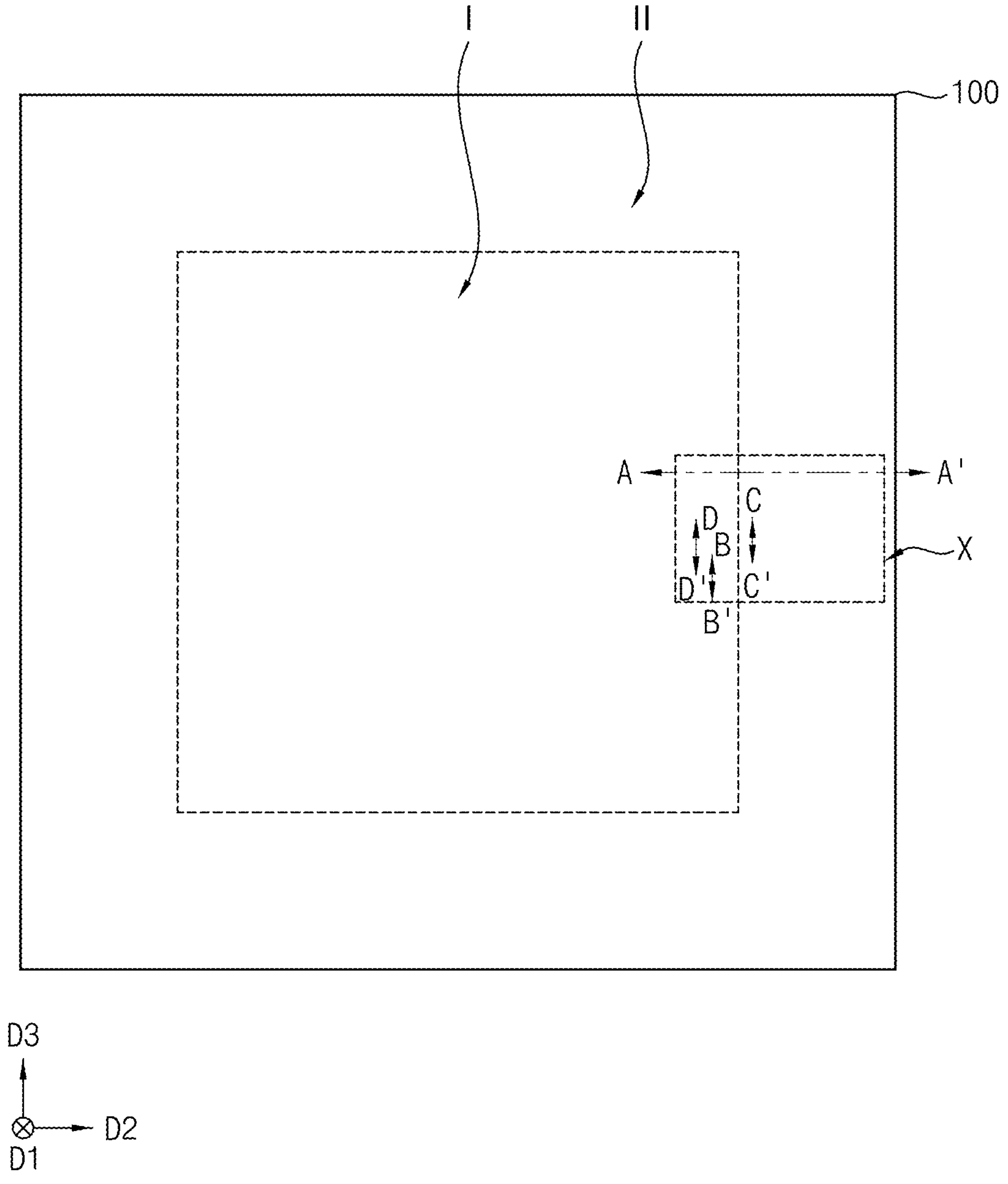
FIGS. 1 to 6 are plan views and cross-sectional views illustrating a semiconductor device.
Figure 2:
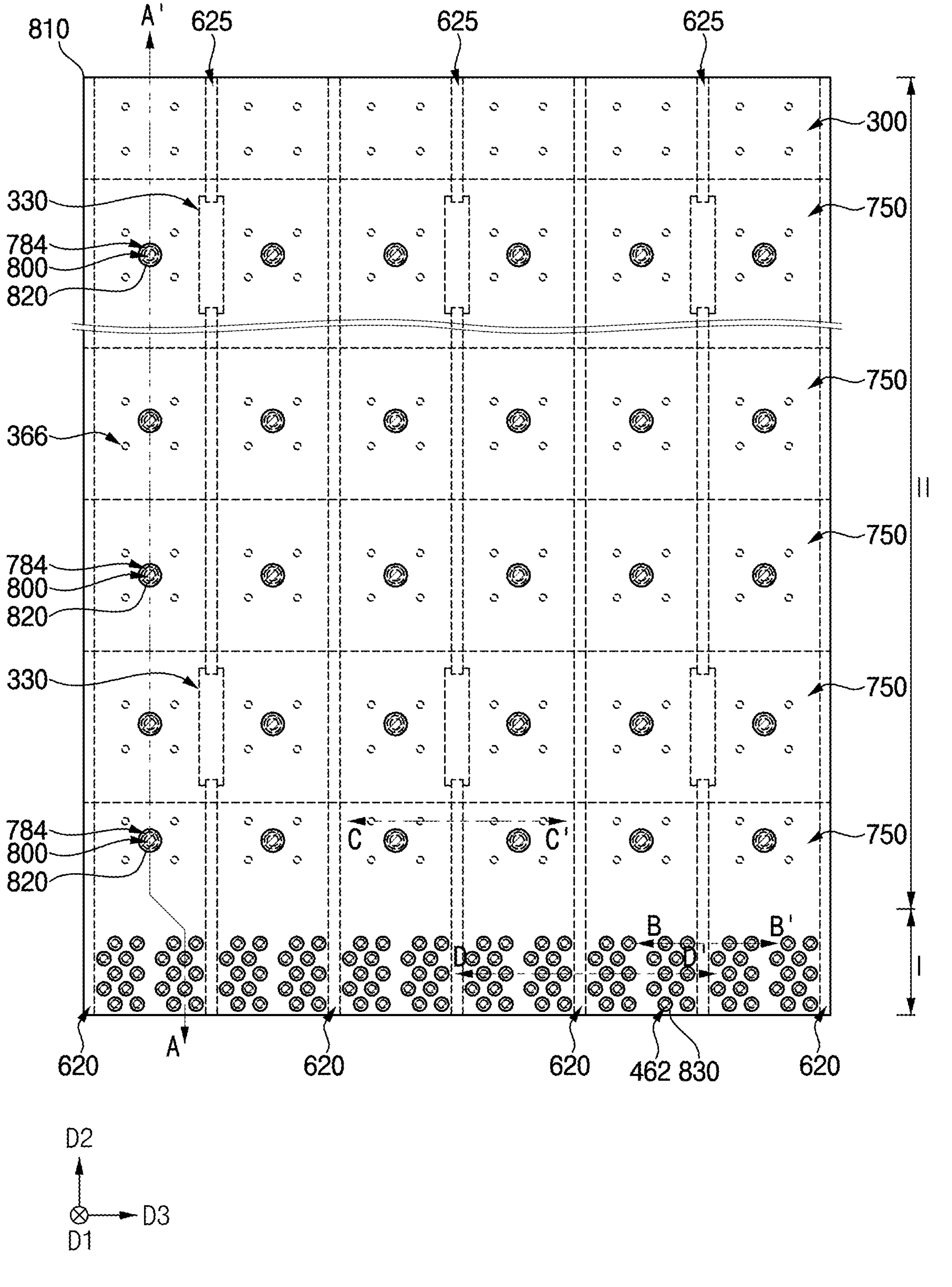
Figure 3:
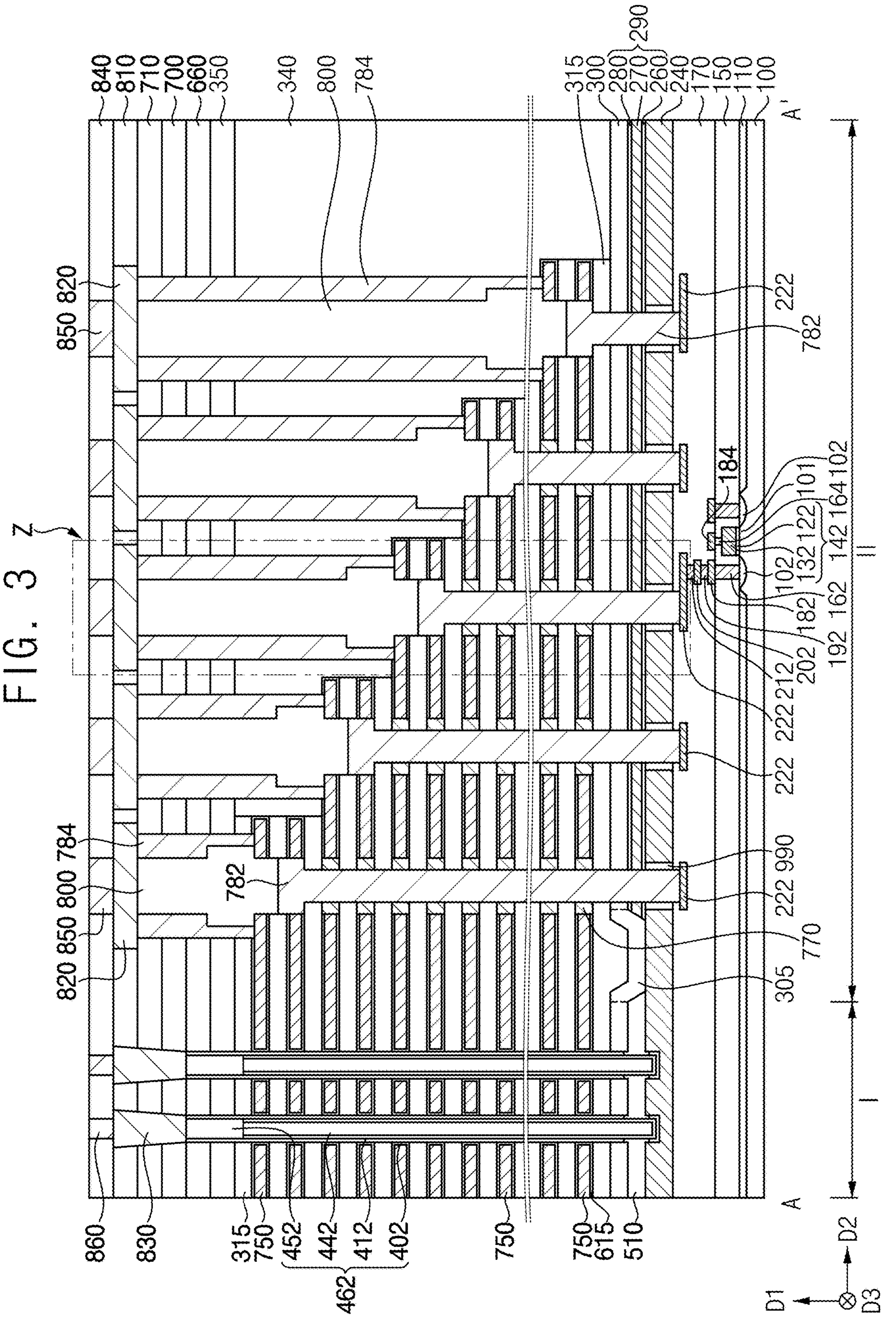
Figure 4:
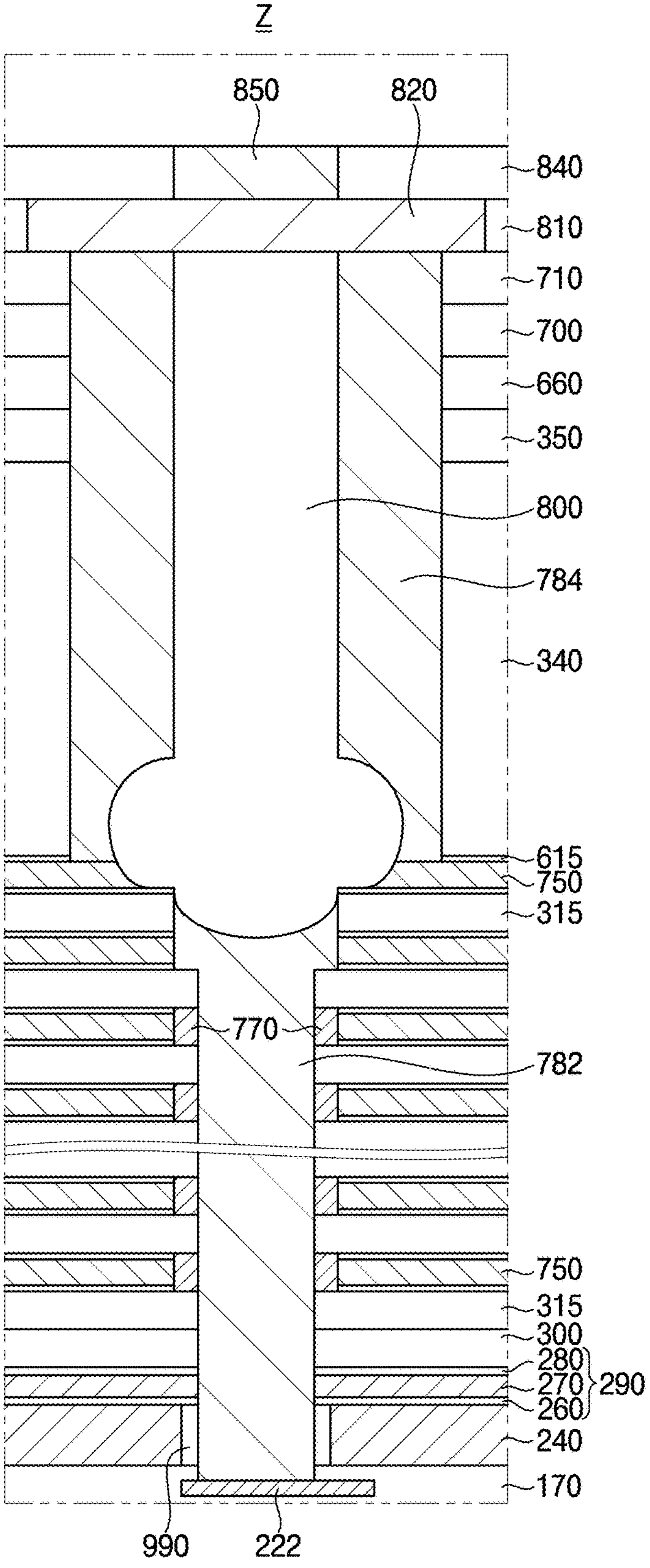
Figure 5:
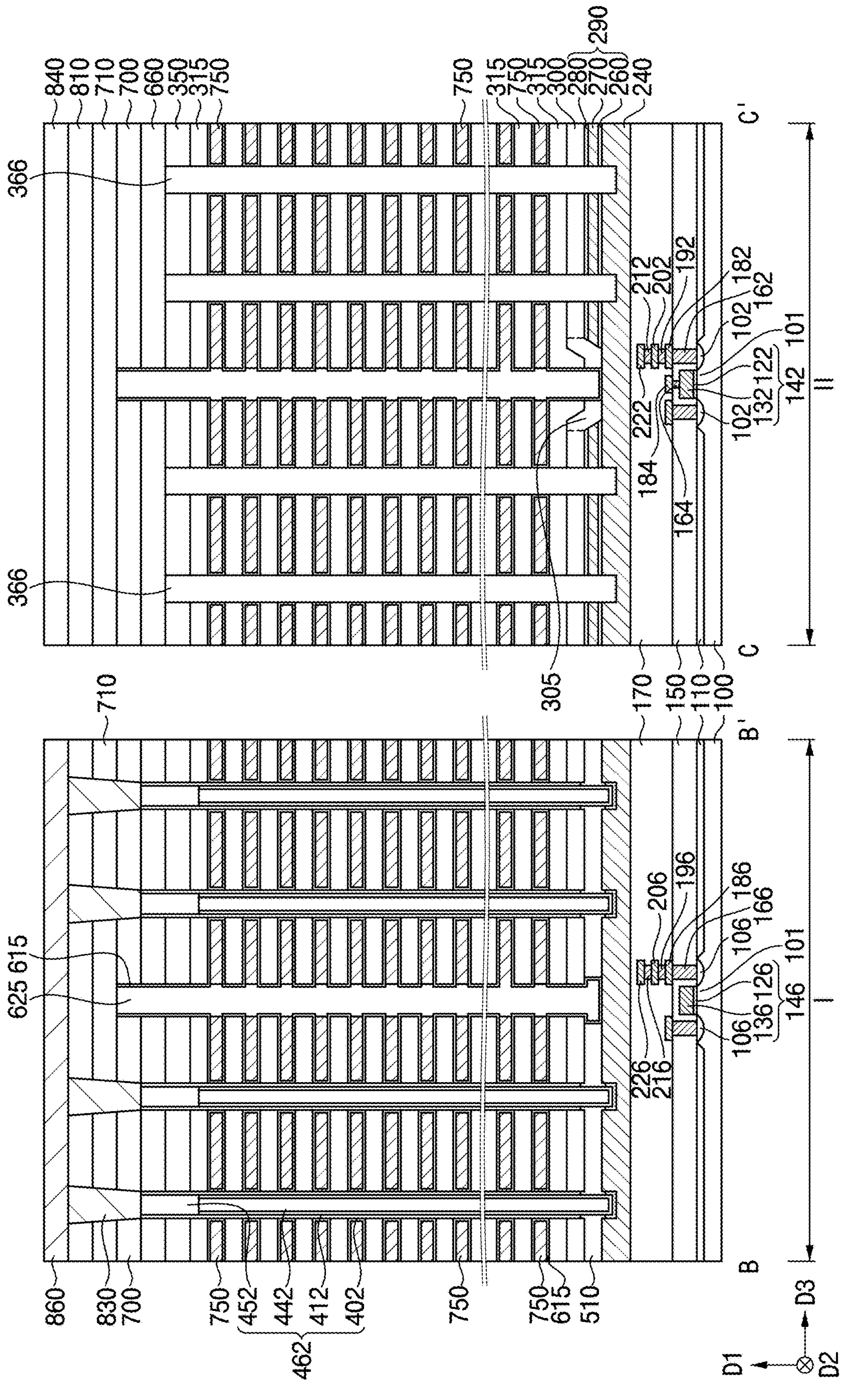
Figure 6:
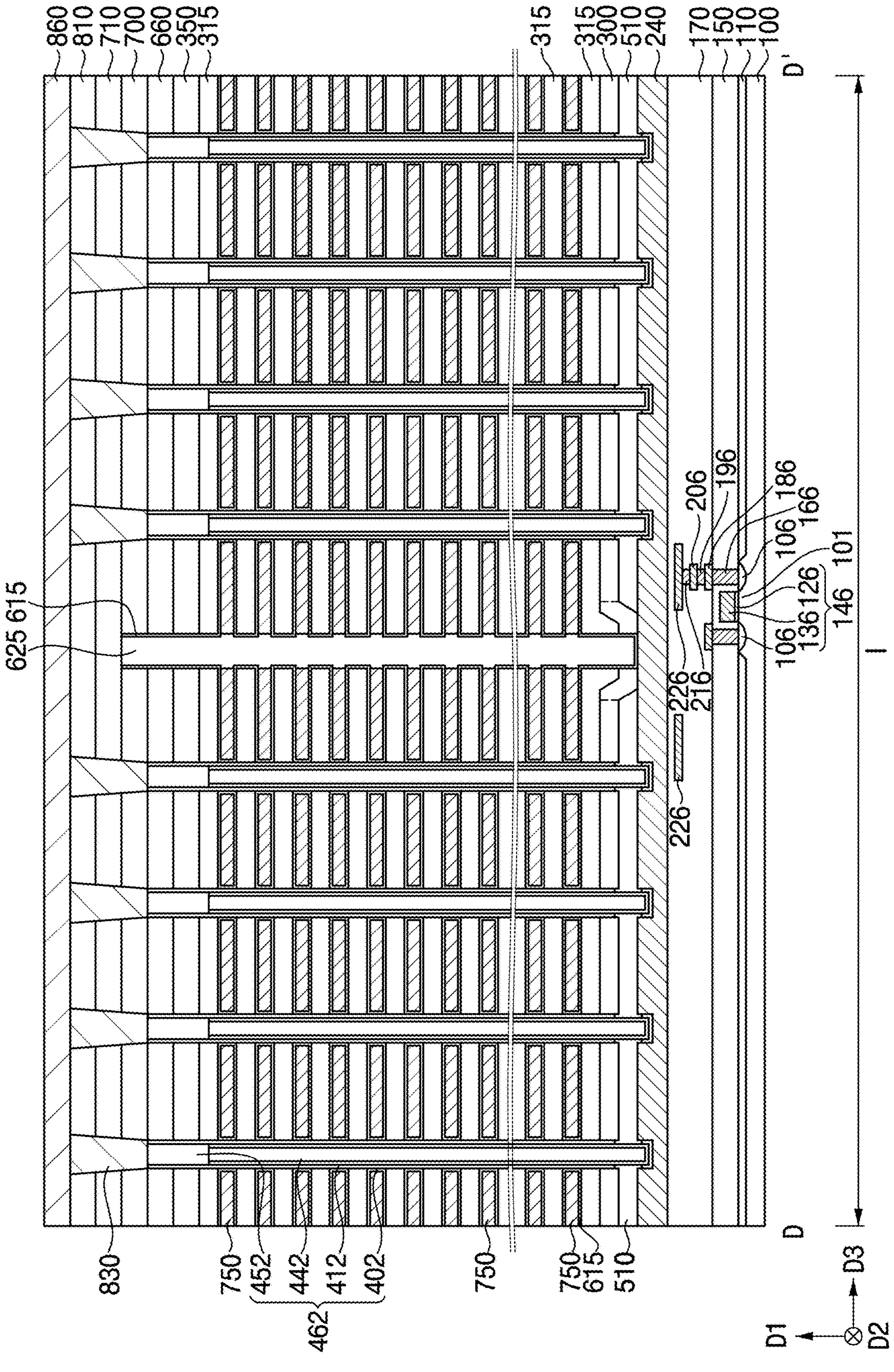

Particularly, FIGS. 1 and 2 are the plan views, FIGS. 3 and 4 are cross-sectional views taken along line A-A' of FIG. 2, FIG. 5 includes cross-sectional views taken along lines B-B' and C-C', respectively, of FIG. 2, FIG. 6 is a cross-sectional view taken along line D-D' of FIG. 2. FIGS. 2 to 6 are drawings about region X in FIG. 1, and FIG. 4 is an enlarged cross-sectional view of region Z of FIG. 3.

FIG. 2 does not show some elements, e.g., a ninth insulating interlayer 840 and first and second wirings 850 and 860 in order to avoid the complexity of the drawing.

Referring to FIGS. 1 to 6, the semiconductor device may include a lower circuit pattern, a common source plate (CSP) 240, a gate electrode structure, first, third and fourth division patterns 330, 620 and 625, a support structure 366, a memory channel structure 462, and first and second upper contact plugs 782 and 784 on a substrate 100.

Additionally, the semiconductor device may include a support layer 300, a support pattern 305, a sacrificial layer structure 290, a channel connection pattern 510, a second blocking pattern 615, a second division pattern, first and second upper vias 820 and 830, the first and second upper wirings 850 and 860, first to fourth insulation patterns 990, 315, 770 and 800, and first to ninth insulating interlayers 150, 170, 340, 350, 660, 700, 710, 810, 840.

The substrate 100 may include a semiconductor material, e.g., silicon, germanium, silicon-germanium, etc., or a III-V group compound semiconductor, e.g., GaP, GaAs, GaSb, etc. In example embodiments, the substrate 100 may be a silicon-on-insulator (SOI) substrate or a germanium-on-insulator (GOI) substrate.

In example embodiments, the substrate 100 may include a first region I and a second region II surrounding the first region I. In example embodiments, the first region I may be a cell array region, and the second region II may be a pad region or an extension region. The first and second regions I and II of the substrate 100 may collectively form a cell region.

Particularly, memory cells each of which may include a gate electrode, a channel and a charge storage structure may be formed on the first region I of the substrate 100, and upper contact plugs for transferring electrical signals to the memory cells and pads of the gate electrodes contacting the upper contact plugs may be formed on the second region II of the substrate 100. FIG. 1 shows that the second region II of the substrate 100 entirely surrounds the first region I of the substrate 100, however, aspects of the inventive concept may not be limited thereto, and for example, the second region II of the substrate 100 may be formed only at opposite sides of the first region I of the substrate 100 in the second direction D2.

In some embodiments, the substrate 100 may further include a third region surrounding the second region II, and upper circuit patterns for applying electrical signals to the memory cells through the upper contact plugs may be formed on the third region of the substrate 100.

The substrate 100 may include a field region on which an isolation pattern 110 is formed, and an active region 101 on which no isolation pattern is formed. The isolation pattern 110 may include an oxide, e.g., silicon oxide.

In example embodiments, the semiconductor device may have a cell over periphery (COP) structure. That is, the lower circuit pattern may be formed on the substrate 100, and the memory cells, the upper contact plugs and the upper circuit pattern may be formed over the lower circuit pattern. The lower circuit pattern may include, e.g., transistors, lower contact plugs, lower wirings, lower vias, etc.

For example, first and second transistors may be formed on the second and first regions II and I, respectively, of the substrate 100. The first transistor may include a first lower gate structure 142 on the substrate 100, and first impurity regions 102 at upper portions, respectively, of the substrate 100 adjacent to the first lower gate structure 142, which may serve as source/drains, respectively. The second transistor may include a second lower gate structure 146 on the substrate 100, and second impurity regions 106 at upper portions, respectively, of the substrate 100 adjacent to the second lower gate structure 146, which may serve as source/drains, respectively.

The first lower gate structure 142 may include a first lower gate insulation pattern 122 and a first lower gate electrode 132 stacked on the substrate 100, and the second lower gate structure 146 may include a second lower gate insulation pattern 126 and a second lower gate electrode 136 stacked on the substrate 100.

The first insulating interlayer 150 may be formed on the substrate 100, and may cover the first and second transistors. First and third lower contact plugs 162 and 166 may extend through the first insulating interlayer 150 to contact the first and second impurity regions 102 and 106, respectively, and a second lower contact plug 164 may extend through the first insulating interlayer 150 to contact the first lower gate electrode 132. In some embodiments, a fourth lower contact plug (not shown) may extend through the first insulating interlayer 150 to contact the second lower gate electrode 136.

First to third lower wirings 182, 184 and 186 may be formed on the first insulating interlayer 150 to contact upper surfaces of the first to third lower contact plugs 162, 164 and 166, respectively. A first lower via 192, a fourth lower wiring 202, a third lower via 212 and a sixth lower wiring 222 may be sequentially stacked on the first lower wiring 182, and a second lower via 196, a fifth lower wiring 206, a fourth lower via 216 and a seventh lower wiring 226 may be sequentially stacked on the third lower wiring 186.

The second insulating interlayer 170 may be formed on the first insulating interlayer 150, and may cover the first to seventh lower wiring 182, 184, 186, 202, 206, 222, 227, and the first to fourth lower vias 192, 196, 212 and 216.

The CSP 240 may be formed on the second insulating interlayer 170. The CSP 240 may include a conductive material, e.g., polysilicon doped with n-type impurities, a metal, a metal nitride, a metal silicide, etc.

In an example embodiment, the CSP 240 may be a single layer including a semiconductor material doped with n-type or p-type impurities. Alternatively, the CSP 240 may have a multi-layered structure including a first layer containing a metal silicide, e.g., tungsten silicide and a second layer containing doped polysilicon sequentially stacked in the first direction D1. However, aspects of the inventive concept may not be limited thereto, and the CSP 240 may include more than two layers sequentially stacked in the first direction D1.

In example embodiments, the first insulation pattern 990 may extend through the CSP 240, and may overlap the sixth lower wiring 222 in the first direction D1. The first insulation pattern 990 may include an oxide, e.g., silicon oxide.

The sacrificial layer structure 290, the channel connection pattern 510, the support layer 300 and the support pattern 305 may be formed on the CSP 240.

The channel connection pattern 510 may be formed on the first region I of the substrate 100, and may include an air gap therein. The sacrificial layer structure 290 may be formed on the second region II of the substrate 100, and may also be formed on a portion of the first region I of the substrate 100.

The channel connection pattern 510 may include, e.g., polysilicon doped with n-type impurities or undoped polysilicon. The sacrificial layer structure 290 may include first, second and third sacrificial layers 260, 270 and 280 sequentially stacked in the first direction D1. Each of the first and third sacrificial layers 260 and 280 may include an oxide, e.g., silicon oxide, and the second sacrificial layer 270 may include a nitride, e.g., silicon nitride.

The support layer 300 may be formed on the channel connection pattern 510 and the sacrificial layer structure 290. However, the support layer 300 may also be formed in a first opening extending through the channel connection pattern 510 and the sacrificial layer structure 290 to expose an upper surface of the CSP 240, which may be referred to as the support pattern 305.

The support pattern 305 may have various layouts in a plan view. In an example embodiment, the support pattern 305 may be formed on a portion of the second region II of the substrate 100 adjacent to the first region I of the substrate 100, and may surround the first region I of the substrate 100. Additionally, a plurality of support patterns 305, each of which may extend in the second direction D2, may be spaced apart from each other in the third direction D3 on the second region II of the substrate 100. Furthermore, a plurality of support patterns 305 may be spaced apart from each other in the second and third directions D2 and D3 on the first region I of the substrate 100.

Each of the support layer 300 and the support pattern 305 may include, e.g., polysilicon.

The gate electrode structure may include gate electrodes 750 at a plurality of levels, respectively, spaced apart from each other in the first direction D1 on the support layer 300 and the support pattern 305. Each of the gate electrodes 750 may extend in the second direction D2.

In example embodiments, the gate electrodes 750 may include a ground selection line (GSL), a word line, and a string selection line (SSL). Additionally, the gate electrodes 750 may include a gate induced drain leakage (GIDL) gate electrode that may erase data stored in the memory channel structure 462 using GIDL phenomenon. In an example embodiment, the GSL may be disposed at a lowermost level, the SSLs may be disposed at two upper levels, respectively, and the word lines may be disposed at a plurality of levels, respectively, between the GSL and the SSL.

The gate electrode 750 may include a gate conductive pattern and a gate barrier pattern covering a surface of the gate conductive pattern. The gate conductive pattern may include a metal having a low resistance, e.g., tungsten, titanium, tantalum, platinum, etc., and the gate barrier pattern may include a metal nitride, e.g., titanium nitride, tantalum nitride, etc.

The second insulation pattern 315 may be formed between the neighboring ones of the gate electrodes 750, on an upper surface of an uppermost one of the gate electrodes 750, and between a lowermost one of the gate electrodes 750 and the support layer 300 or the support pattern 305. The second insulation pattern 315 may include an oxide, e.g., silicon oxide.

In example embodiments, the gate electrode structure may have a staircase shape in which lengths in the second direction D2 decrease in the first direction D1 from a lowermost level toward an uppermost level, and may include steps arranged in the second direction D2 on the second region II of the substrate 100. The gate electrode structure may further include steps arranged in the third direction D3 on the second region II of the substrate 100.

Further, the gate electrode structure may have a stacked structure in which a plurality of parts having staircase shapes are stacked in the first direction D1. Steps included in each of the plurality of parts of the gate electrode structure may be arranged in the second direction D2 and/or the third direction D3, and the steps in the plurality of parts of the gate electrode structure may partially overlap each other in the first direction D1 or may not overlap each other in the first direction D1.

In example embodiments, ones of the gate electrodes 750 that are disposed at neighboring two levels, respectively, in the first direction D1 may have the same length in the second direction D2, which may collectively form a step layer of the gate electrode structure.

In example embodiments, a plurality of gate electrode structures may be spaced apart from each other in the third direction D3. The third division pattern 620 may be formed on the CSP 240 between neighboring ones of the gate electrode structures in the third direction D3. The third division pattern 620 may extend in the second direction D2 on the first and second regions I and II of the substrate 100. In example embodiments, the third division pattern 620 may extend through the third to sixth insulating interlayers 340, 350, 660 and 700, the gate electrodes 750, the second insulation patterns 315, the support layer 300, the support pattern 305 and the channel connection pattern 510. In example embodiments, a plurality of third division patterns 620 may be spaced apart from each other in the third direction D3 by a constant distance.

In example embodiments, each of the gate electrode structures divided by the third division pattern 620 and the memory channel structures 462 extending through each of the gate electrode structures may form a memory block, and a plurality of memory blocks may be arranged in the third direction D3.

The first division pattern 330 may extend through the lowermost one of the gate electrodes 750, and a plurality of first division patterns 330 may be spaced apart from each other in the second direction D2 on the first and second regions I and II of the substrate 100.

The fourth division pattern 625 may extend through the third to sixth insulating interlayers 340, 350, 660 and 700, the gate electrodes 750, the support layer 300, the support pattern 305 and the channel connection pattern 510. An end portion of the fourth division pattern 625 in the second direction D2 may partially extend through the first division pattern 330, and thus the first division patterns 330 and the fourth division pattern 625 may be arranged in a straight line in the second direction D2.

In example embodiments, the third and fourth division patterns 620 and 625 may be spaced apart from each other in the third direction D3 on the second region II of the substrate 100.

The second division pattern may be formed on the first region I of the substrate 100 and a portion of the second region II of the substrate 100 adjacent to the first region I of the substrate 100, and may extend through, e.g., ones of the second insulation patterns 315 at upper three levels, respectively, and ones of the gate electrodes 750 at upper two levels, respectively. In an example embodiment, the second division pattern may be disposed between neighboring ones of the memory channel structures 462. Alternatively, the second division pattern may extend through an upper portion of one of the memory channel structures 462.

The first, third and fourth division patterns 330, 620 and 625 and the second division pattern may include an oxide, e.g., silicon oxide.

In an example embodiment, each of the memory blocks may include two GSLs at each level divided by the first and fourth division patterns 330 and 625, one word line at each level, and four SSLs at each level divided by the second division pattern and the fourth division pattern 625, however, aspects of the inventive concept may not be limited thereto. Alternatively, the memory block may include two GSLs at each level, one word line at each level, and six SSLs at each level.

Figure 14:
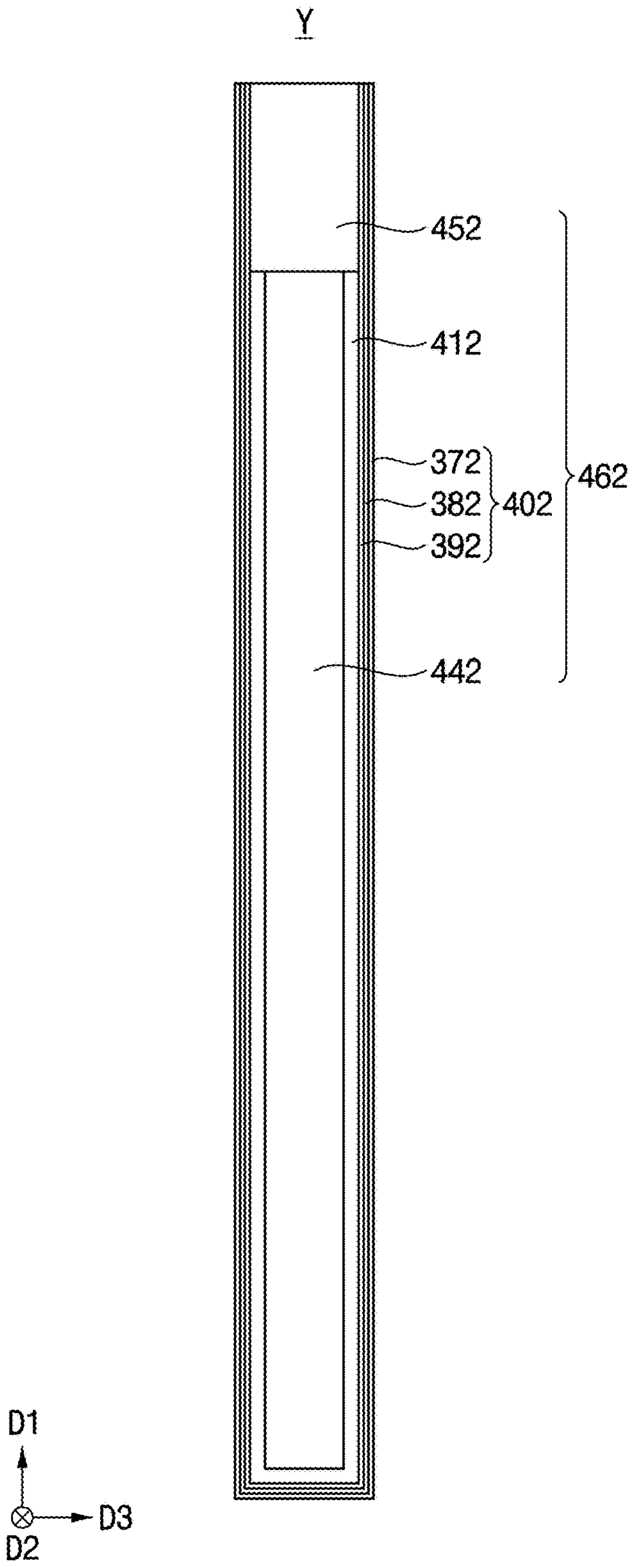

Referring FIGS. 1 to 6 together with FIG. 14, the memory channel structure 462 may be formed on the first region I of the substrate 100, and may contact an upper surface of the CSP 240. The memory channel structure 462 may extend through the channel connection pattern 510, the gate electrodes 750, the second insulation pattern 315, and the fourth and fifth insulating interlayers 350 and 660.

In example embodiments, the memory channel structure 462 may include a filling pattern 442 having a pillar shape extending in the first direction D1, a channel 412 on a sidewall of the filling pattern 442 and having a cup shape, a capping pattern 452 on upper surfaces of the filling pattern 442 and the channel 412, and a charge storage structure 402 on an outer sidewall of the channel 412 and a sidewall of the capping pattern 452.

The charge storage structure 402 may include a tunnel insulation pattern 392, a charge storage pattern 382 and a first blocking pattern 372 sequentially stacked in the horizontal direction on the outer sidewall of the channel 412.

In example embodiments, a plurality of memory channel structures 462 may be spaced apart from each other in the second and third directions D2 and D3 in each memory block on the first region I of the substrate 100 to form a memory channel array, and a plurality of memory channel structures 462 included in the memory channel array may be connected to each other by the channel connection pattern 510. Particularly, the charge storage structure 402 may not be formed on a portion of the outer sidewall of each of the channels 412, and the channel connection pattern 510 may contact the outer sidewalls of the channels 412 to electrically connect the channels 412 to each other.

The channel 412 may include, e.g., undoped polysilicon, the filling pattern 442 may include an oxide, e.g., silicon oxide, and the capping pattern 452 may include, e.g., doped polysilicon.

The tunnel insulation pattern 392 may include an oxide, e.g., silicon oxide, the charge storage pattern 382 may include a nitride, e.g., silicon nitride, and the first blocking pattern 372 may include an oxide, e.g., silicon oxide.

The support structure 366 may be formed on the second region II of the substrate 100, and may contact the upper surface of the CSP 240. The support structure 366 may extend through the sacrificial layer structure 290, the gate electrode 750, the second insulation pattern 315, and the third and fourth insulating interlayers 340 and 350. In example embodiments, a plurality of support structures 366 may be spaced apart from each other in the second and third directions D2 and D3 on the second region II of the substrate 100.

The support structure 366 may have a shape of a pillar extending in the first direction D1. The support structure 366 may include a first layer containing an insulating material, e.g., carbon, and a second layer on the first layer and containing, e.g., polysilicon. However, aspects of the inventive concept may not be limited thereto, and the support structure 366 may include a single layer containing, e.g., polysilicon.

The second blocking pattern 615 may cover lower and upper surfaces and a sidewall facing the memory channel structure 462 and the support structure 366 of each of the gate electrodes 750. The second blocking pattern 615 may include a metal oxide, e.g., aluminum oxide, hafnium oxide, etc.

The third insulating interlayer 340 may be formed on the support layer 300, and may cover sidewalls of the gate electrode 750 and the second insulation pattern 315, and the fourth insulating interlayer 350 may be formed on the third insulating interlayer 340 and the second insulation pattern 315.

The fifth insulating interlayer 660 may be formed on the fourth insulating interlayer 350 and the support structure 366, the sixth insulating interlayer 700 may be formed on the fifth insulating interlayer 660 and the memory channel structure 462, the seventh insulating interlayer 710 may be formed on the sixth insulating interlayer 700 and the third and fourth division patterns 620 and 625, and the eighth and ninth insulating interlayers 810 and 840 may be sequentially stacked on the seventh insulating interlayer 710.

Each of the first to ninth insulating interlayers 150, 170, 340, 350, 660, 700, 710, 810, 840 may include an oxide, e.g., silicon oxide.

The second upper contact plug 784 may extend through the third to seventh insulating interlayers 340, 350, 660, 700 and 710 to contact an upper surface of an upper one of the gate electrodes 750 in a corresponding step layer of the gate electrode structure so that the second upper contact plug 784 may be electrically connected to the upper one of the gate electrodes 750 in the corresponding step layer of the gate electrode structure.

In example embodiments, the second upper contact plug 784 may have a shape of a hollow cylinder, and the fourth insulation pattern 800 may be formed in an inner space defined by the hollow cylinder. In an example embodiment, the second upper contact plug 784 may include a lower portion having a first thickness in the horizontal direction and an upper portion having a second thickness in the horizontal direction greater than the first thickness on the lower portion.

The first upper contact plug 782 may extend through a lower one of the gate electrodes 750 in the corresponding step layer of the gate electrode structure to contact a sidewall of the lower one of the gate electrodes 750 so that the first upper contact plug 782 may be electrically connected to the lower one of the gate electrodes 750 in the corresponding step layer of the gate electrode structure. The first upper contact plug 782 may also extend through ones of the gate electrodes 750 under the lower one of the gate electrodes 750 in the corresponding step layer, that is, the first upper contact plug 782 may extend through ones of the gate electrodes 750 included in underlying step layers that are disposed under the corresponding step layer.

However, in example embodiments, the third insulation pattern 770 may be disposed between the first upper contact plug 782 and a sidewall of each of the ones of the gate electrodes 750 in the underlying step layers so that the first upper contact plug 782 may be electrically connected to each of the ones of the gate electrodes 750 in the underlying step layers.

In example embodiments, the first upper contact plug 782 may extend through the support layer 300, the sacrificial layer structure 290, the first insulation pattern 990 and an upper portion of the second insulating interlayer 170 to contact the sixth lower wiring 222.

In example embodiments, the first upper contact plug 782 may have a shape of a pillar extending in the first direction D1, and may include a lower portion having a first width in the horizontal direction and an upper portion having a second width in the horizontal direction greater than the first width on the lower portion. The upper portion of the first upper contact plug 782 may contact the sidewall of the lower one of the gate electrodes 750 in the corresponding step layer.

In an example embodiment, an upper surface of the first upper contact plug 782 may be lower than a lower surface of the upper one of the gate electrodes 750 in the corresponding step layer of the gate electrode structure and higher than a lower surface of the lower one of the gate electrodes 750 in the corresponding step layer of the gate electrode structure. Preferably, the upper surface of the first upper contact plug 782 may be higher than or substantially coplanar with an upper surface of the lower one of the gate electrodes 750 in the corresponding step layer of the gate electrode structure.

In example embodiments, in a plan view, the first upper contact plug 782 may be disposed within an area that may be defined by a contour of the second upper contact plug 784.

Each of the first and second upper contact plugs 782 and 784 may include, e.g., a metal, a metal nitride, a metal silicide, etc., and each of the third and fourth insulation patterns 770 and 800 may include an insulating nitride, e.g., silicon nitride.

The first upper via 820 may extend through the eighth insulating interlayer 810 to contact an upper surface of the second upper contact plug 784, and the second upper via 830 may extend through the sixth to eighth insulating interlayers 700, 710 and 810 to contact an upper surface of the capping pattern 452 of the memory channel structure 462.

The first and second upper wirings 850 and 860 may extend through the ninth insulating interlayer 840 to contact the first and second upper vias 820 and 830, respectively. In an example embodiment, the second upper wiring 860 may extend in the third direction D3 on the first region I of the substrate 100, and a plurality of second upper wirings 860 may be spaced apart from each other in the second direction D2. Each of the second upper wirings 860 may serve as a bit line of the semiconductor device.

Upper vias and upper wirings may be further formed on the ninth insulating interlayer 840.

In the semiconductor device, the gate electrodes 750 of the gate electrode structure that are disposed at neighboring levels, respectively, in the first direction D1 may be electrically connected to the first and second upper contact plugs 782 and 784, respectively. The first upper contact plug 782 may be electrically connected to the lower circuit pattern, and the second upper contact plug 784 may be electrically connected to the first upper wiring 850 through the first upper via 820. Thus, the first and second upper contact plugs 782 and 784 for transferring electrical signals to the two gate electrodes 750, and the wirings for applying the electrical signals to the first and second upper contact plugs 782 and 784 may be disposed at lower and upper parts, respectively, of the semiconductor device. Accordingly, the contact plugs and the wirings may be efficiently arranged in the semiconductor device so as to enhance the integration degree of the semiconductor device.

FIGS. 7 to 32 are plan views and cross-sectional views illustrating a method of manufacturing a semiconductor device, for example, a vertical channel NAND flash memory device in accordance with example embodiments. Particularly, FIGS. 7, 9, 15, 20 and 30 are the plan views, and FIGS. 8, 10-14, 16-19, 21-29 and 31-32 are the cross-sectional views.

FIGS. 8, 10, 21, 24-29 and 31-32 are cross-sectional views taken along lines A-A' of corresponding plan views, respectively, each of FIGS. 11, 13-14, 16, 18 and 22 includes cross-sectional views taken along lines B-B' and C-C' of corresponding plan views, respectively, and FIGS. 12, 17 19 and 23 are cross-sectional views taken along lines D-D' of corresponding plan views, respectively.

Figure 24:
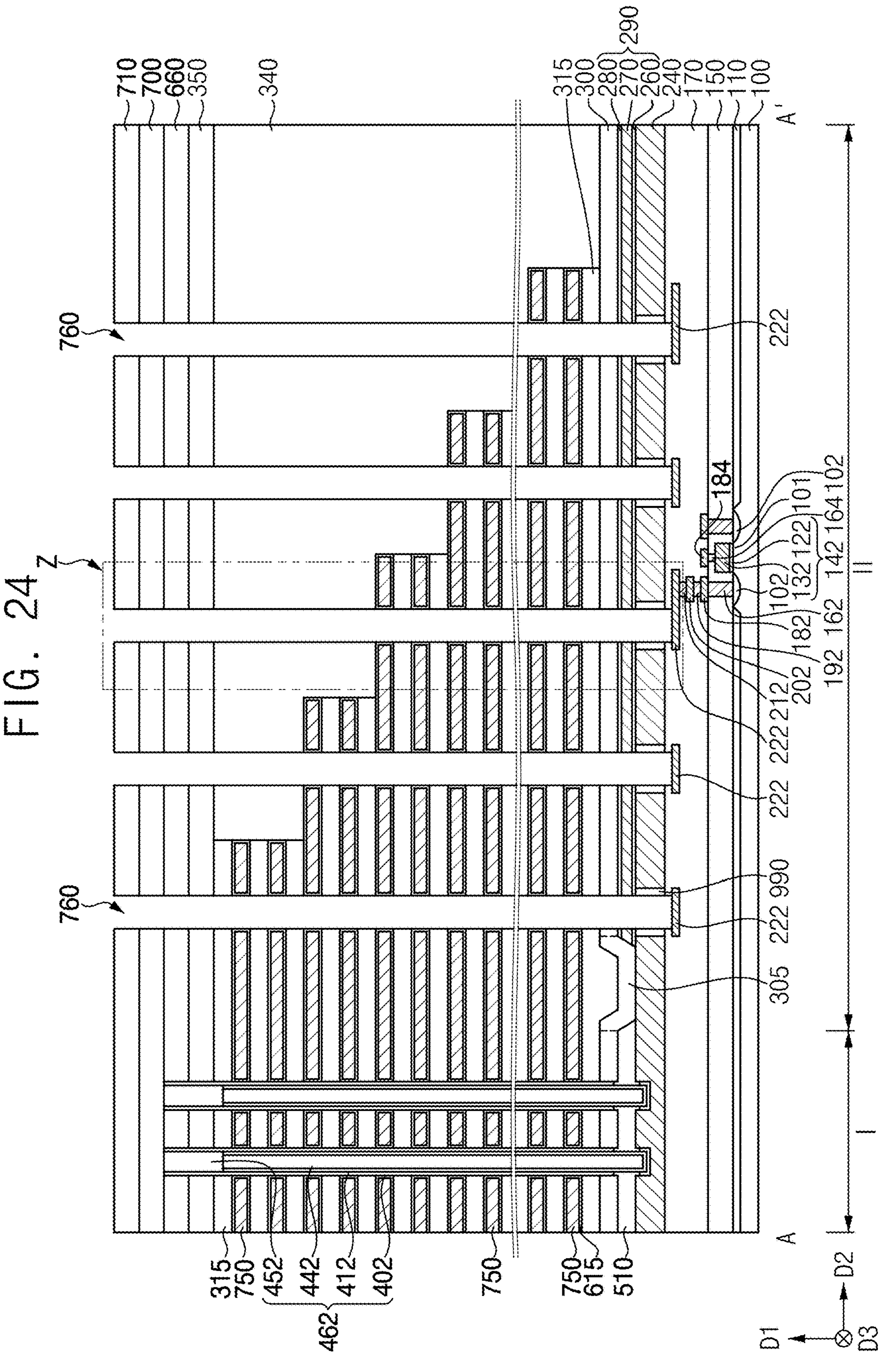
Figure 30:
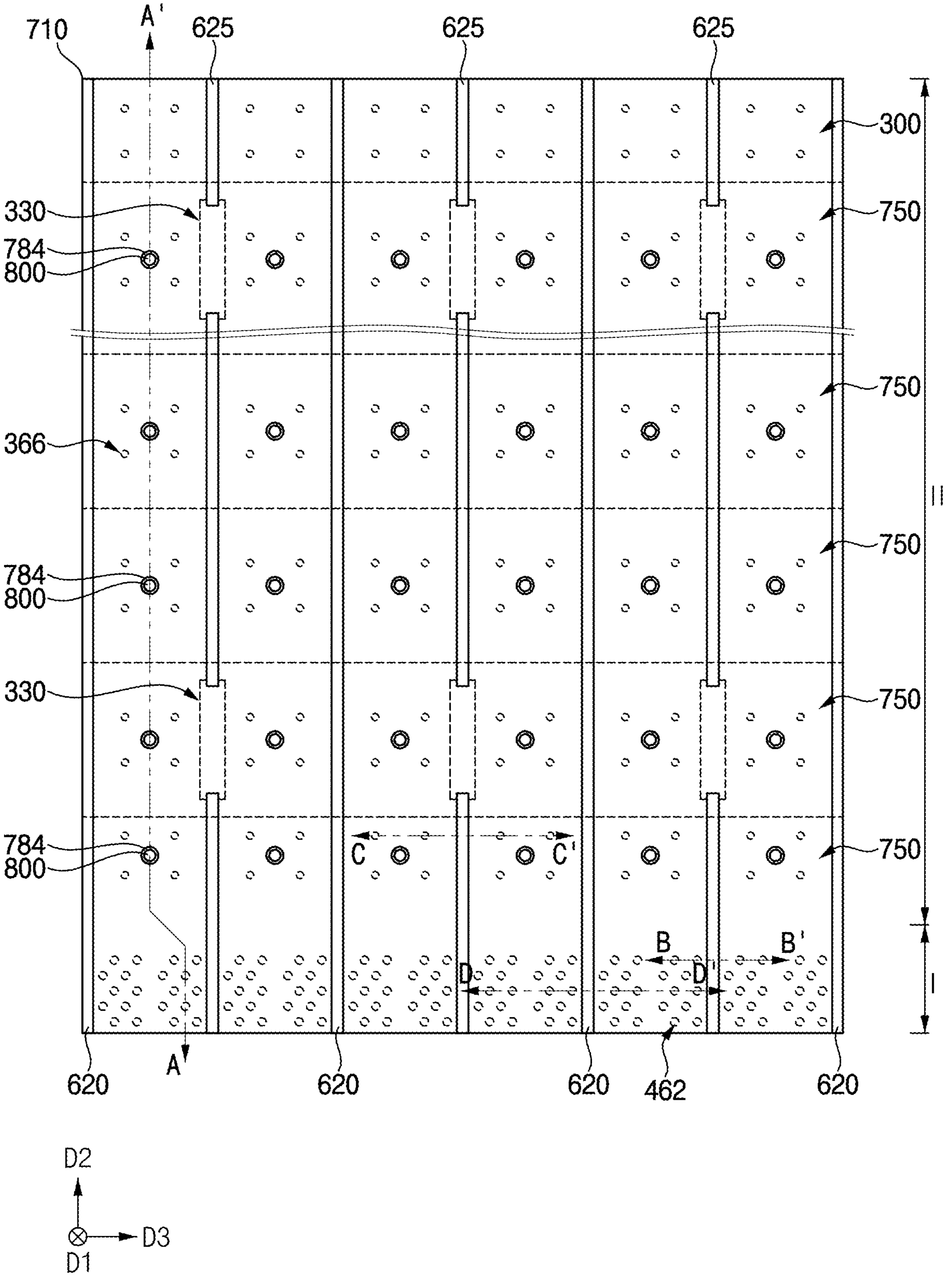
Figure 31:
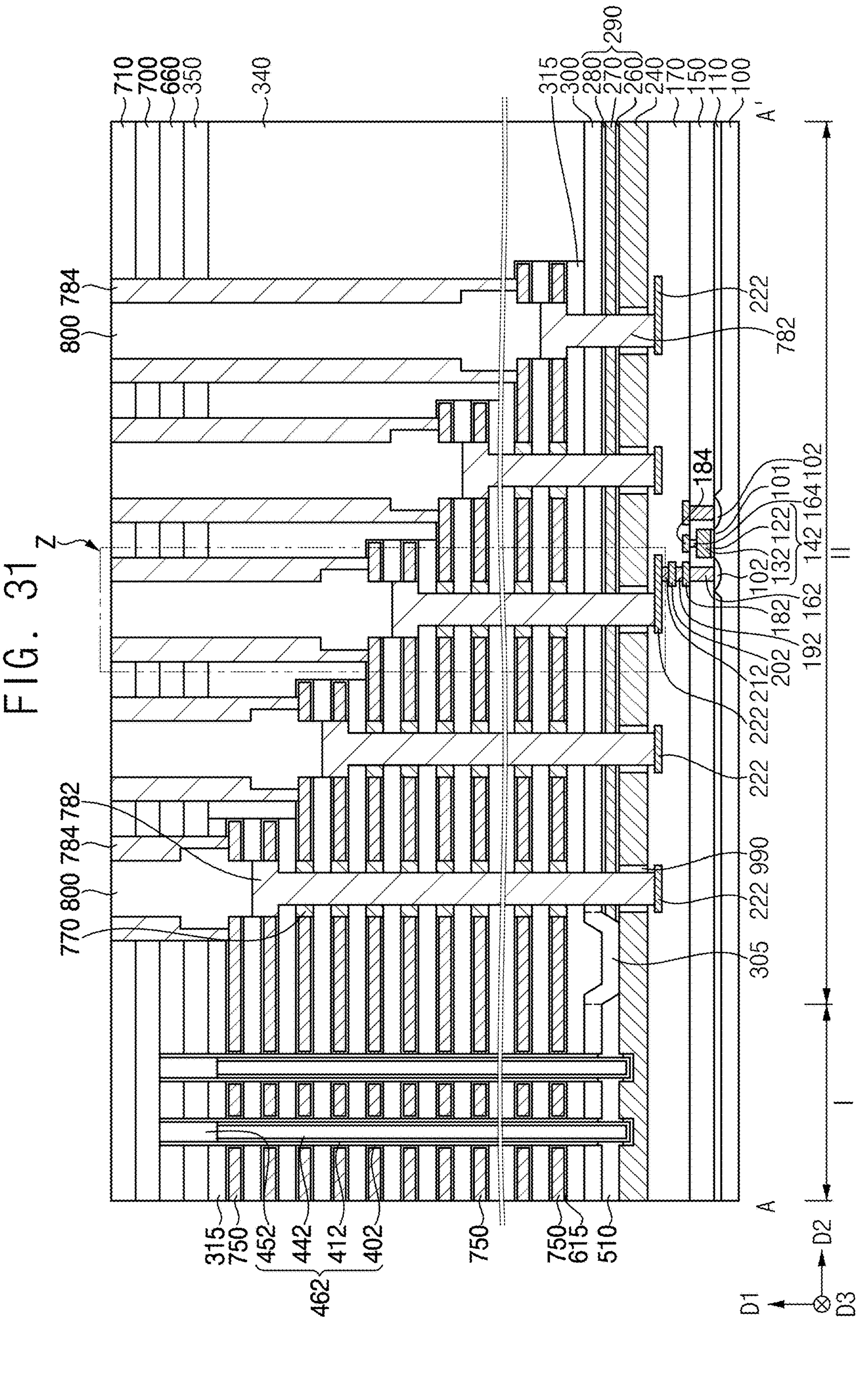
Figure 32:
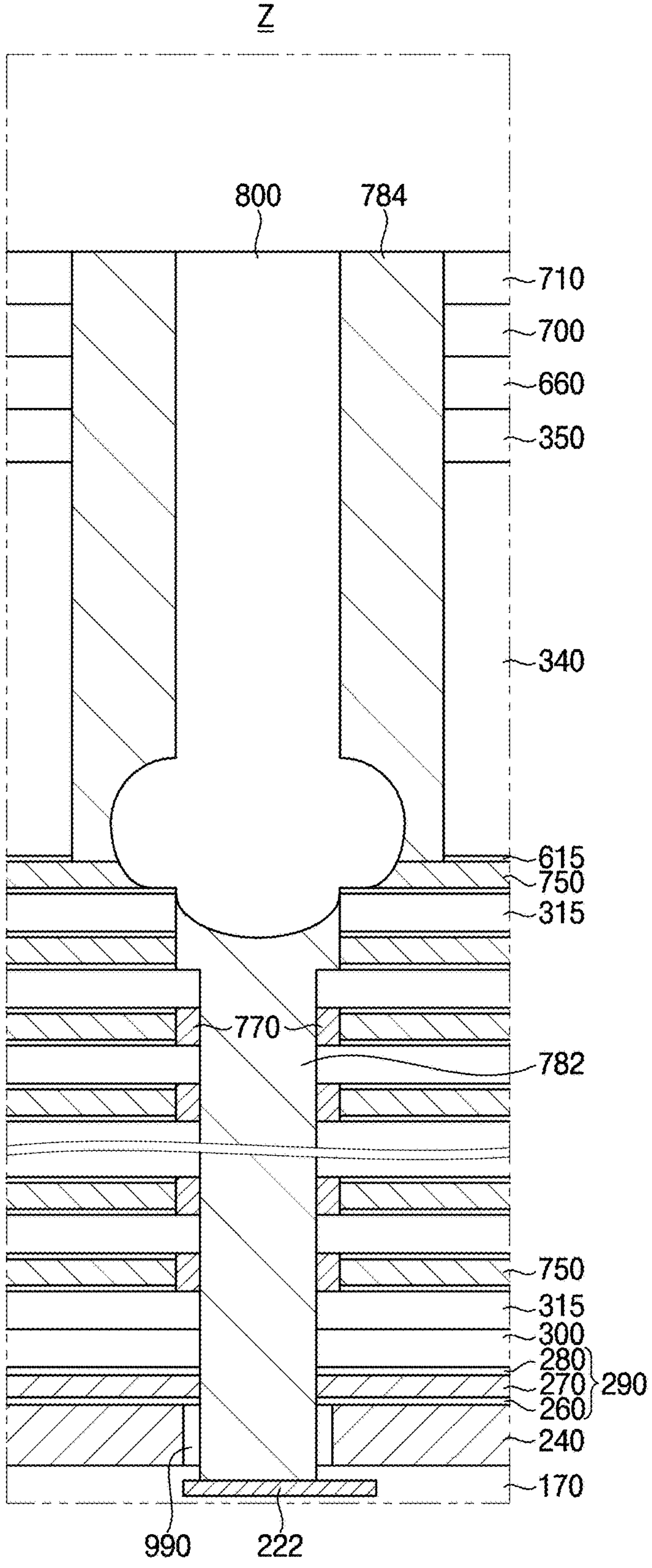

FIGS. 7 to 32 are drawings of region X of FIG. 1, FIG. 14 is an enlarged cross-sectional view of region Y of FIG. 13, FIGS. 25 to 29 are enlarged cross-sectional views of region Z of FIG. 24, and FIG. 32 is an enlarged cross-sectional view of region Z of FIG. 31.

Figure 7:
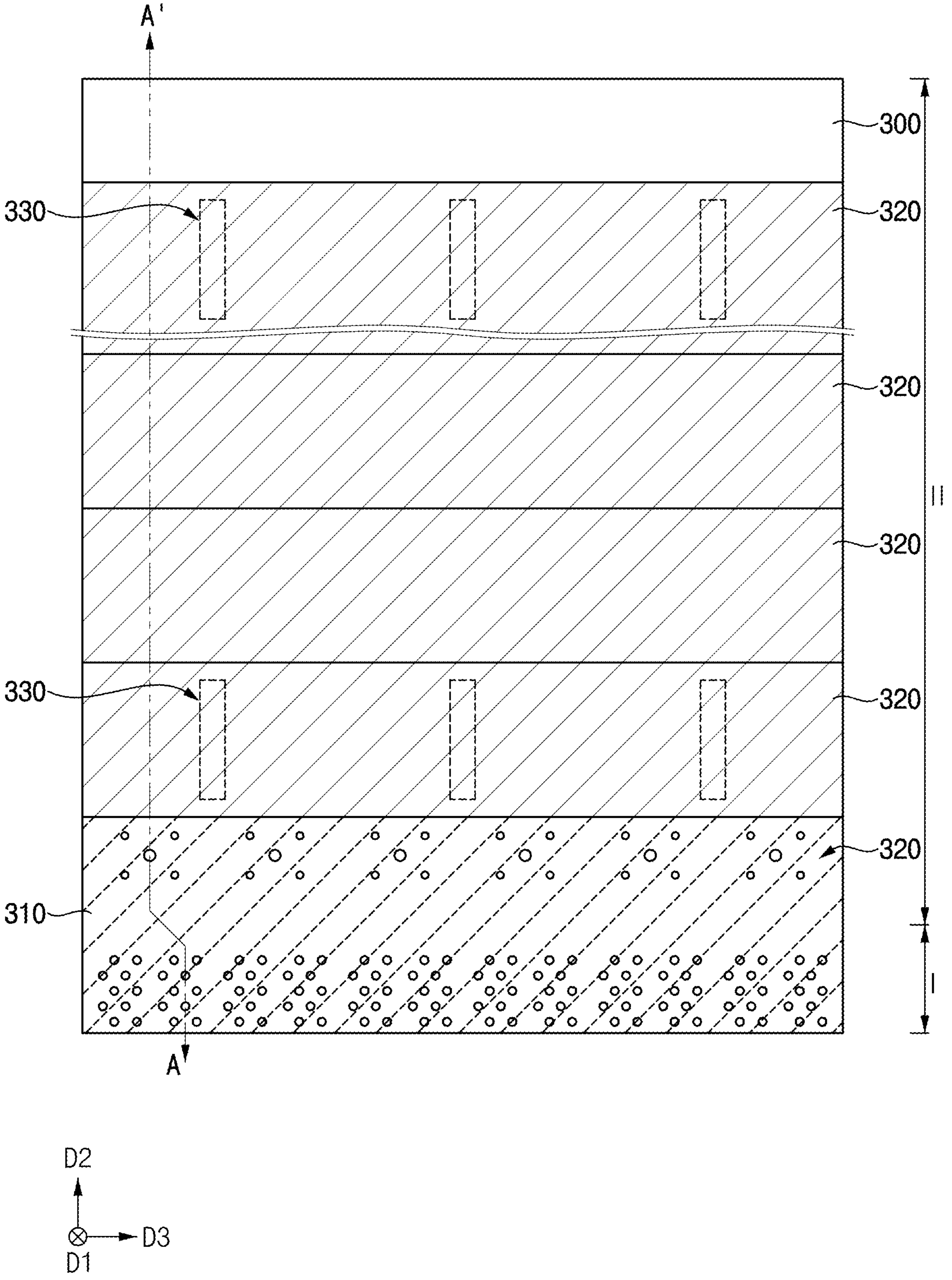
FIGS. 7 to 32 are plan views and cross-sectional views illustrating a method of manufacturing a semiconductor device.
Figure 8:
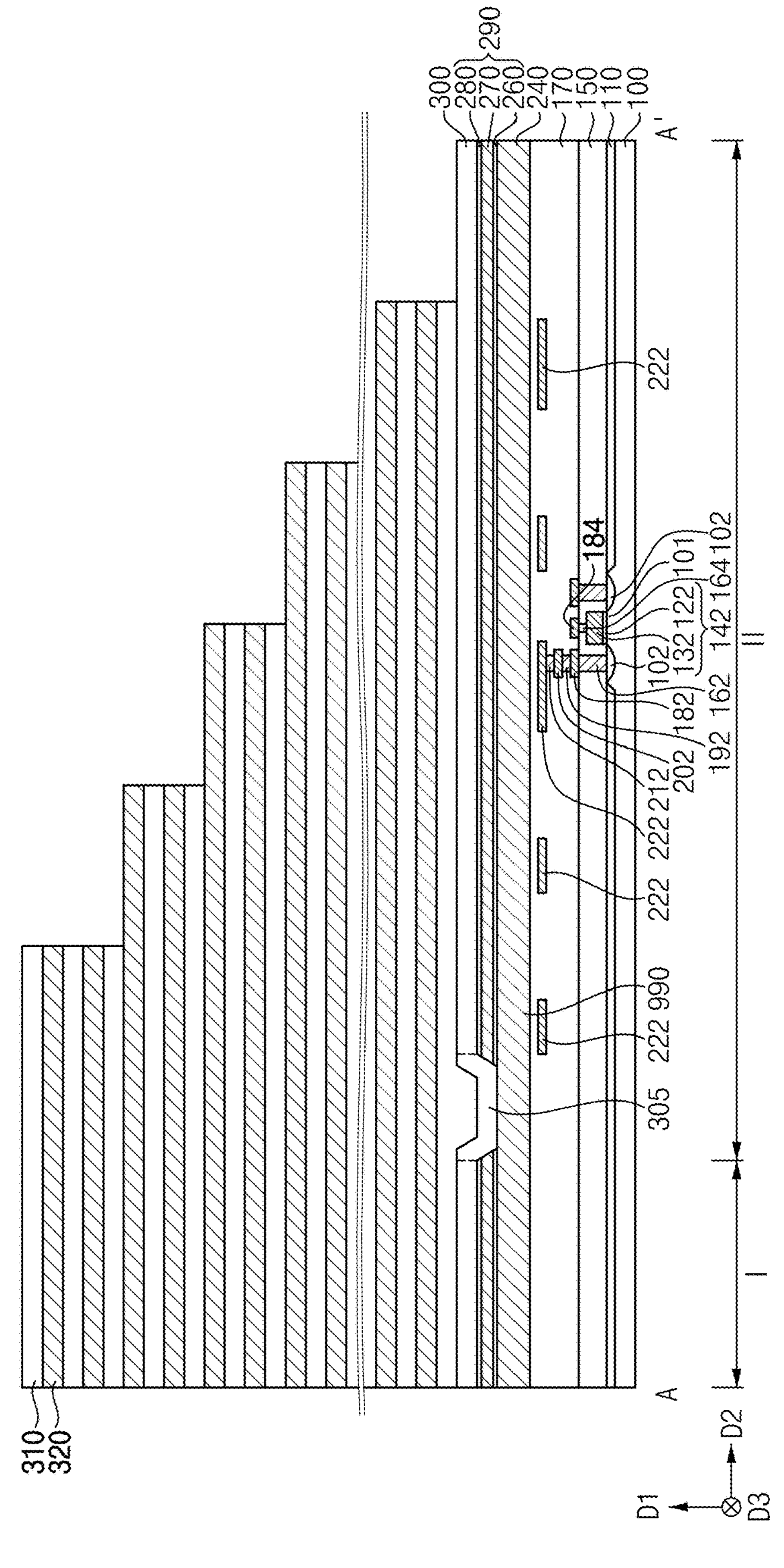
Figure 9:
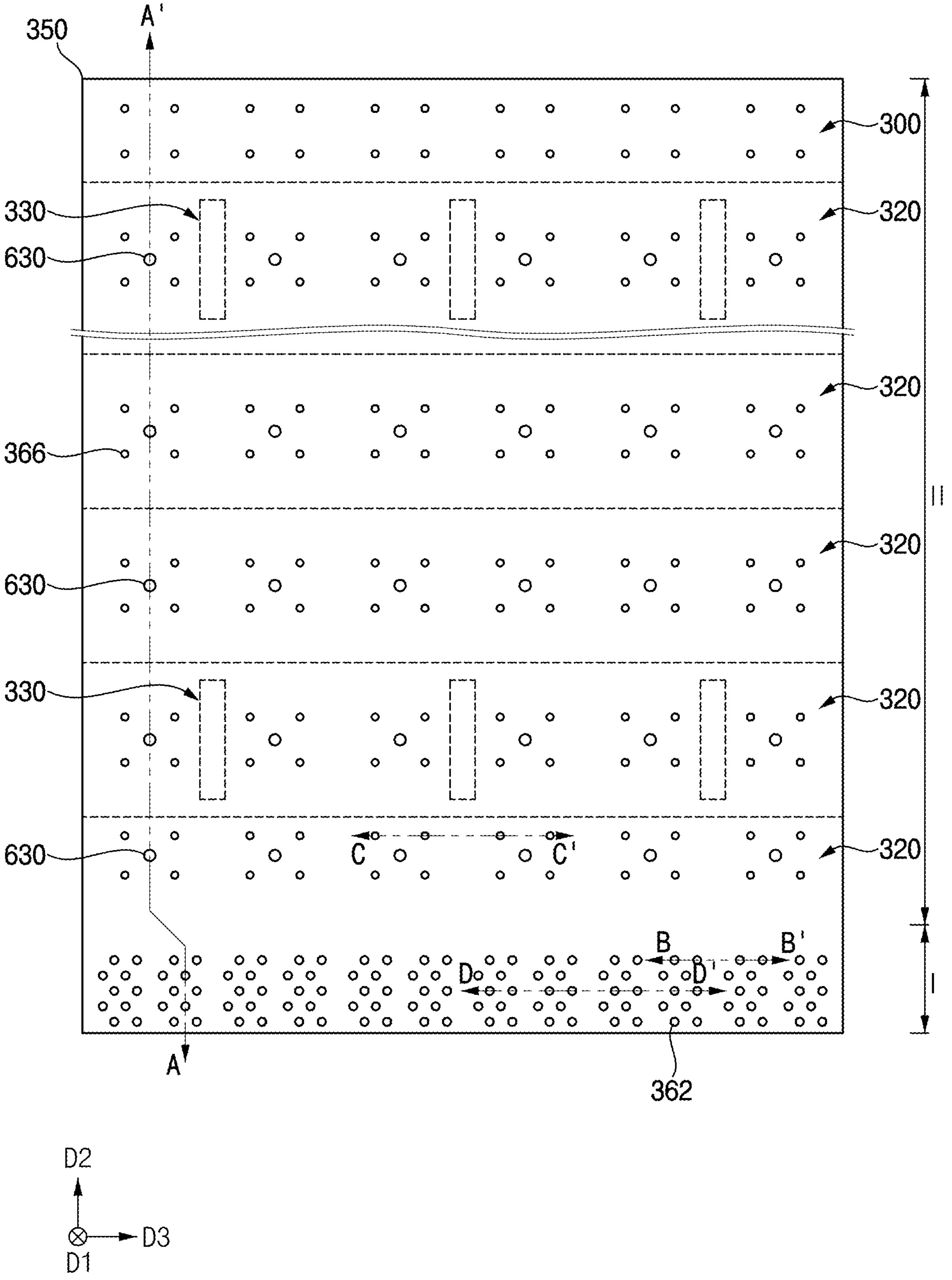
Figure 10:
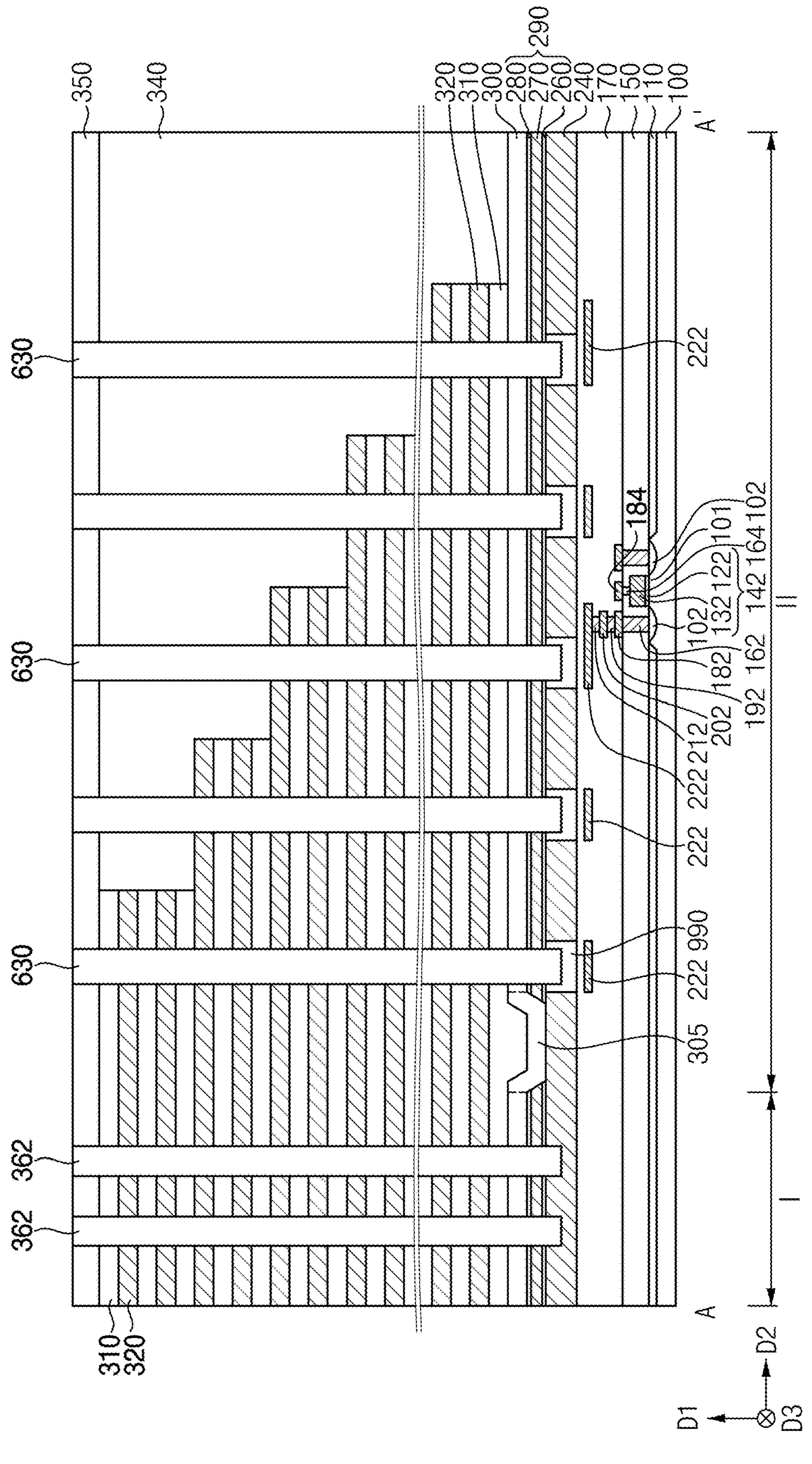
Figure 11:
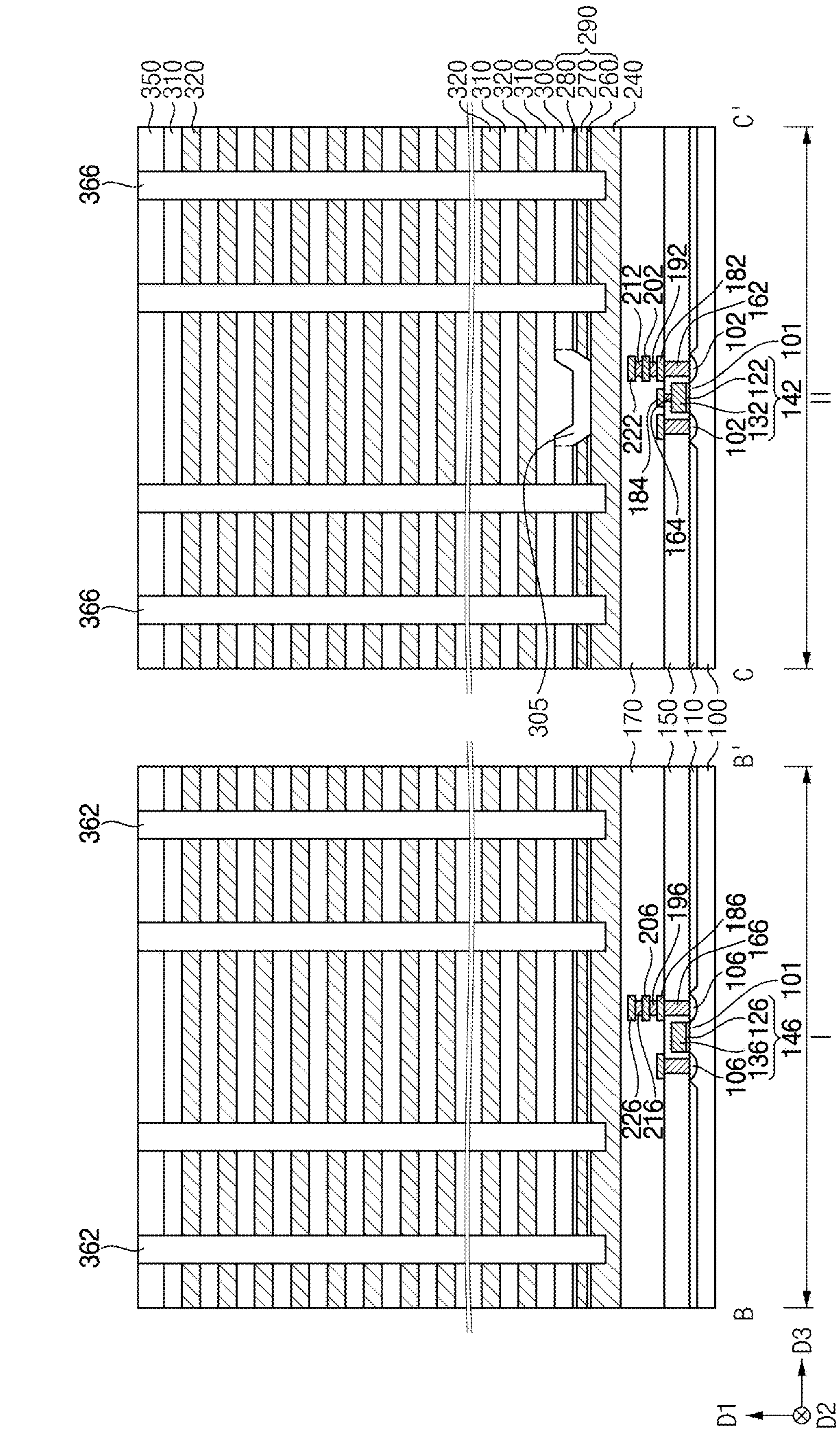
Figure 12:
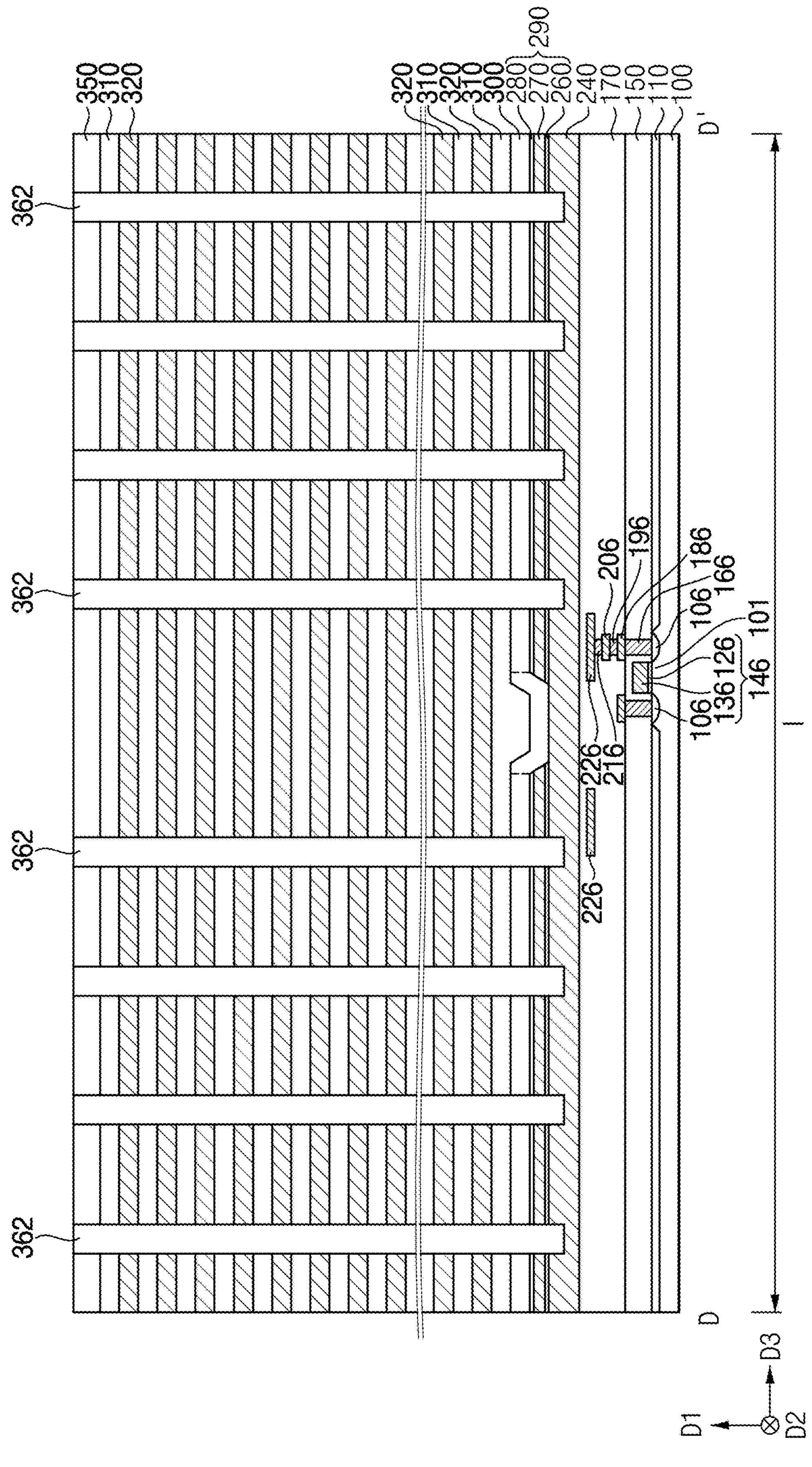

Referring to FIGS. 7 and 8, a lower circuit pattern may be formed on a substrate 100, and first and second insulating interlayers 150 and 170 covering the lower circuit pattern may be sequentially stacked on the substrate 100.

Each element of the lower circuit pattern may be formed by a patterning process or a damascene process.

A CSP 240 may be formed on the second insulating interlayer 170, and a first insulation pattern 990 may be formed through the CSP 240. In example embodiments, a plurality of first insulation patterns 990 may be spaced apart from each other in the second and third directions D2 and D3 on the second region II of the substrate 100, and may at least partially overlap the sixth wirings 222, respectively, in the first direction D1.

A sacrificial layer structure 290 may be formed on the CSP 240 and the first insulation pattern 990, and may be partially removed to form a first opening exposing an upper surface of the CSP 240, and a support layer 300 may be formed on an upper surface of the sacrificial layer structure 290 and the exposed upper surface of the CSP 240.

The sacrificial layer structure 290 may include first, second and third sacrificial layers 260, 270 and 280 sequentially stacked. Each of the first and third sacrificial layers 260 and 280 may include an oxide, e.g., silicon oxide, and the second sacrificial layer 270 may include a nitride, e.g., silicon nitride.

The support layer 300 may include a material having an etching selectivity with respect to the first to third sacrificial layers 260, 270 and 280, e.g., polysilicon. The support layer 300 may have a constant thickness, and thus a first recess may be formed on a portion of the support layer 300 in the first opening. Hereinafter, the portion of the support layer 300 in the first opening 302 may be referred to as a support pattern 305. The support pattern 305 may have various layouts in a plan view.

A second insulation layer 310 and a fourth sacrificial layer 320 may be alternately and repeatedly stacked on the support layer 300 and the support pattern 305 in the first direction D1, and a mold layer including the second insulation layers 310 and the fourth sacrificial layers 320 may be formed. The second insulation layer 310 may include an oxide, e.g., silicon oxide, and the fourth sacrificial layer 320 may include a material having an etching selectivity with respect to the insulation layer 310, e.g., a nitride such as silicon nitride.

In example embodiments, a first division pattern 330 extending through a lowermost one of the fourth sacrificial layers 320 may be formed. In example embodiments, a plurality of first division patterns 330 may be spaced apart from each other in the second and third directions D2 and D3 on the first and second regions I and II of the substrate 100.

A photoresist pattern partially covering an uppermost one of the second insulation layers 310 may be formed, and the uppermost one of the second insulation layers 310 and an uppermost one of the fourth sacrificial layers 320 may be etched using the photoresist pattern as an etching mask. Thus, a portion of one of the second insulation layers 310 directly under the uppermost one of the fourth sacrificial layers 320 may be exposed.

After performing a trimming process for reducing an area of the photoresist pattern, ones of the second insulation layers 310 at upper five levels, respectively, and ones of the fourth sacrificial layers 320 at upper four levels, respectively, may be etched by an etching process using the reduced photoresist pattern as an etching mask. The trimming process and the etching process may be repeatedly performed to form a mold having a staircase shape and including a plurality of step layers each of which may include two second insulation layers 310 and two fourth sacrificial layers 320 alternately stacked in the first direction D1.

Hereinafter, the "step layer" may refer to all portions of the fourth sacrificial layer 320 and the second insulation layer 310 at the same level, which may include an unexposed portion as well as an exposed portion of the fourth sacrificial layer 320 and the second insulation layer 310, and a "step" may refer to only the exposed portion of the "step layer." In example embodiments, the steps may be arranged in the second direction D2. Alternatively, the steps may be arranged in the third direction D3.

The mold may be formed on the support layer 300 and the support pattern 305 on the first and second regions I and II of the substrate 100, and the steps included in the mold may be formed on the second region II of the substrate 100.

Referring to FIGS. 9 to 12, a third insulating interlayer 340 may be formed on the CSP 240 to cover the mold and the support layer 300, and may be planarized until an upper surface of the uppermost one of the second insulation layers 310 is exposed. Thus, a sidewall of the mold may be covered by the third insulating interlayer 340. A fourth insulating interlayer 350 may be formed on the mold and the third insulating interlayer 340.

An etching process may be performed to form a first hole through the fourth insulating interlayer 350, the mold, the support layer 300 and the sacrificial layer structure 290, which may extend in the first direction D1 and expose an upper surface of the CSP 240 on the first region I of the substrate 100. Additionally, a second channel hole may be formed through the third and fourth insulating interlayers 340 and 350, a portion of the mold, the support layer 300 and the sacrificial layer structure 290 by an etching process, which may extend in the first direction D1 and expose the upper surface of the CSP 240 on the second region II of the substrate 100. In example embodiments, a plurality of first holes may be spaced apart from each other in the second and third directions D2 and D3 on the first region I of the substrate 100, and a plurality of second channel holes may be spaced apart from each other in the second and third directions D2 and D3 on the second region II of the substrate 100.

Furthermore, third holes may be formed through the third and fourth insulating interlayers 340 and 350, the mold, the support layer 300 and the sacrificial layer structure 290 to expose an upper surface of the first insulation pattern 990 on the second region II of the substrate 100. In example embodiments, each of the third holes may be formed within an area that may be defined by neighboring second holes, in a plan view.

In example embodiments, the first to third holes may be simultaneously formed by one etching process, or sequentially formed by independent etching processes. In example embodiments, the etching process may be performed until each of the first and second holes exposes the upper surface of the CSP and the third hole exposes the upper surface of the first insulation pattern 990, and further, each of the first and second holes may extend through an upper portion of the CSP and the third hole may extend through an upper portion of the first insulation pattern 990.

Fifth to seventh sacrificial patterns 362, 366 and 630 may be formed in the first to third holes, respectively.

The fifth to seventh sacrificial patterns 362, 366 and 630 may be formed by forming a fifth sacrificial layer on the CSP 240, the first insulation pattern 990 and the fourth insulating interlayer 350 to fill the first to third holes, and planarizing the fifth sacrificial layer until an upper surface of the fourth insulating interlayer 350 is exposed.

In an example embodiment, the fifth sacrificial layer may have a first layer including an insulating material containing, e.g., carbon and a second layer including, e.g., polysilicon on the first layer. However, aspects of the inventive concept may not be limited thereto, and the fifth sacrificial layer may have a single layer including, e.g., polysilicon.

Figure 13:
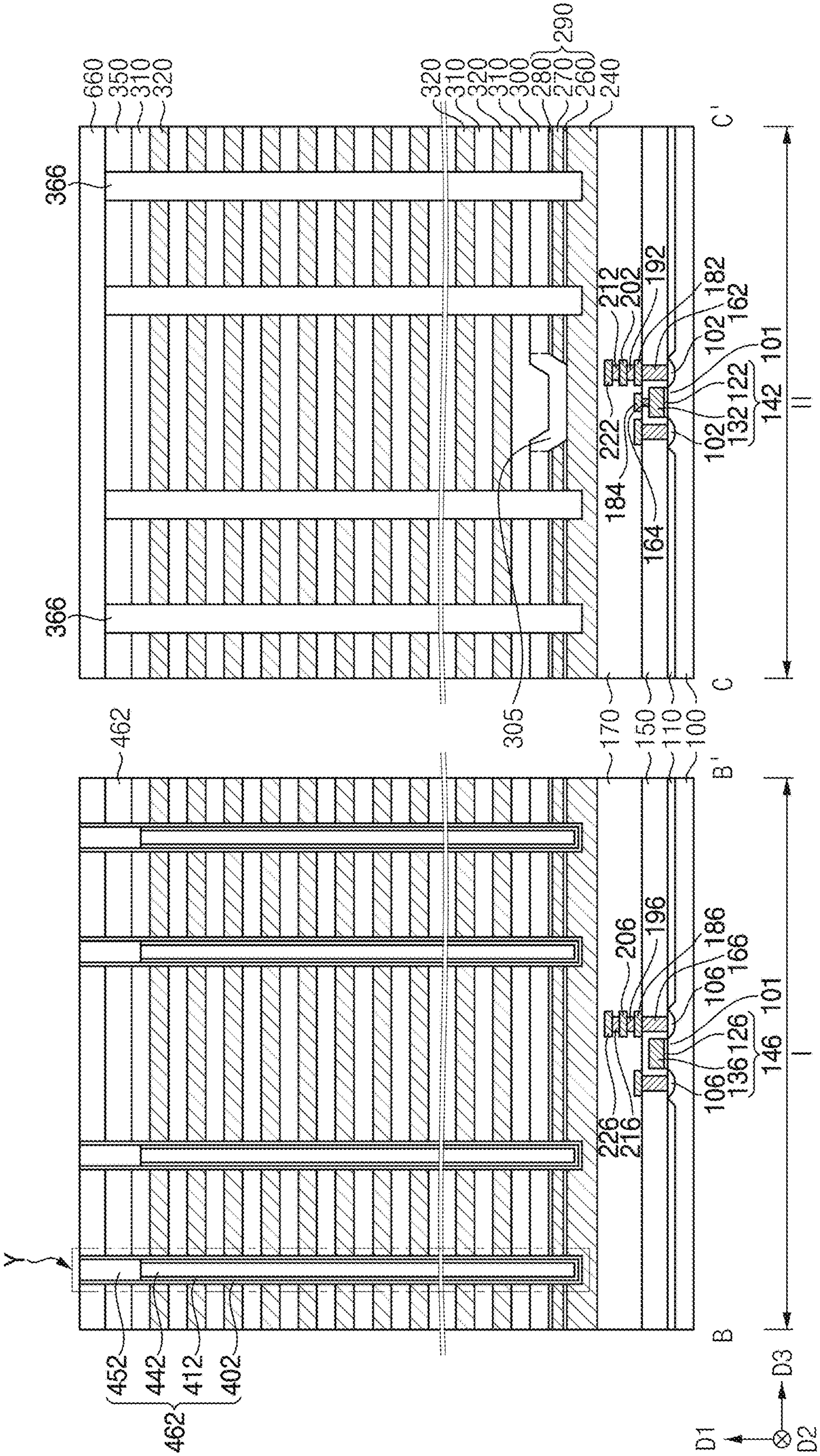

Referring to FIGS. 13 and 14, a fifth insulating interlayer 660 may be formed on the fourth insulating interlayer 350 and the fifth to seventh sacrificial patterns 362, 366 and 630, the fifth insulating interlayer 660 may be patterned by an etching process to expose the fifth sacrificial pattern 362, and the exposed fifth sacrificial pattern 362 may be removed to form the first hole exposing the upper surface of the CSP 240 again.

A charge storage structure layer and a channel layer may be sequentially formed on a sidewall of the first hole, the exposed upper surface of the CSP 240 and an upper surface of the fifth insulating interlayer 660, and a filling layer may be formed on the channel layer to fill a remaining portion of the first hole.

The charge storage structure layer may include a first blocking layer, a charge storage layer and a tunnel insulation layer sequentially stacked.

The filling layer, the channel layer and the charge storage structure layer may be planarized until the upper surface of the fifth insulating interlayer 660 is exposed. Thus, a charge storage structure 402, a channel 412 and a filling pattern 442 may be formed in the first hole. The charge storage structure 402 may include a first blocking pattern 372, a charge storage pattern 382 and a tunnel insulation pattern 392 sequentially stacked.

Upper portions of the filling pattern 442 and the channel 412 may be removed to form a second recess, and a capping pattern 452 may be formed to fill the second recess.

The charge storage structure 402, the channel 412, the filling pattern 442 and the capping pattern 452 in the first hole may form a memory channel structure 462.

In example embodiments, the memory channel structure 462 may have a pillar shape extending in the first direction D1. In example embodiments, a plurality of memory channel structures 462 may be spaced apart from each other in the second and third directions D2 and D3 on the first region I of the substrate 100.

In an example embodiment, when the memory channel structure 462 is formed, the sixth sacrificial pattern 366 may be removed together with the fifth sacrificial pattern 362 to form the second hole again, and a dummy memory channel structure having the same structure as the memory channel structure 462 may be formed in the second hole. However, aspects of the inventive concept may not be limited thereto. For example, FIG. 13 does not show that the dummy memory channel structure that may be formed after removing the sixth sacrificial pattern 366, and shows the sixth sacrificial pattern 366. Hereinafter, the sixth sacrificial pattern 366 may be referred to as a support structure 366.

A second division pattern may be formed through the fourth and fifth insulating interlayers 350 and 660 and an upper portion of the mold to extend in the second direction D2. In example embodiments, the second division pattern may be formed on the first region I of the substrate 100 and a portion of the second region II of the substrate 100 adjacent to the first region I of the substrate 100, and may extend through an uppermost step layer of the mold, that is, ones of the second insulation layers 310 at three upper levels, respectively, and one of the fourth sacrificial layers 320 at two upper levels, respectively. In an example embodiment, the second division pattern may be formed between neighboring memory channel structures 462. Alternatively, the second division pattern may extend through an upper portion of one of the memory channel structures 462.

Figure 15:
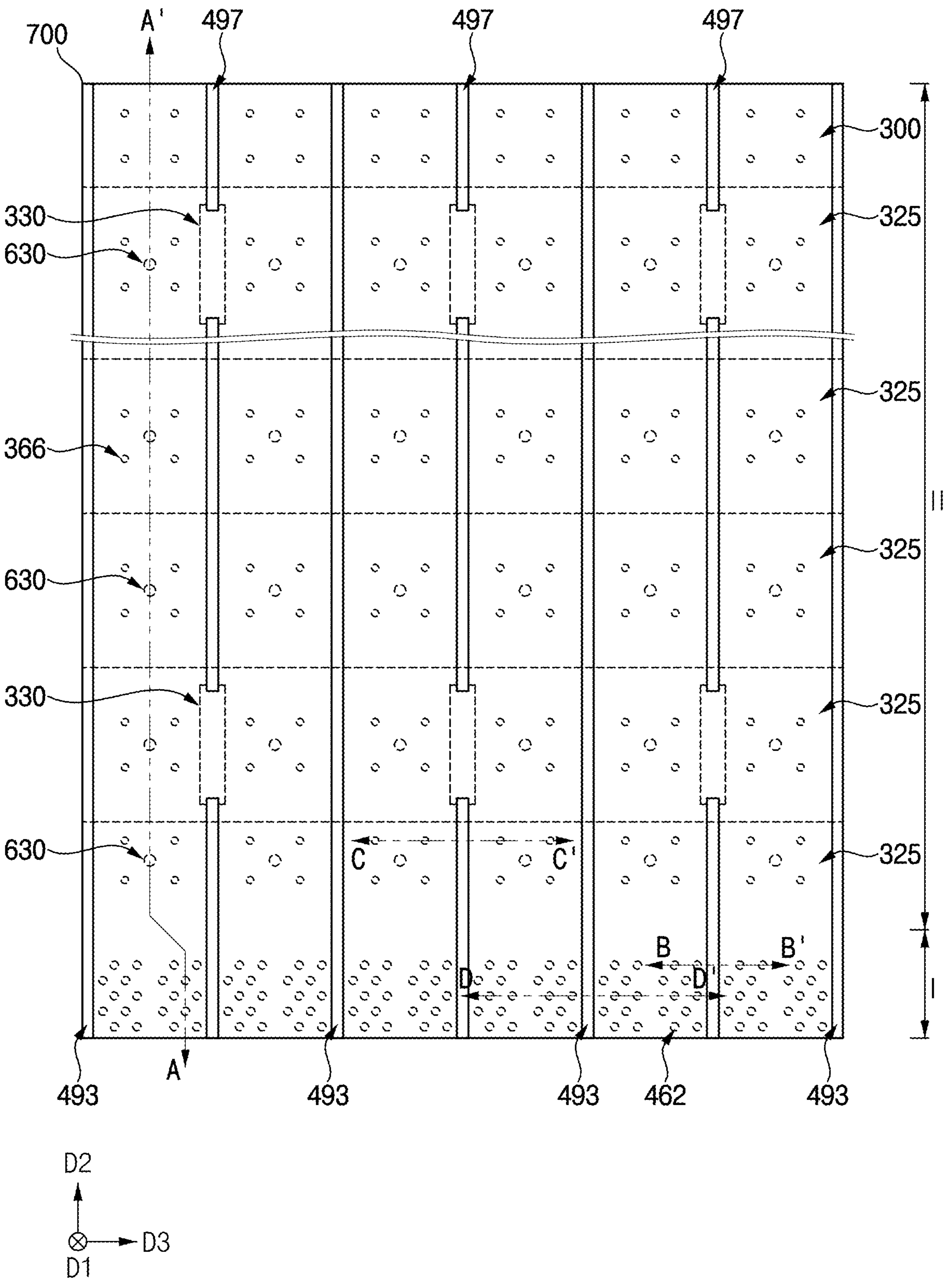
Figure 16:
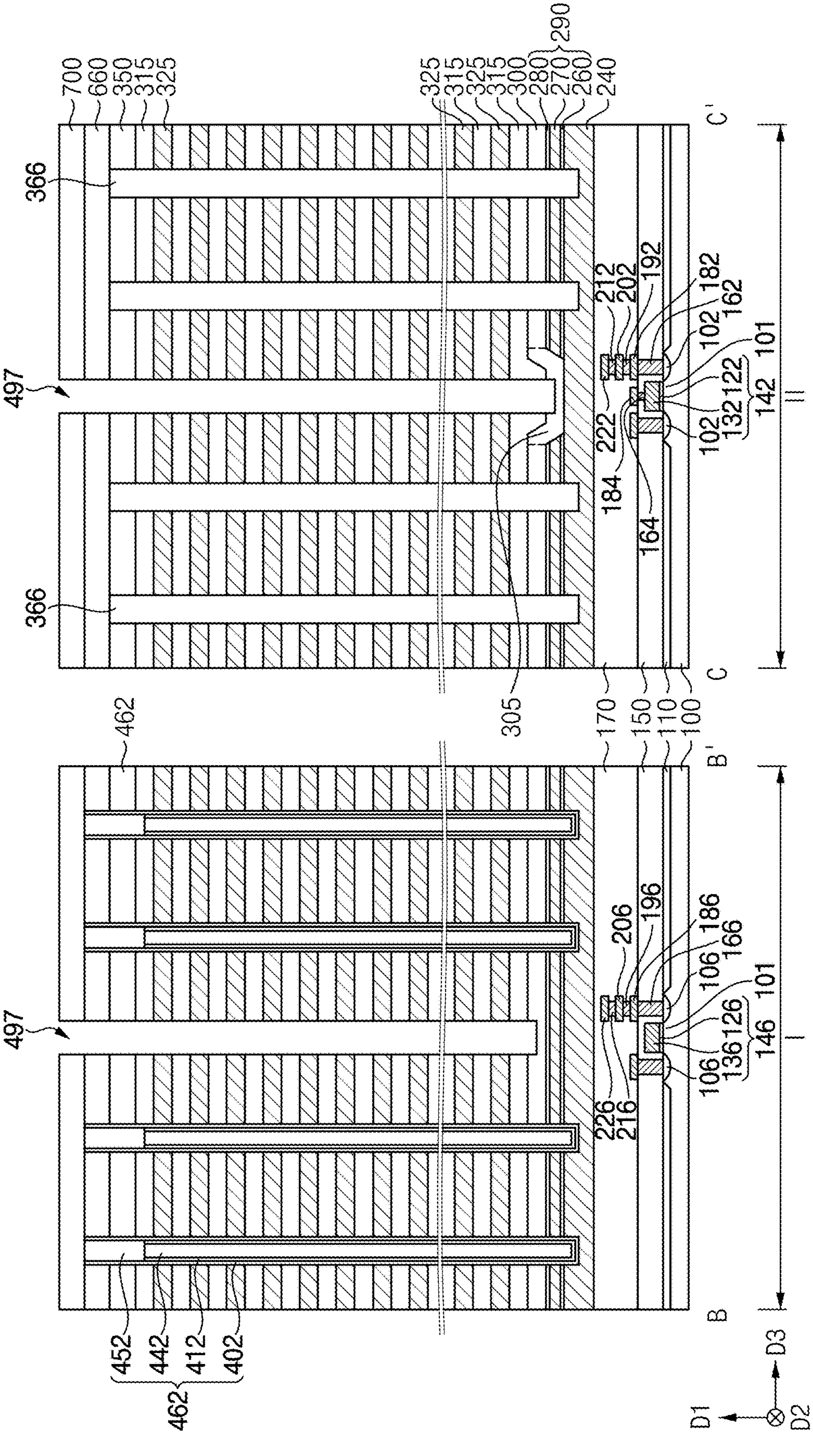
Figure 17:
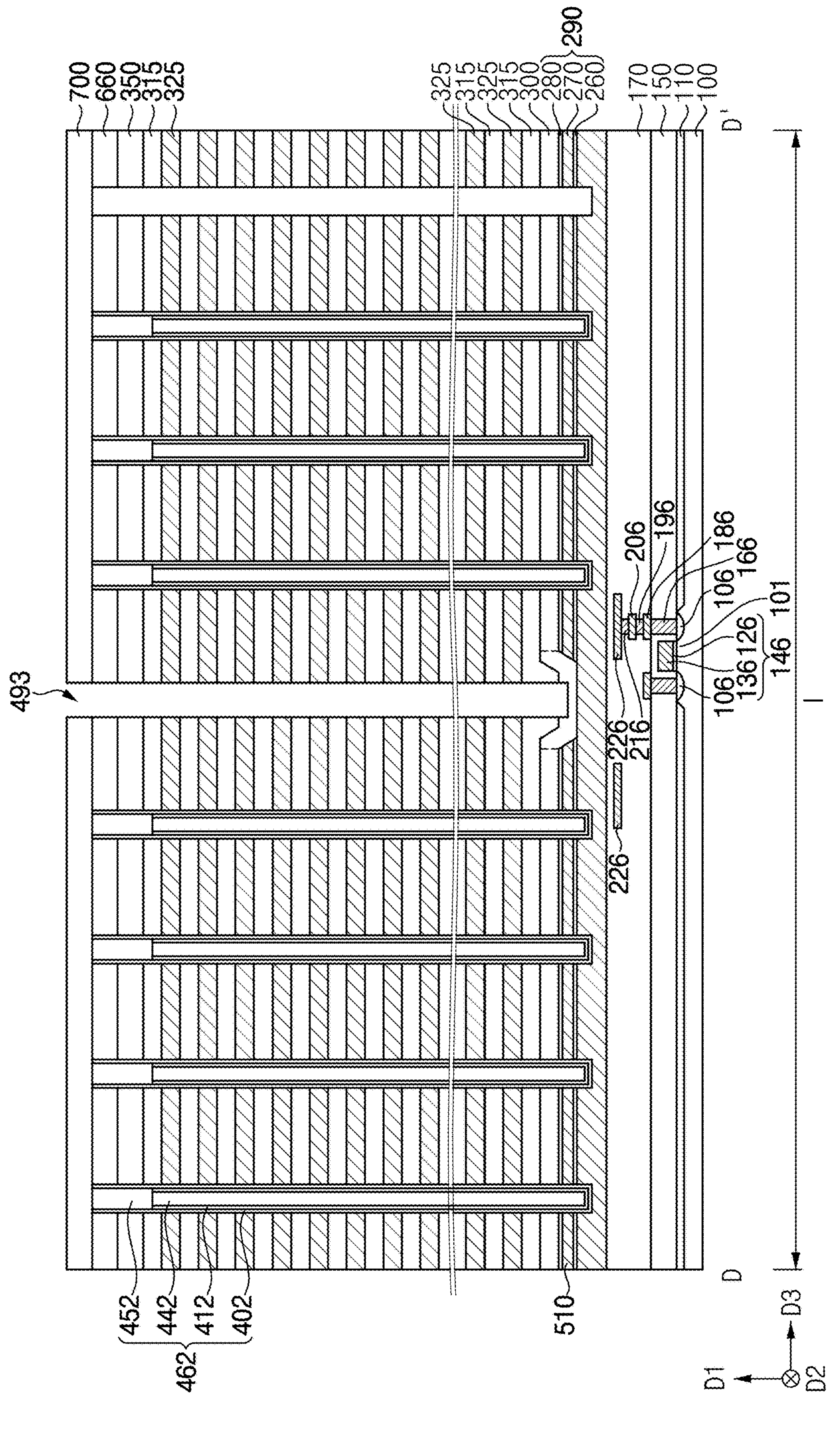

Referring to FIGS. 15 to 17, a sixth insulating interlayer 700 may be formed on the fifth insulating interlayer 660 and the memory channel structure 462, and a second opening 493 may be formed by an etching process through the third to sixth insulating interlayers 340, 350, 660 and 700 and the mold.

In example embodiments, the second opening 493 may expose an upper surface of the support pattern 305 on the second region II of the substrate 100, and may expose an upper surface of the support layer 300 or the support pattern 305 on the first region I of the substrate 100.

In example embodiments, the second opening 493 may extend in the second direction D2 on the first and second regions I and II of the substrate 100 to each of opposite end portions in the second direction D2 of the mold, and a plurality of second openings 493 may be spaced apart from each other in the third direction D3. Thus, the mold may be divided into a plurality of parts spaced apart from each other in the third direction D3 by the second openings 493, and each of the plurality of parts of the mold may form a memory block. As the second opening 493 is formed, the second insulation layer 310 and the fourth sacrificial layer 320 included in the mold may be divided into second insulation patterns 315 and fourth sacrificial patterns 325, respectively, each of which may extend in the second direction D2.

A third opening 497 may also be formed through the third to sixth insulating interlayers 340, 350, 660 and 700 and the mold, together with the second opening 493. In example embodiments, the third opening 497 may be formed between ones of the second openings 493 neighboring in the third direction D3 on the first and second regions I and II of the substrate 100, and a plurality of third openings 497 may be spaced apart from each other in the second direction D2. In example embodiments, an end portion in the second direction D2 of each of the third openings 497 may partially extend through the first division pattern 330, and thus the first division patterns 330 and the third openings 497 may be aligned in the second direction D2 in a straight line.

When the second and third openings 493 and 497 are formed by the etching process, the mold may be divided into the plurality of parts, each of which may extend in the second direction D2, spaced apart from each other in the third direction D3, however, each part of the mold may not fall down due to the memory channel structure 462 and the support structure 366.

Figure 18:
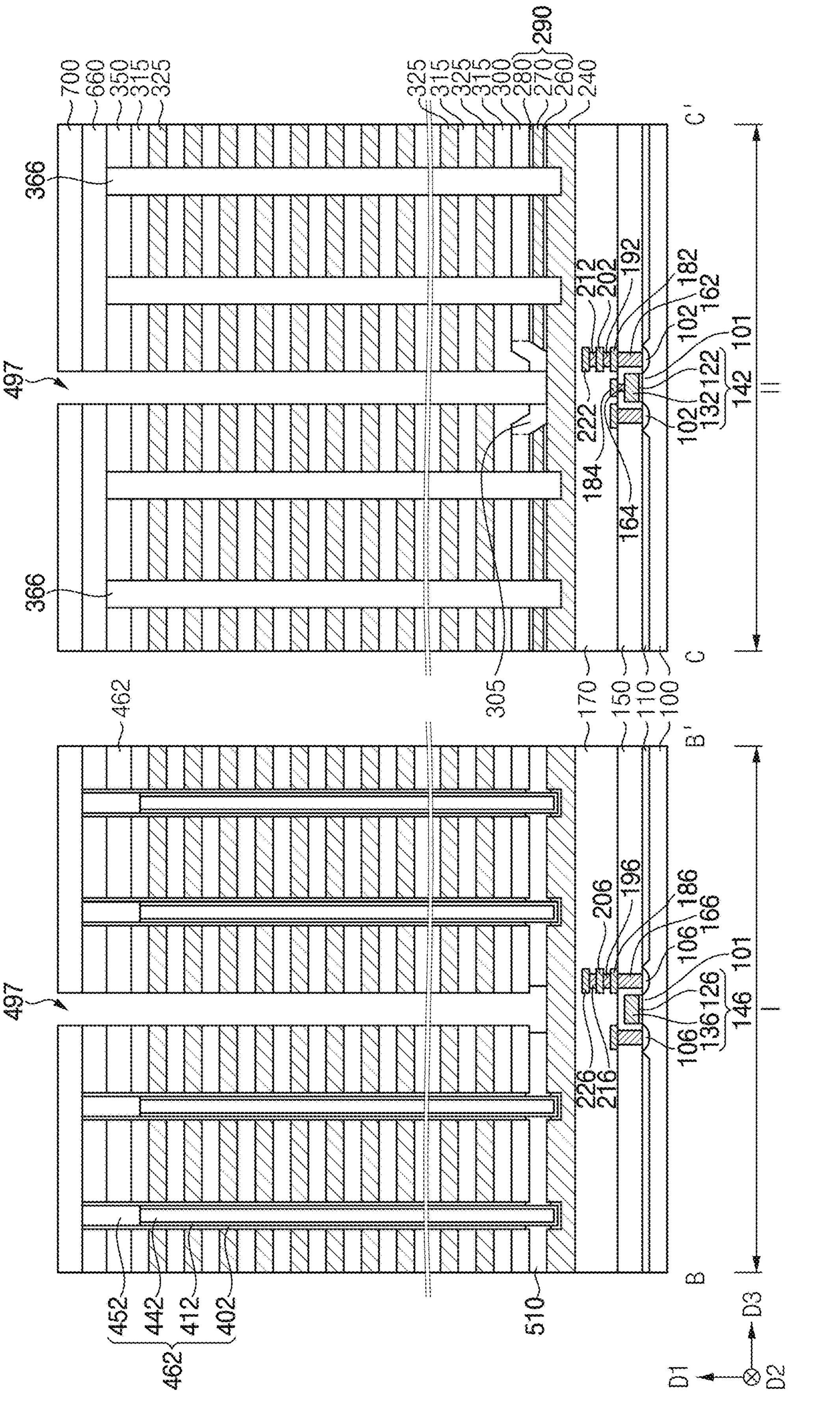
Figure 19:
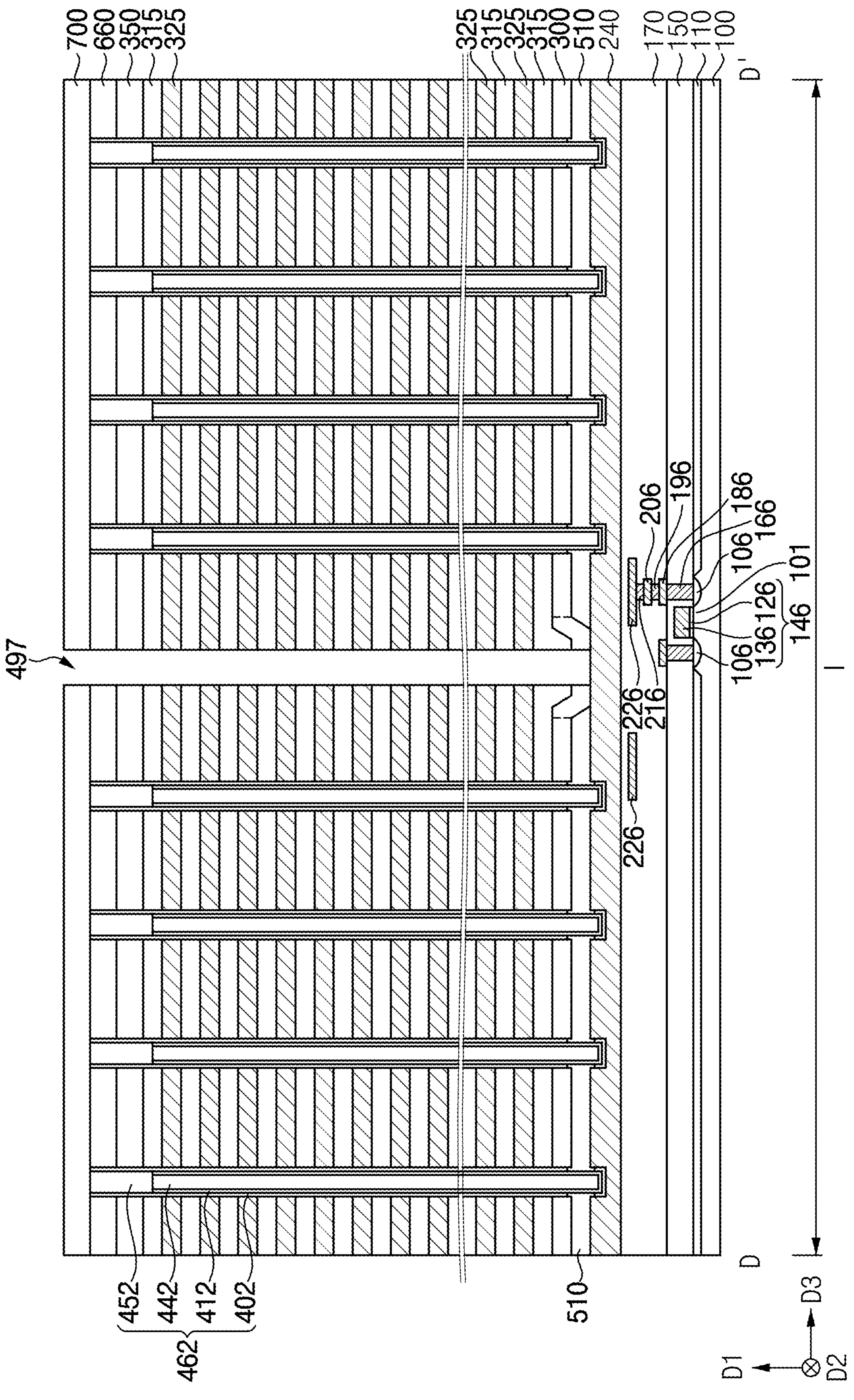
Figure 20:
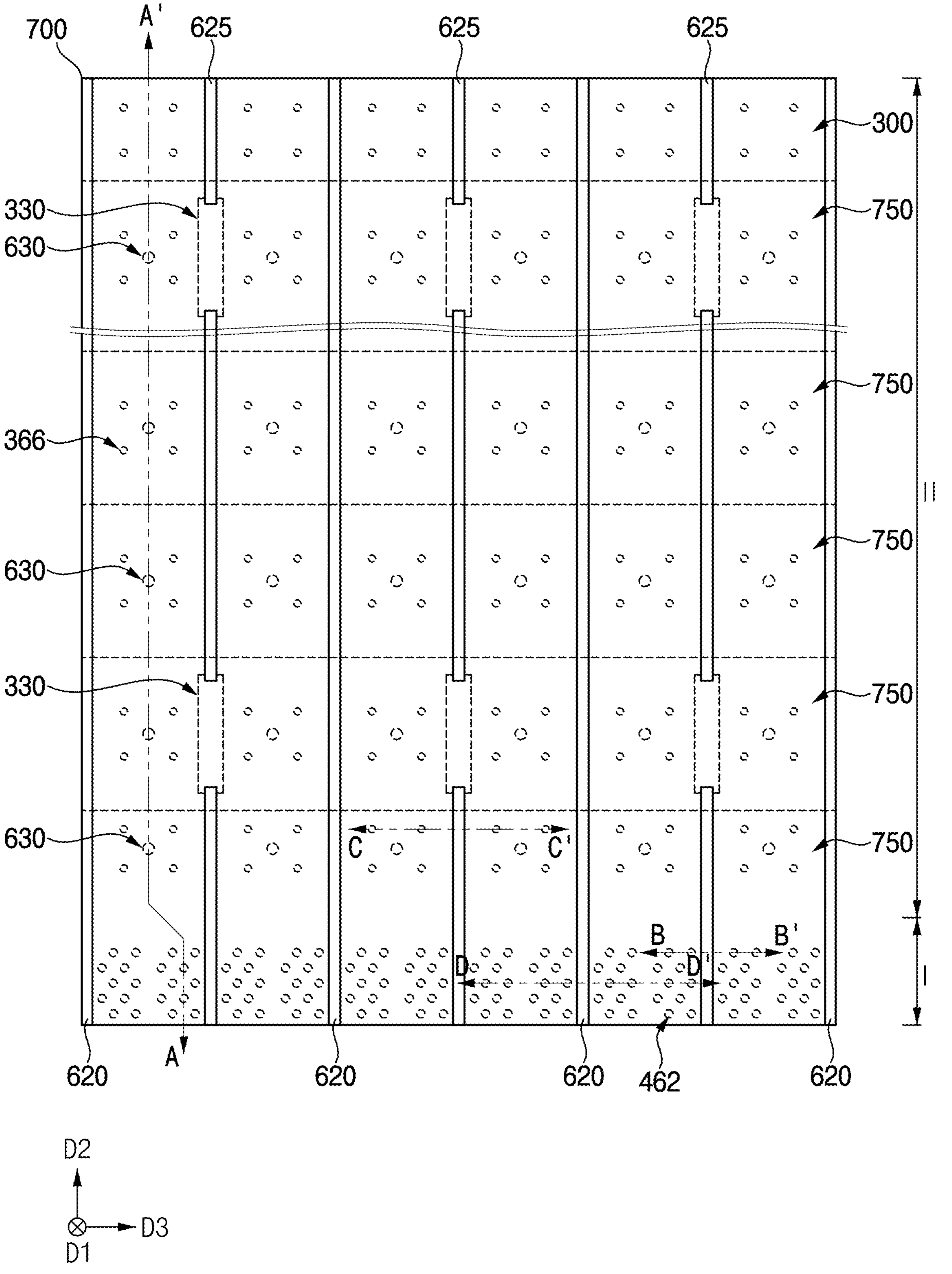
Figure 21:
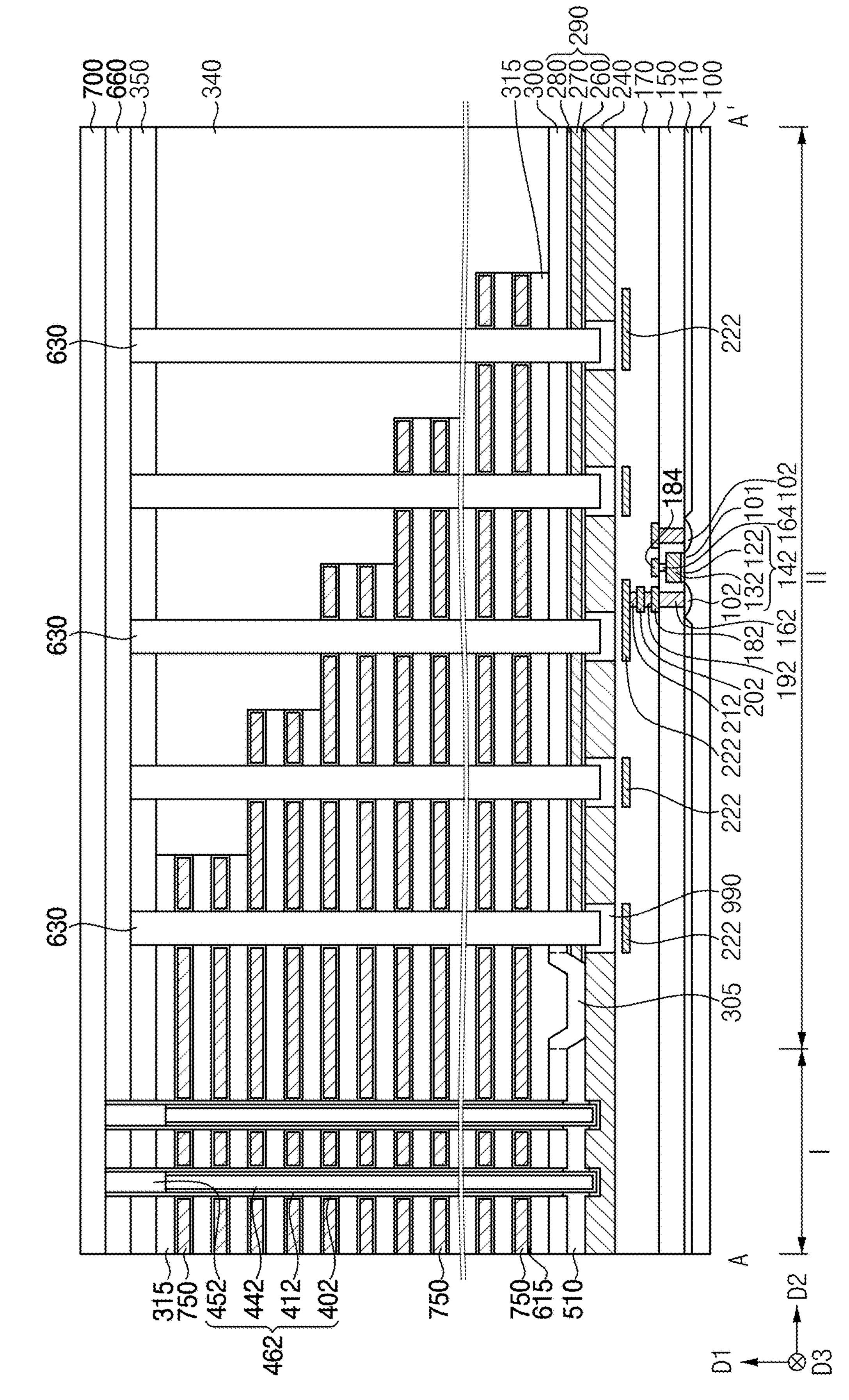
Figure 22:
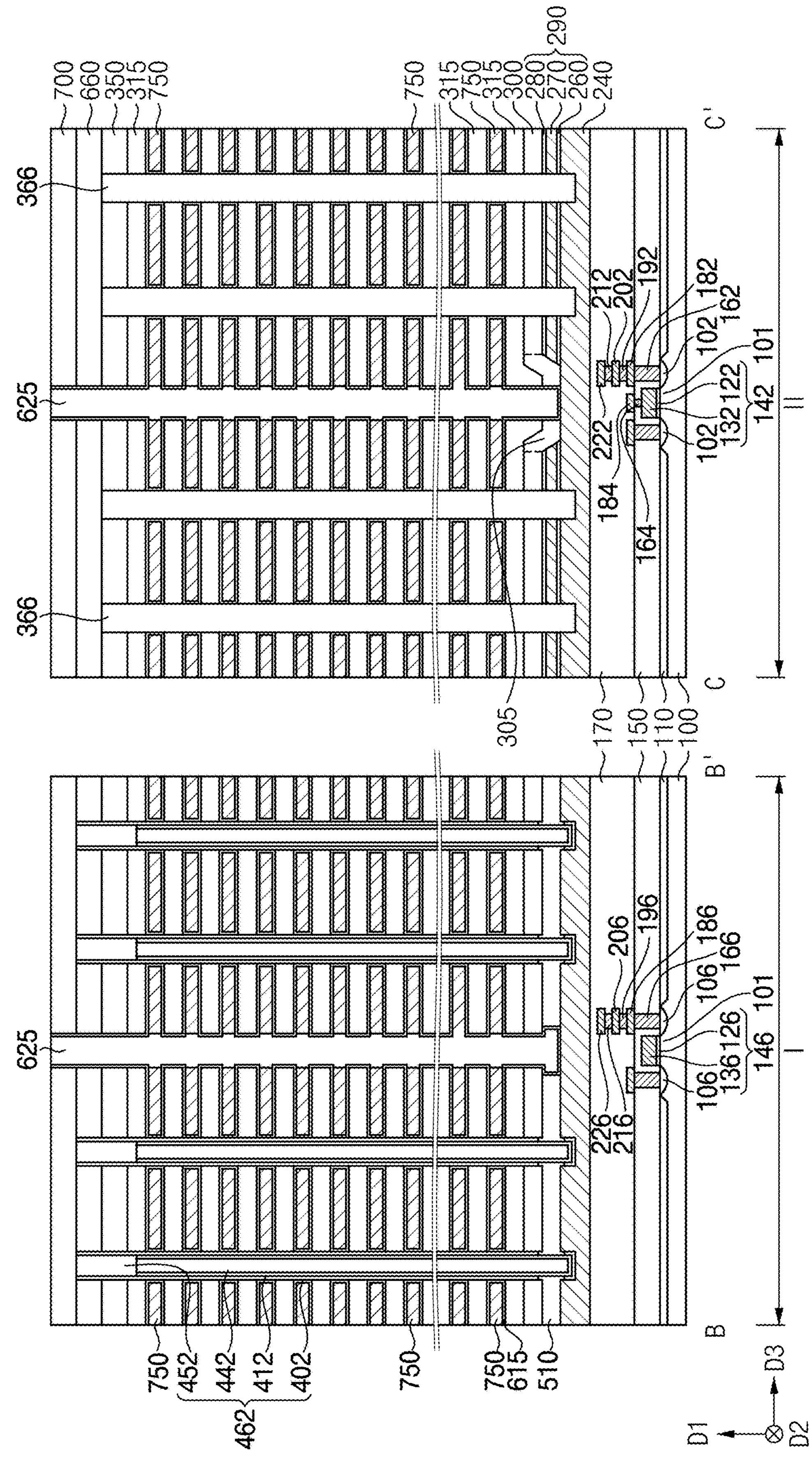
Figure 23:
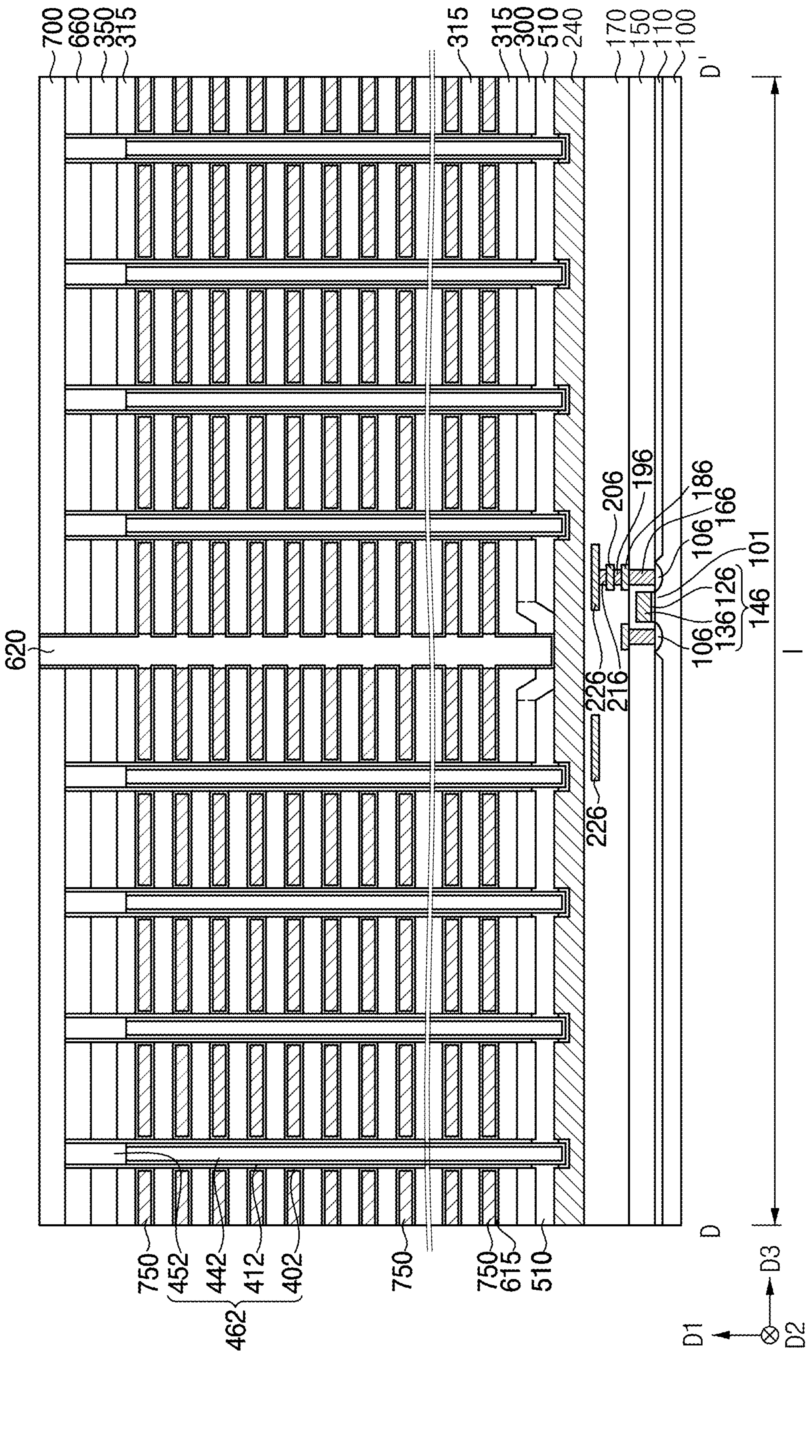

Referring to FIGS. 18 and 19, a sacrificial spacer layer may be formed on sidewalls of the second and third openings 493 and 497, the exposed upper surfaces of the support layer 300 and the support pattern 305 and an upper surface of the sixth insulating interlayer 700, and an anisotropic etching process may be performed on the sacrificial spacer layer to remove a portion of the sacrificial spacer layer on the upper surfaces of the support layer 300 and the support pattern 305 so that a sacrificial spacer may be formed. The sacrificial spacer layer may include, e.g., polysilicon.

Portions of the support layer 300 and the support pattern 305 exposed by the second and third openings 493 and 497 may be removed to expose upper surfaces of the sacrificial layer structure 290 and the CSP 240, respectively, and the exposed sacrificial layer structure 290 may be removed by, e.g., a wet etching process. Thus, a first gap may be formed between the CSP 240 and the support layer 300 on the first region I of the substrate 100.

The wet etching process may be performed using, e.g., hydrofluoric acid (HF) and/or phosphoric acid ($H_3PO_4$). In example embodiments, each of the second and third openings 493 and 497 may not extend through the support layer 300 to expose the sacrificial layer structure 290, but may extend through the support pattern 305 to expose the CSP 240 on the second region II of the substrate 100. Thus, the sacrificial layer structure 290 may not be removed by the wet etching process on the second region II of the substrate 100.

As the first gap is formed, a sidewall of a portion of the charge storage structure 402 may be exposed, and the portion of the charge storage structure 402 may also be removed to expose an outer sidewall of the channel 412. Thus, the charge storage structure 402 may be divided into an upper portion extending through the mold and covering an outer sidewall of a most portion of the channel 412 and a lower portion covering a lower surface of the channel 412 on the CSP 240.

The sacrificial spacer may be removed, and a channel connection layer may be formed on the sidewalls of the second and third openings 493 and 497 and in the first gap, and a portion of the channel connection layer in the second and third openings 493 and 497 may be removed by, e.g., an etch back process to form a channel connection pattern 510 in the first gap.

As the channel connection pattern 510 is formed, the channels 412 between neighboring ones of the second openings 493 in the third direction D3 may be connected with each other in each memory block on the first region I of the substrate 100. An air gap may be formed in the channel connection pattern 510.

Referring to FIGS. 20 to 23, the fourth sacrificial patterns 325 exposed by the second and third openings 493 and 497 may be removed to form a second gap between neighboring ones of the second insulation patterns 315 in the first direction D1, and a portion of an outer sidewall of the charge storage structure 402 included in the memory channel structure 462, a portion of a sidewall of the support structure 366 and a portion of a sidewall of the seventh sacrificial pattern 630 may be exposed.

In example embodiments, the fourth sacrificial patterns 325 may be removed by a wet etching process using, e.g., phosphoric acid ($H_3PO_4$) or sulfuric acid ($H_2SO_4$).

A second blocking layer may be formed on the outer sidewall of the charge storage structure 402, the sidewall of the support structure 366 and the sidewall of the seventh sacrificial pattern 630 exposed by the second gap, an inner wall of the second gap, a surface of the second insulation pattern 315, sidewalls of the fourth to sixth insulating interlayers 350, 660 and 700 and the upper surface of the sixth insulating interlayer 700, and a gate electrode layer may be formed on the second blocking layer.

The gate electrode layer may be partially removed to form a gate electrode 750 in the second gap. In example embodiments, the gate electrode layer may be removed by a wet etching process.

In example embodiments, the gate electrode 750 may extend in the second direction D2, and a plurality of gate electrodes 750 may be spaced apart from each other in the first direction D1 to form a gate electrode structure. The gate electrode structure may have a staircase shape including step layers each of which may include two gate electrodes 750 stacked in the first direction D1.

In example embodiments, a plurality of gate electrode structures may be spaced apart from each other by the second openings 493 in the third direction D3. As described, above, the third opening 497 may not extend to opposite end portions in the second direction D2 of the mold, and thus the gate electrode structure may not be divided in the third direction D3 by the third opening 497. However, a lowermost one of the gate electrode 750 in the gate electrode structure may be divided in the third direction D3 by the third openings 497 together with the first division patterns 330.

A second division layer may be formed on the second blocking layer to fill the second and third openings 493 and 497, and may be planarized until the upper surface of the sixth insulating interlayer 700 is exposed.

Thus, the second blocking layer may be transformed into a second blocking pattern 615, and third and fourth division patterns 620 and 625 may be formed in the second and third openings 493 and 497, respectively.

Figure 25:
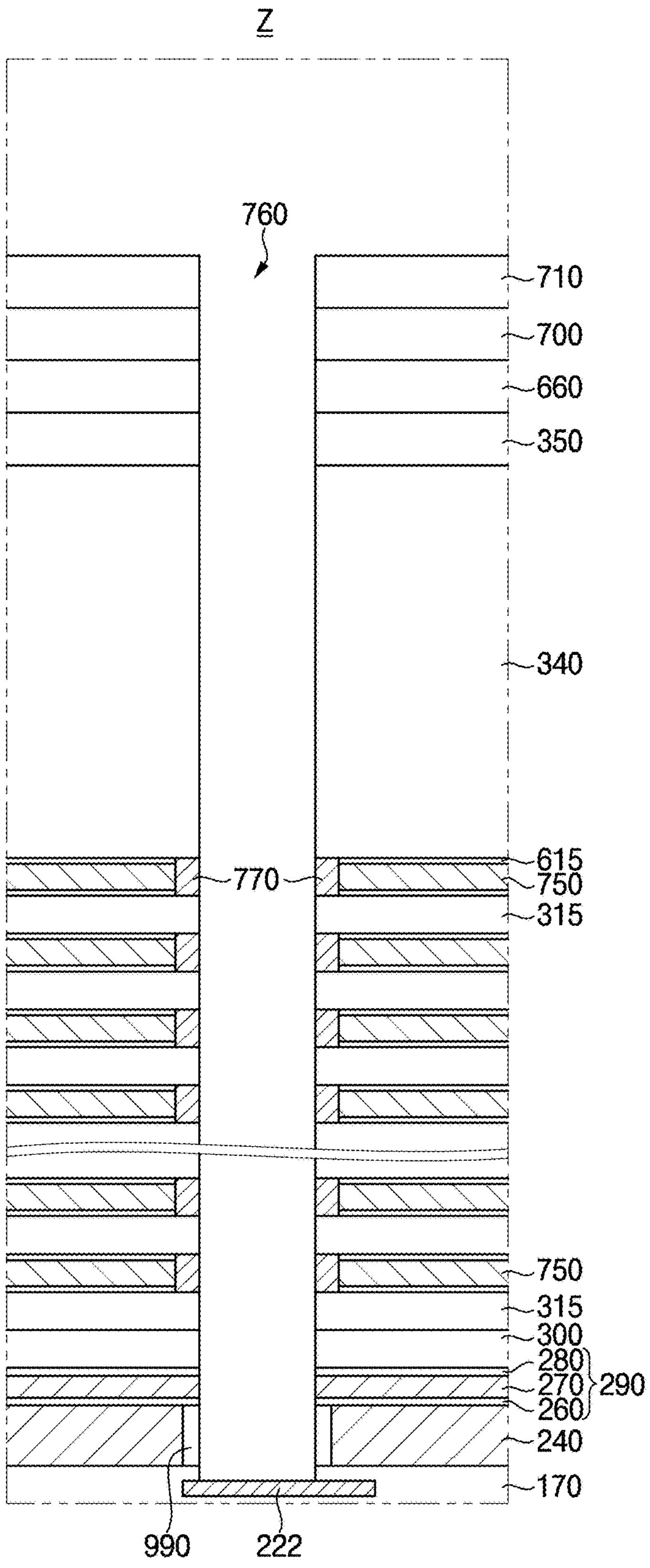

Referring to FIGS. 24 and 25, a seventh insulating interlayer 710 may be formed on the sixth insulating interlayer 700, the third and fourth division patterns 620 and 625 and the second blocking pattern 615, the fifth to seventh insulating interlayers 660, 700 and 710 may be patterned to expose an upper surface of the seventh sacrificial pattern 630, and the seventh sacrificial pattern 630 may be removed to form a fourth hole 760. Additionally, a lower portion of the first insulation pattern 990 and an upper portion of the second insulating interlayer 170 may be removed to expose an upper surface of the sixth lower wiring 222.

Lateral portions of the gate electrode 750 and the second blocking pattern 615 exposed by the fourth hole 760 may be removed to form a third recess, a third insulation layer may be formed in the fourth hole 760 to fill the third recess, and a wet etching process may be performed on the third insulation layer to remove a portion of the third insulation layer in the fourth hole 760. Thus, a third insulation pattern 770 may be formed in the third recess. The third insulation pattern 770 may include a nitride, e.g., silicon nitride, however, aspects of the inventive concept may not be limited thereto.

Figure 26:
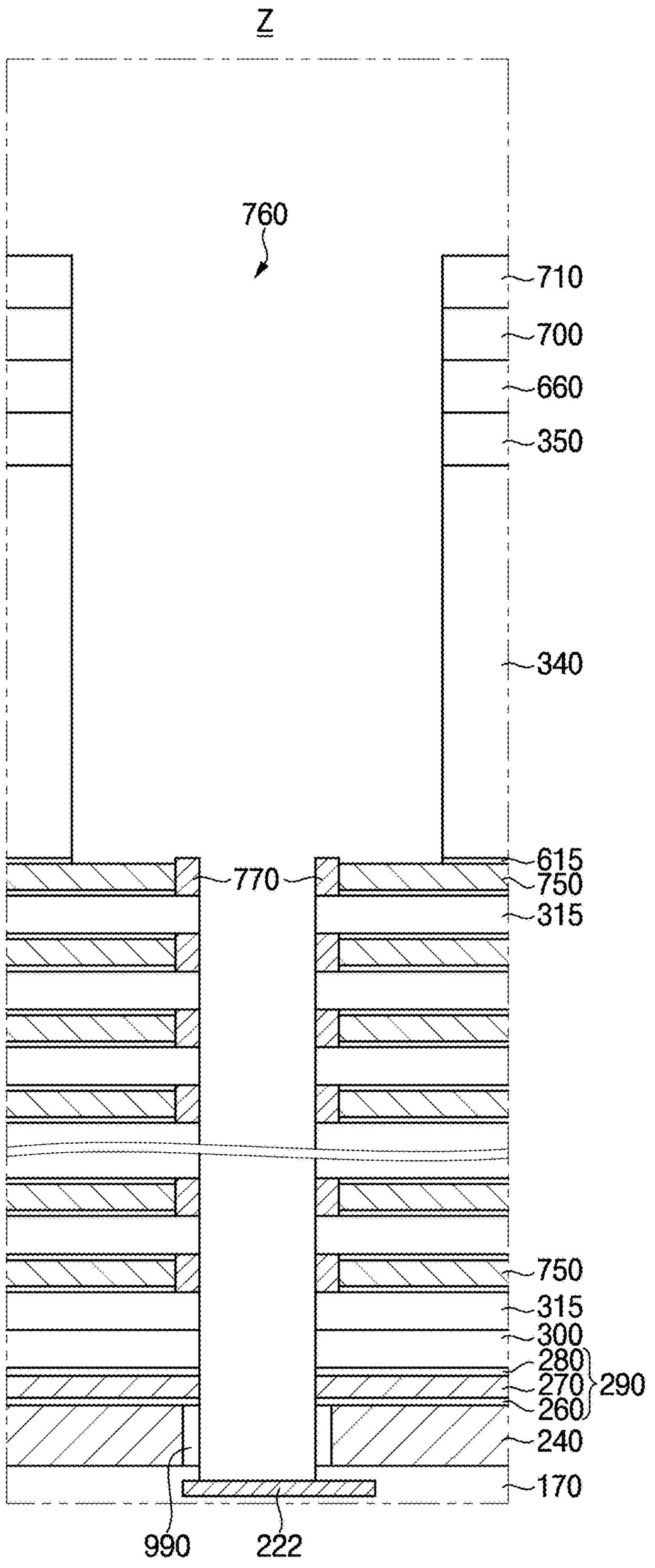

Referring to FIG. 26, portions of the third to seventh insulating interlayers 340, 350, 660, 700 and 710 adjacent to the fourth hole 760 and a portion of the second blocking pattern 615 thereunder may be removed to enlarge an upper portion of the fourth hole 760 in the horizontal direction, and thus a portion of an upper surface of an uppermost one of the gate electrodes 750 that are adjacent to the fourth hole 760 may be exposed.

In an example embodiment, the upper portion of the fourth hole 760 may be enlarged in the horizontal direction by a wet etching process. Alternatively, the upper portion of the fourth hole 760 may be enlarged in the horizontal direction by a dry etching process.

Figure 27:
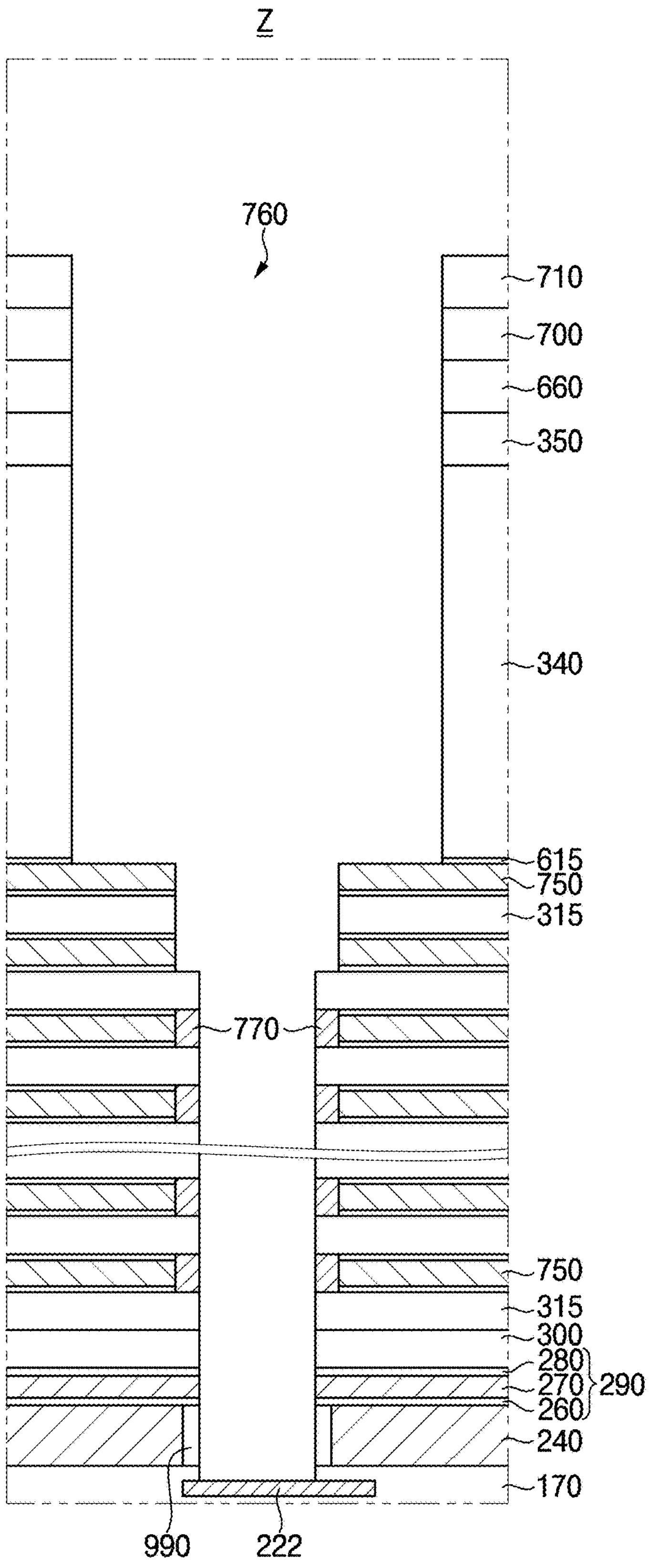

Referring to FIG. 27, ones of the third insulation patterns 770 at two upper levels, respectively, and a portion of the second insulation pattern 315 therebetween may be removed to expose sidewalls of ones of the gate electrodes 750 at two upper levels, respectively.

In an example embodiment, the ones of the third insulation patterns 770 and the portion of the second insulation pattern 315 may be removed by a dry etching process, e.g., a plasma etching process.

Figure 28:
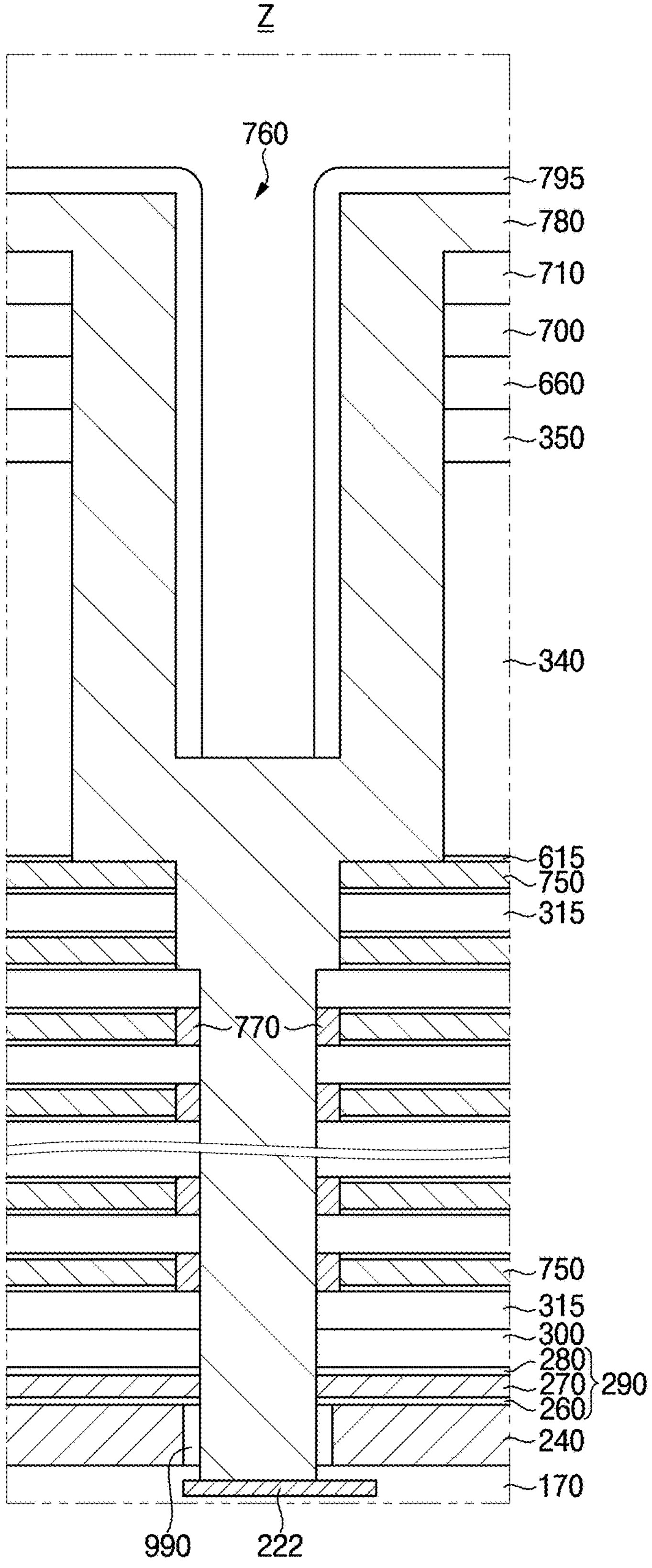

Referring to FIG. 28, an upper contact plug layer 780 may be formed on the upper surface of the sixth lower wiring 222, the sidewall of the fourth hole 760 and an upper surface of the seventh insulating interlayer 710 to fill at least a lower portion of the fourth hole 760.

The upper portion of the fourth hole 760 may have a width greater than that of the lower portion of the fourth hole 760, and thus the upper contact plug layer 780 may not fill a central portion of the upper portion of the fourth hole 760. Thus, a fourth recess may be formed on the upper contact plug layer 780.

A spacer layer may be formed on the upper contact plug layer 780, and a portion of the spacer layer on a bottom of the fourth recess may be removed by, e.g., a plasma etching process to form a first spacer 795 on a sidewall of a portion of the upper contact plug layer 780 on an upper sidewall of the fourth hole 760, and thus an upper surface of a central portion of the upper contact plug layer 780 may be exposed. The first spacer 795 may include an oxide, e.g., silicon oxide.

In an example embodiment, the first spacer 795 may also cover a portion of the upper contact plug layer 780 on the upper surface of the seventh insulating interlayer 710, however, aspects of the inventive concept may not be limited thereto.

Figure 29:
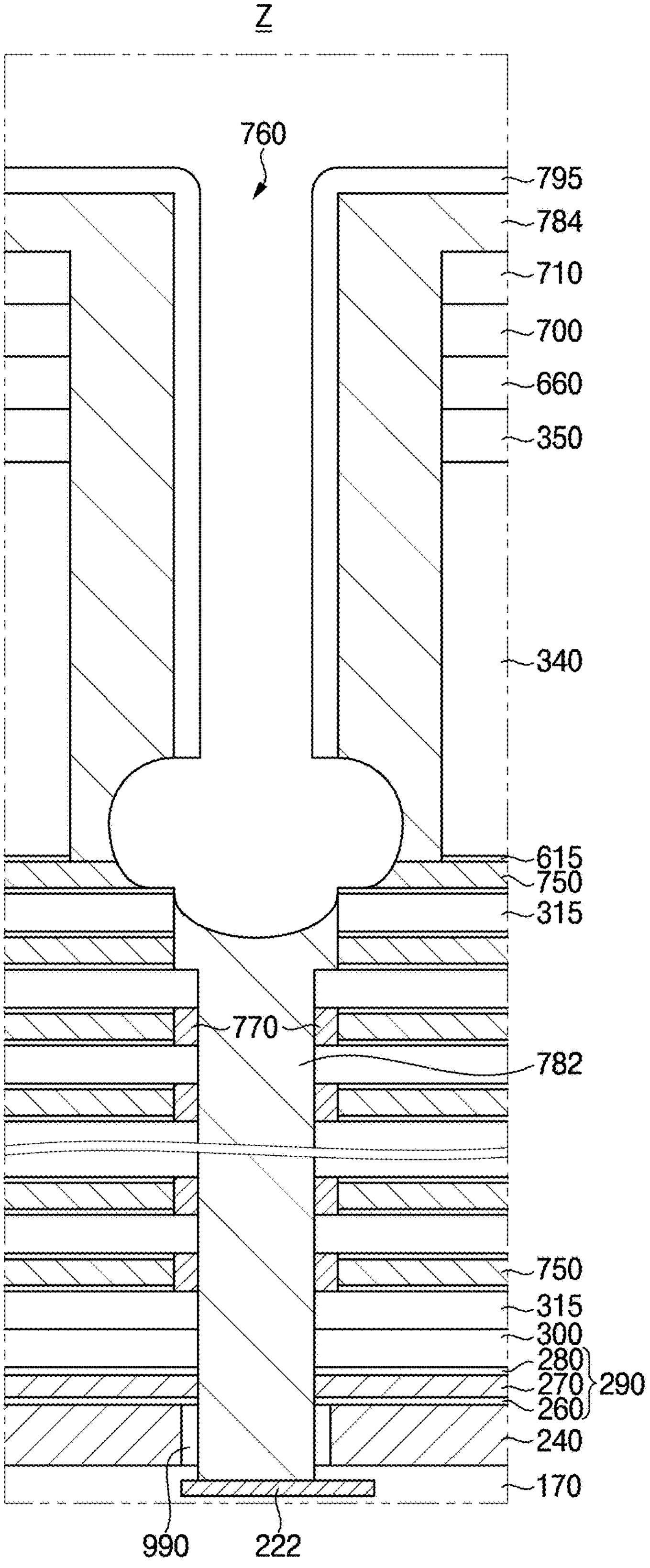

Referring to FIG. 29, the central portion of the upper contact plug layer 780 not covered by the first spacer 795 may be removed by, e.g., a wet etching process so that the upper contact plug layer 780 may be divided into a first upper contact plug 782 and a second upper contact plug 784 spaced apart from each other in the first direction D1.

In example embodiments, an upper surface of the first upper contact plug 782 may be lower than a lower surface of an uppermost one of the gate electrodes 750 adjacent to the fourth hole 760, and may be higher than a lower surface of a second one of the gate electrodes 750 that is disposed at a second level from above. In an example embodiment, the upper surface of the first upper contact plug 782 may be higher than or substantially coplanar with an upper surface of the second one of the gate electrodes 750 from above. In an example embodiment, the upper surface of the first upper contact plug 782 may be concave, and thus an upper surface of a central portion of the first upper contact plug 782 may be lower than an upper surface of an edge portion of the first upper contact plug 782. The first upper contact plug 782 may have a shape of a pillar extending in the first direction D1, and a width of an upper portion of the first upper contact plug 782 may be greater than widths of other portions of the first upper contact plug 782.

A lower surface of the second upper contact plug 784 may contact an upper surface of the uppermost one of the gate electrodes 750 adjacent to the fourth hole 760.

Referring to FIGS. 30 to 32, a fourth insulation layer may be formed on the first upper contact plug 782 and the first spacer 795 to fill the upper portion of the fourth hole 760, and a planarization process may be performed on the fourth insulation layer to form a fourth insulation pattern 800 in the upper portion of the fourth hole 760.

The planarization process may include, e.g., CMP process and/or an etch back process. During the planarization process, portions of the first spacer 795 and the second upper contact plug 784 on the upper surface of the seventh insulating interlayer 710 may also be removed.

The fourth insulation pattern 800 may include an oxide, e.g., silicon oxide. In an example embodiment, the fourth insulation pattern 800 may include a material substantially the same as a material of the first spacer 795, and thus may be merged with the fourth insulation pattern 800. FIG. 32 shows that the first spacer 795 is merged with the fourth insulation pattern 800.

In example embodiments, the second upper contact plug 784 may have a shape of a hollow cylinder extending in the first direction D1. A width of an outer sidewall of the second upper contact plug 784 may be greater than a width of the first upper contact plug 782.

Referring to FIGS. 1 to 6, an eighth insulating interlayer 810 may be formed on the seventh insulating interlayer 710, the second upper contact plug 784 and the fourth insulation pattern 800, and a first upper via 820 may be formed through the second upper contact plug 784 to contact an upper surface of the second upper contact plug 784. Additionally, a second upper via 830 may be formed through the sixth to eighth insulating interlayers 700, 710 and 810 to contact an upper surface of the capping pattern 452 of the memory channel structure 462.

A ninth insulating interlayer 840 may be formed on the eighth insulating interlayer 810 and the first and second upper vias 820 and 830, and first and second upper wirings 850 and 860 may be formed through the ninth insulating interlayer 840 to contact the first and second upper vias 820 and 830, respectively, to complete the fabrication of the semiconductor device.

Upper vias and upper wirings may be further formed on the first and second upper wirings 850 and 860.

As illustrated above, during the formation of the gate electrode structure having the staircase shape, instead of forming a step including a single gate electrode 750 at a single level, each of the steps may be formed to include a pair of gate electrodes 750 that are disposed at two levels, respectively. Thus, the number of photo processes required to form the photoresist patterns used as etching masks for step formation, as well as the subsequent photoresist pattern trimming and etching processes by half.

The first and second upper contact plug structures 782 and 784 for transferring electrical signals to the pair of gate electrodes 750, respectively, may be formed to extend in downward and upward directions, respectively, so as to be electrically connected to the lower circuit pattern and the upper wirings, respectively. Thus, an area for forming the first and second upper contact plug structures 782 and 784 may be reduced, and the integration degree of the semiconductor device may be enhanced.

Figure 33:
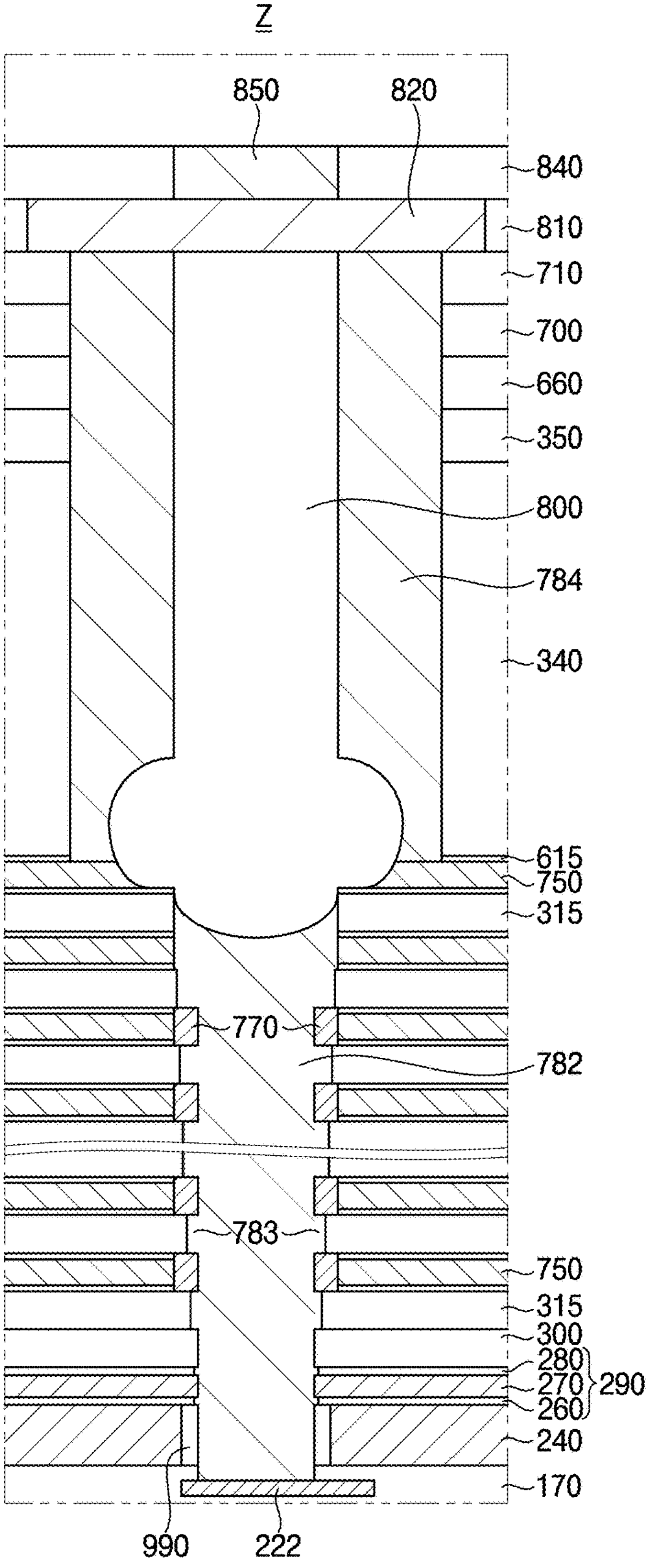
FIG. 33 is a cross-sectional view illustrating a semiconductor device in accordance with example embodiments.

FIG. 33 is a cross-sectional view illustrating a semiconductor device in accordance with example embodiments, which may correspond to FIG. 4. This semiconductor device may be substantially the same as or similar to that of FIGS. 1 to 6, except for some elements. Thus, repeated explanations are omitted herein.

Referring to FIG. 33, a portion of a sidewall of the first upper contact plug 782 facing the second insulation pattern 315 may protrude more in the horizontal direction than a portion of the sidewall of the first upper contact plug 782 facing the third insulation pattern 770.

Additionally, widths in the horizontal direction of the portions of the sidewall of the first upper contact plug 782 facing the second insulation patterns 315 may decrease from a top toward a bottom thereof (i.e., along the first direction D1).

Figure 34:
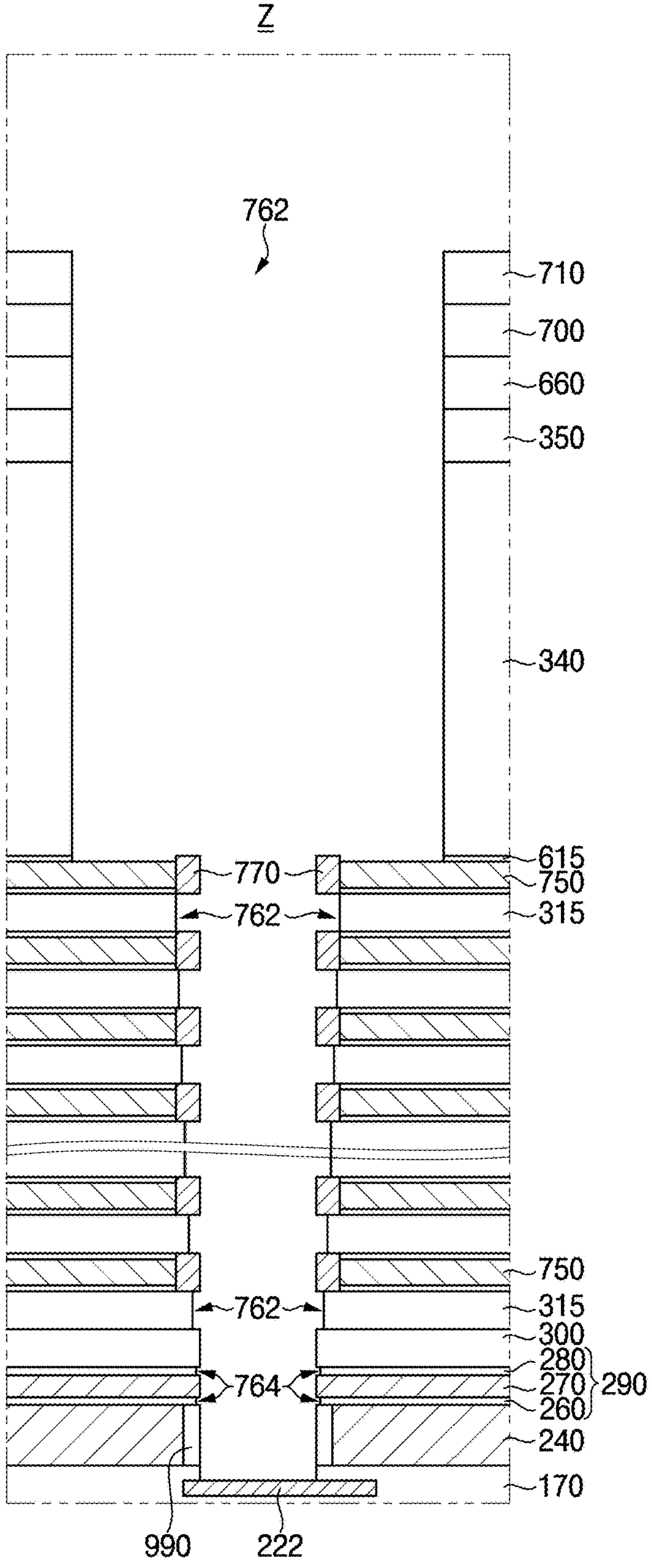
FIG. 34 is a cross-sectional view illustrating a method of manufacturing a semiconductor device in accordance with example embodiments.

FIG. 34 is a cross-sectional view illustrating a method of manufacturing a semiconductor device in accordance with example embodiments, which may correspond to FIG. 4. This method may include processes substantially the same as or similar to those illustrated with reference to FIGS. 7 to 32 and FIGS. 1 to 6, and thus repeated explanations thereof are omitted herein.

Referring to FIG. 34, processes substantially the same as or similar to those illustrated with reference to FIGS. 7 to 25 may be performed, and the etching process illustrated with reference to FIG. 26, e.g., a wet etching process may be performed.

When the portions of the third to seventh insulating interlayers 340, 350, 660, 700 and 710 adjacent to the fourth hole 760 are removed by the wet etching process, portions of the second insulation pattern 315 and the first and third sacrificial layers 260 and 280 adjacent to the fourth hole 760, which may include silicon oxide as the third to seventh insulating interlayers 340, 350, 660, 700 and 710, may also be removed to form fifth and sixth recesses 762 and 764, respectively.

In an example embodiment, widths in the horizontal direction of the fifth and sixth recesses 762 and 764 may decrease from an uppermost level to a lowermost level (i.e., along the first direction D1), however, aspects of the inventive concept may not be limited thereto.

Referring to FIG. 33 again, processes substantially the same as or similar to those illustrated with reference to FIGS. 27 to 32 and FIGS. 1 to 6 may be performed to complete the fabrication of the semiconductor device.

Figure 35:
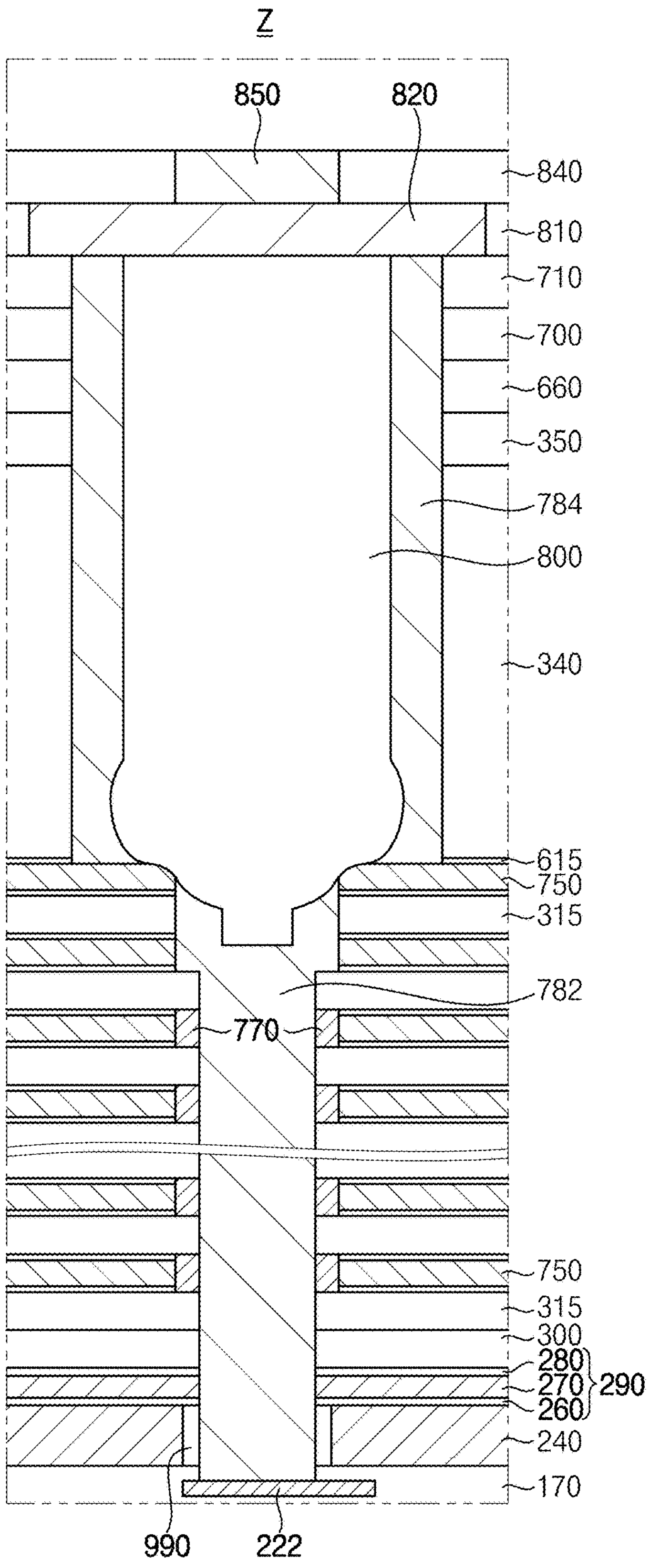
FIG. 35 is a cross-sectional view illustrating a semiconductor device in accordance with example embodiments.

FIG. 35 is a cross-sectional view illustrating a semiconductor device in accordance with example embodiments, which may correspond to FIG. 4. This semiconductor device may be substantially the same as or similar to that of FIGS. 1 to 6, except for some elements. Thus, repeated explanations are omitted herein.

Referring to FIG. 35, an upper surface of a central portion of the first upper contact plug 782 may be lower than an upper surface of an edge portion of the first upper contact plug 782, and thus an upper surface of the first upper contact plug 782 may be concave. A thickness in the horizontal direction of the second upper contact plug 784 may be substantially uniform in the vertical direction.

Figure 36:
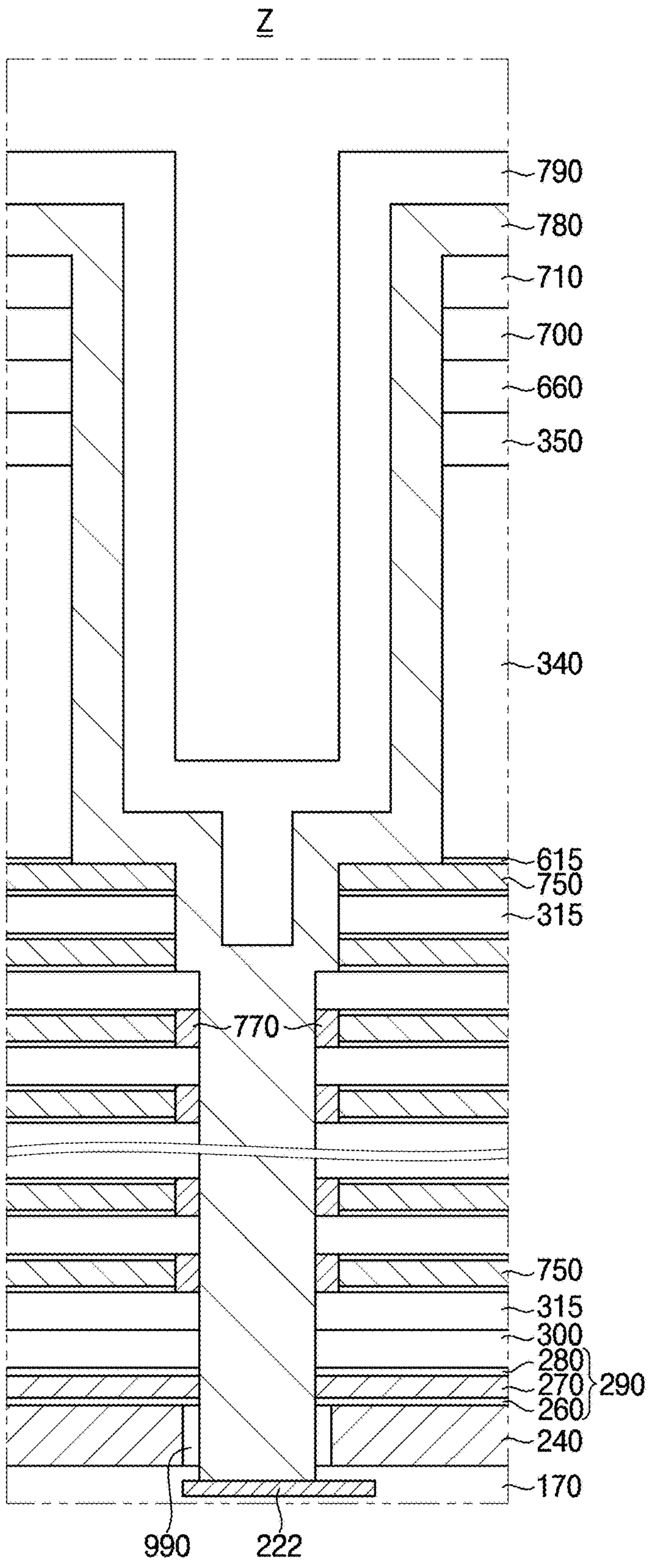
FIGS. 36 to 38 are cross-sectional views illustrating a method of manufacturing a semiconductor device in accordance with example embodiments.
Figure 37:
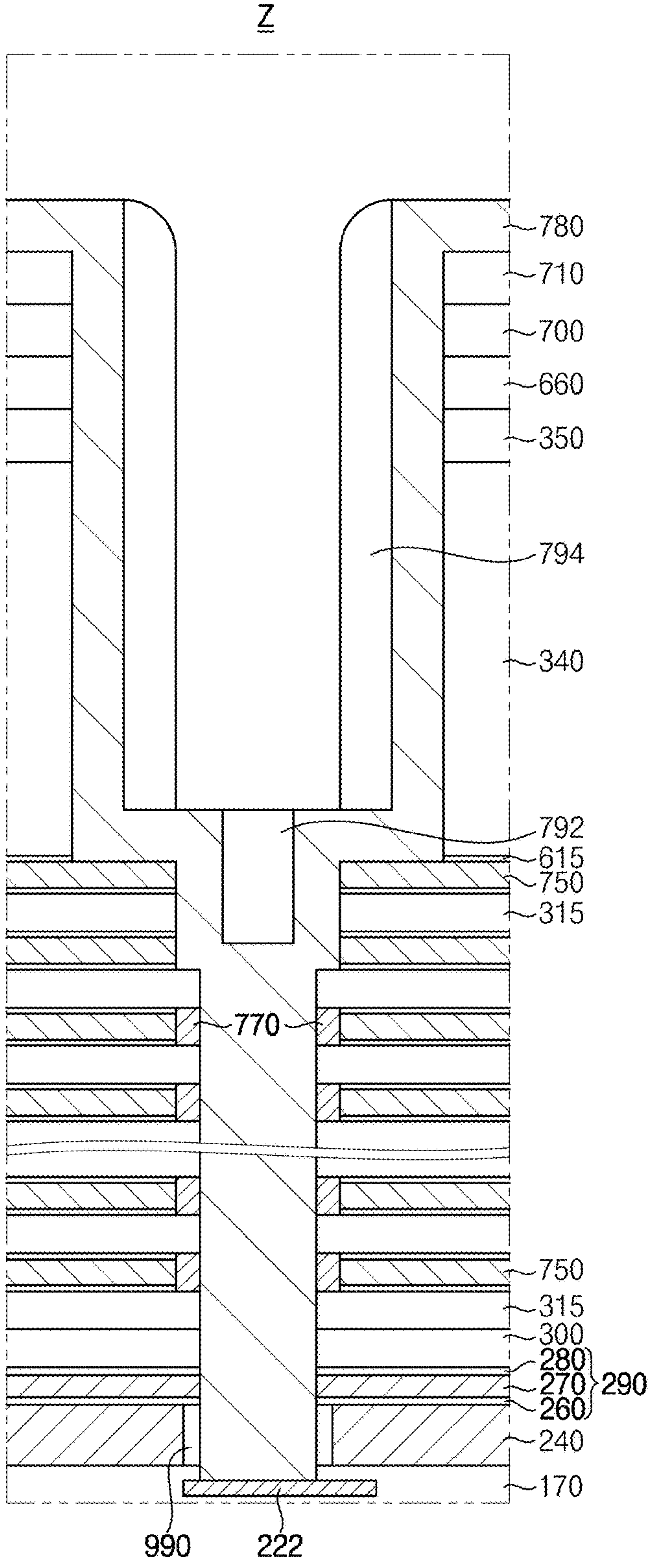
Figure 38:
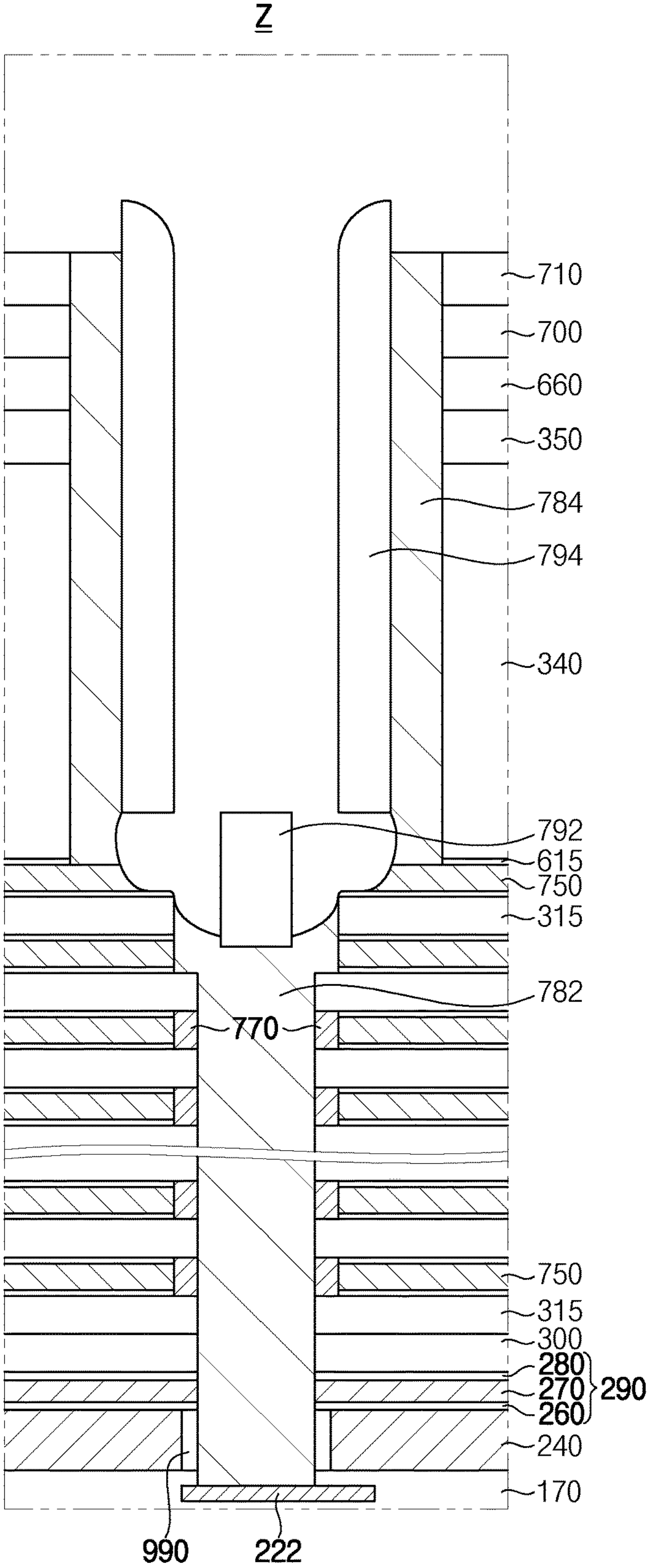

FIGS. 36 to 38 are cross-sectional views illustrating a method of manufacturing a semiconductor device in accordance with example embodiments, which may correspond to FIG. 4. This method may include processes substantially the same as or similar to those illustrated with reference to FIGS. 7 to 32 and FIGS. 1 to 6, and thus repeated explanations thereof are omitted herein.

Referring to FIG. 36, processes substantially the same as or similar to those illustrated with reference to FIGS. 7 to 27 may be performed, and processes substantially the same as or similar to those illustrated with reference to FIG. 28 may be performed to form the upper contact plug layer 780.

However, unlike those illustrated with reference to FIG. 28, the upper contact plug layer 780 may not entirely fill the lower portion of the fourth hole 760, and thus a seventh recess of which a bottom is lower than the upper surface of the uppermost one of the gate electrodes 750 adjacent to the fourth hole 760 may be formed on the upper contact plug layer 780.

A spacer layer 790 may be formed on the upper contact plug layer 780.

Referring to FIG. 37, for example, a plasma etching process may be performed on the spacer layer 790 to remove a portion of the spacer layer 790 on a portion of the upper contact plug layer 780 on the upper surface of the seventh insulating interlayer 710 and a portion of the upper contact plug layer 780 on which the seventh recess is formed.

Thus, a second spacer 792 may be formed in the seventh recess, and a third spacer 794 may be formed on a sidewall of a portion of the upper contact plug layer 780 on the upper sidewall of the fourth hole 760.

Referring to FIG. 38, a central portion of the upper contact plug layer 780 not covered by the third spacer 794 may be removed by, e.g., a wet etching process, and thus the upper contact plug layer 780 may be divided into the first upper contact plug 782 and the second upper contact plug 784 spaced apart from each other in the first direction D1.

An upper surface of a central portion of the first upper contact plug 782 may be lower than upper surfaces of other portions of the first upper contact plug 782, and the second spacer 792 may be formed on the upper surface of the central portion of the first upper contact plug 782.

Referring to FIG. 35 again, processes substantially the same as or similar to those illustrated with reference to FIGS. 30 to 32 and FIGS. 1 to 6 may be performed to complete the fabrication of the semiconductor device.

Figure 39:
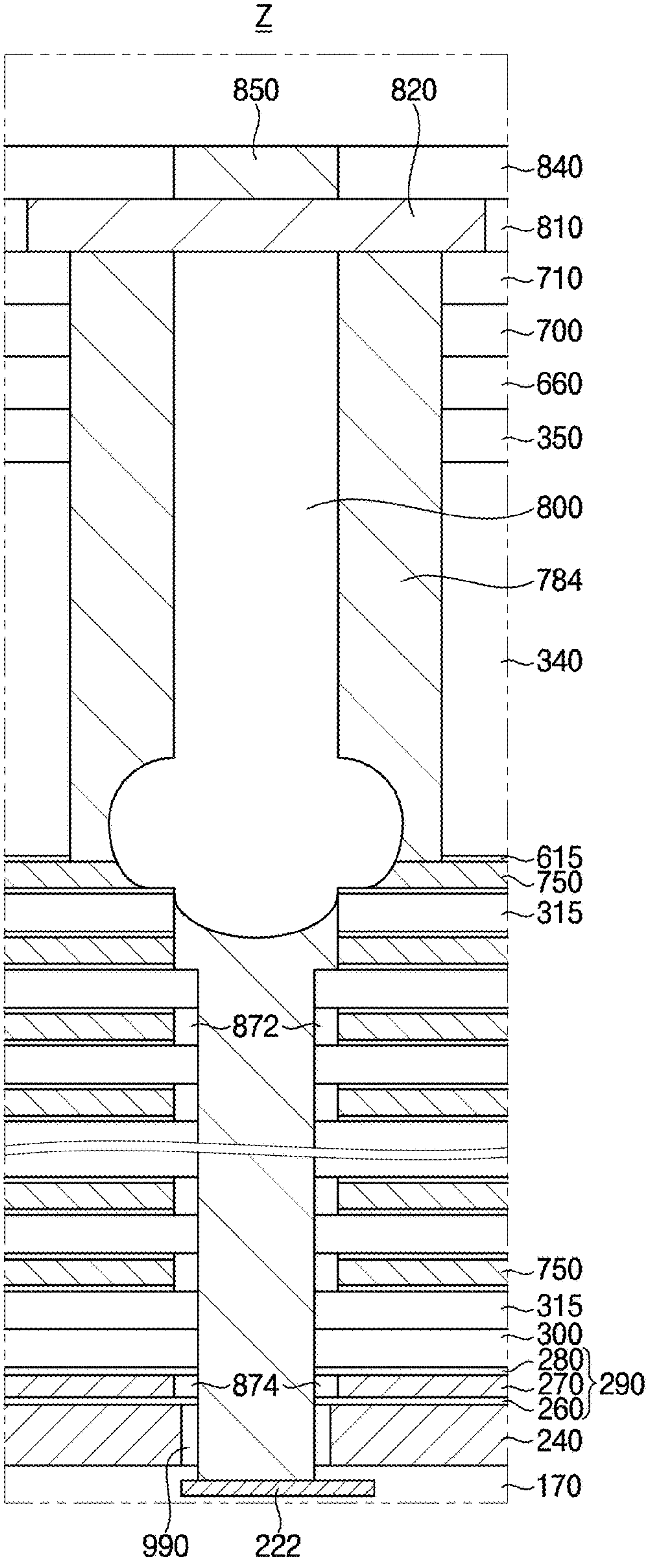
FIG. 39 is a cross-sectional view illustrating a semiconductor device in accordance with example embodiments.

FIG. 39 is a cross-sectional view illustrating a semiconductor device in accordance with example embodiments, which may correspond to FIG. 4. This semiconductor device may be substantially the same as or similar to that of FIGS. 1 to 6, except for some elements. Thus, repeated explanations are omitted herein.

Referring to FIG. 39, the semiconductor device may include a fifth insulation pattern 872 including an oxide, e.g., silicon oxide, instead of the third insulation pattern 770 including an insulating nitride, e.g., silicon nitride.

Additionally, the semiconductor device may further include a sixth insulation pattern 874 including an oxide, e.g., silicon oxide between the first upper contact plug 782 and the second sacrificial layer 270.

Figure 40:
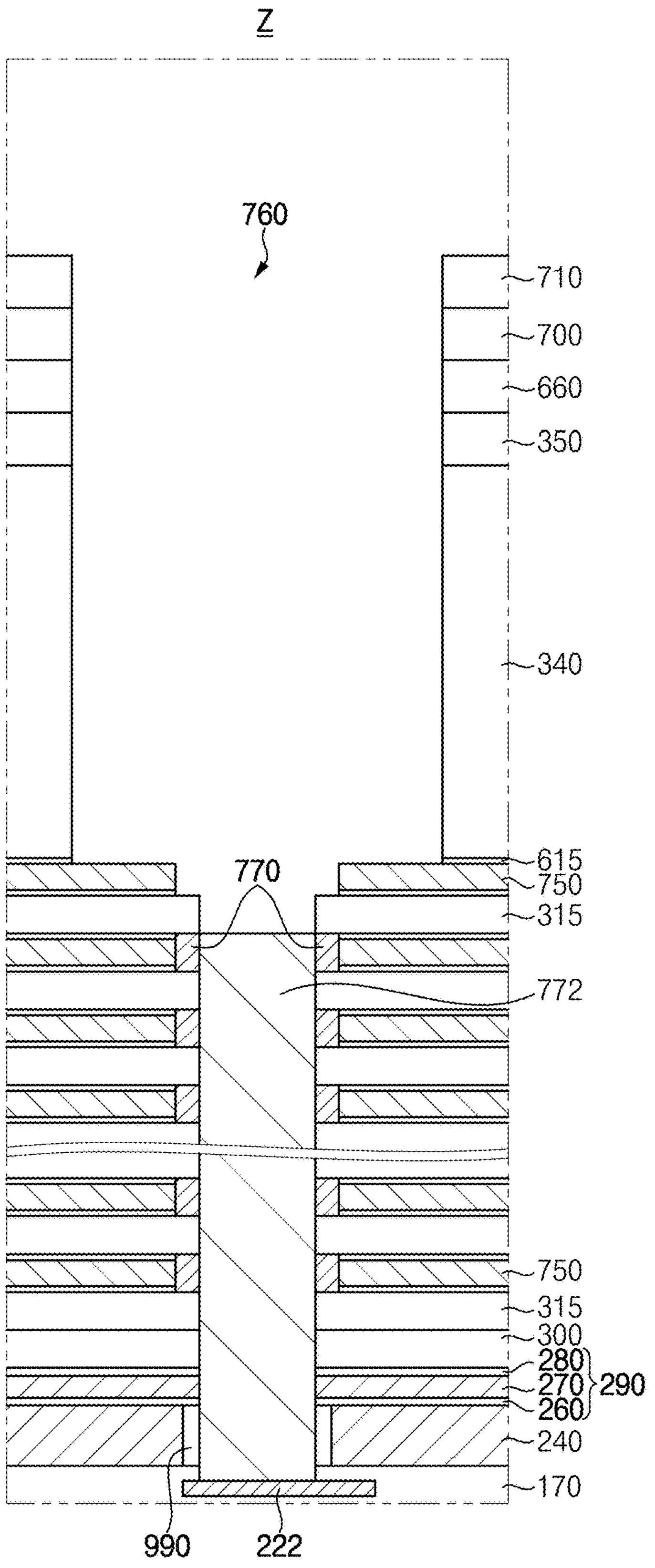
FIGS. 40 to 42 are cross-sectional views illustrating a method of manufacturing a semiconductor device in accordance with example embodiments.
Figure 41:
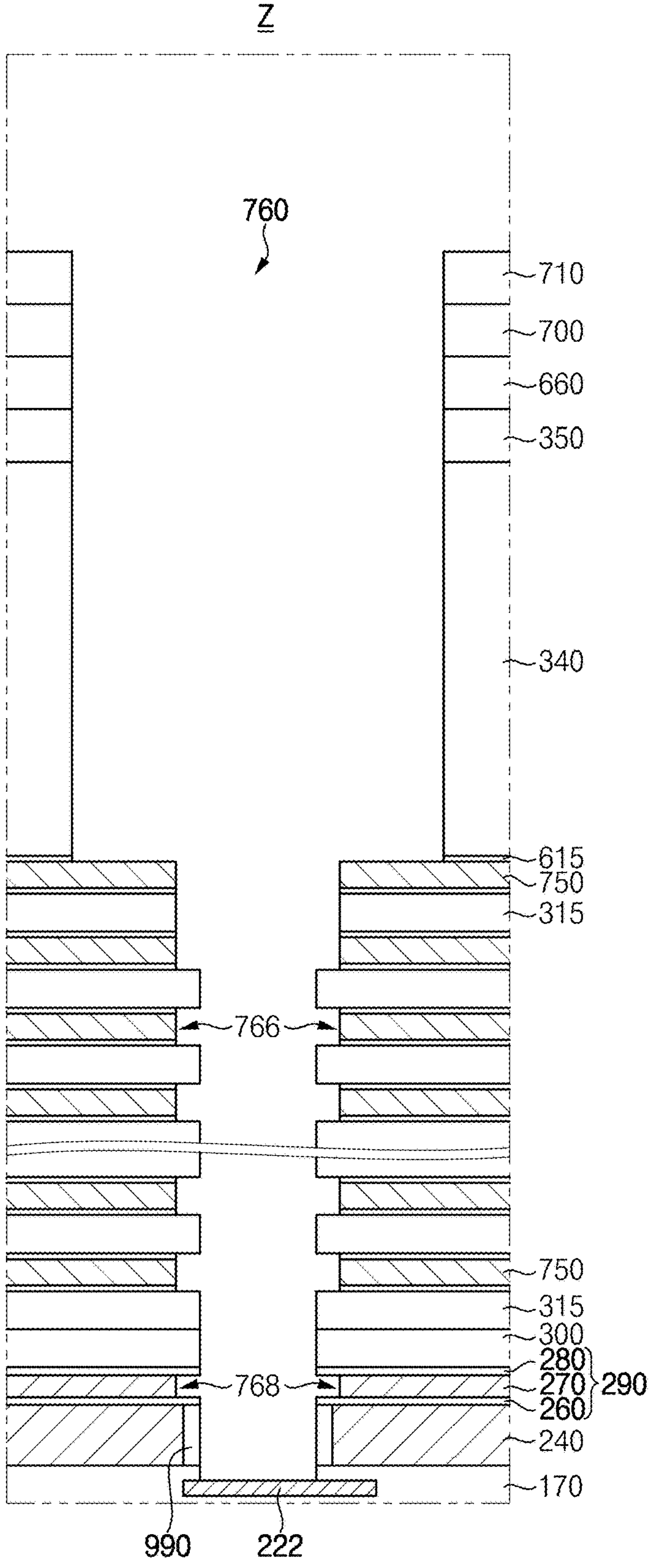
Figure 42:
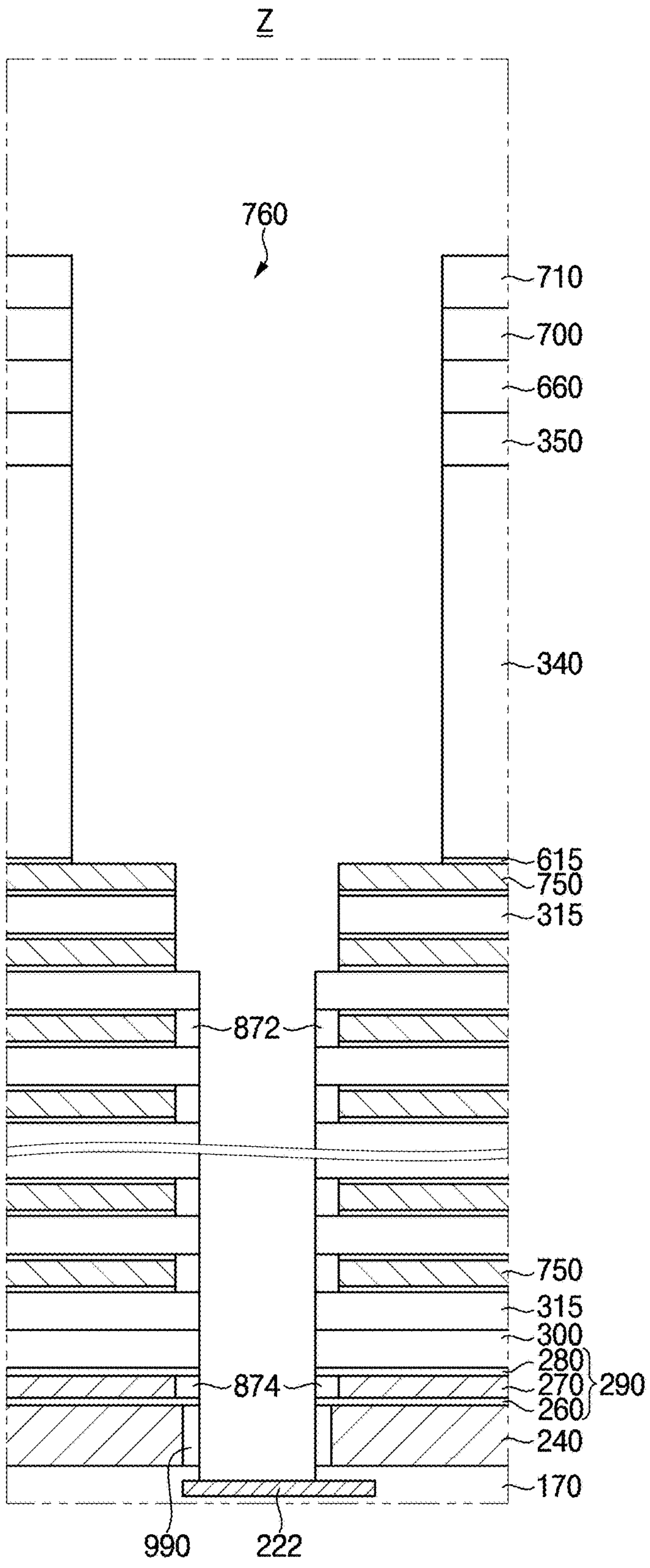

FIGS. 40 to 42 are cross-sectional views illustrating a method of manufacturing a semiconductor device in accordance with example embodiments, which may correspond to FIG. 4. This method may include processes substantially the same as or similar to those illustrated with reference to FIGS. 7 to 32 and FIGS. 1 to 6, and thus repeated explanations thereof are omitted herein.

Referring to FIG. 40, processes substantially the same as or similar to those illustrated with reference to FIGS. 7 to 26 may be performed, an eighth sacrificial layer may be formed on the sixth lower wiring 222, the gate electrode 750, the third insulation pattern 770, the upper sidewall of the fourth hole 760 and the seventh insulating interlayer 710 to fill the lower portion of the fourth hole 760, and a wet etching process may be performed on the eighth sacrificial layer.

The eighth sacrificial layer may include a nitride, e.g., silicon nitride, and during the wet etching process, a portion of the eighth sacrificial layer on the upper surface of the seventh insulating interlayer 710, the upper sidewall of the fourth hole 760, and the upper surface of the uppermost one of the gate electrodes 750 adjacent to the fourth hole 760. Additionally, the uppermost one of the third insulation patterns 770 and a portion of the eighth sacrificial layer adjacent thereto may also be removed.

Thus, an eighth sacrificial pattern 772 may be formed in the lower portion of the fourth hole 760. In an example embodiment, an upper surface of the eighth sacrificial pattern 772 may be substantially coplanar with a lower surface of an uppermost one of the second insulation patterns 315 adjacent to the fourth hole 760.

Referring to FIG. 41, a portion of the uppermost one of the second insulation patterns 315 not covered by the uppermost one of the gate electrodes 750 adjacent to the fourth hole 760 may be removed by, e.g., a wet etching process, and the eighth sacrificial pattern 772 may be removed by, e.g., a wet etching process.

Thus, the fourth hole 760 may be enlarged downwardly to expose the upper surface of the sixth lower wiring 222. During the wet etching process, the third insulation pattern 770 including a nitride, e.g., silicon nitride may also be removed, and thus an eighth recess 766 that may be connected to the fourth hole 760 and expose sidewalls of the gate electrode 750 and the second blocking pattern 615 may be formed. During the wet etching process, a lateral portion of the second sacrificial layer 270 including a nitride, e.g., silicon nitride may also be removed to form a ninth recess 768.

Referring to FIG. 42, a fifth insulation layer may be formed on the upper surface of the sixth lower wiring 222, the sidewall of the fourth hole 760 and the upper surface of the seventh insulating interlayer 710 to fill the eighth and ninth recesses 766 and 768, and a wet etching process may be performed on the fifth insulation layer to form fifth and sixth insulation patterns 872 and 874 in the eighth and ninth recesses 766 and 768, respectively.

Each of the fifth and sixth insulation patterns 872 and 874 may include an oxide, e.g., silicon oxide.

Referring to FIG. 39 again, processes substantially the same as or similar to those illustrated with reference to FIGS. 28 to 32 and FIGS. 1 to 6 may be performed to complete the fabrication of the semiconductor device.

Figure 43:
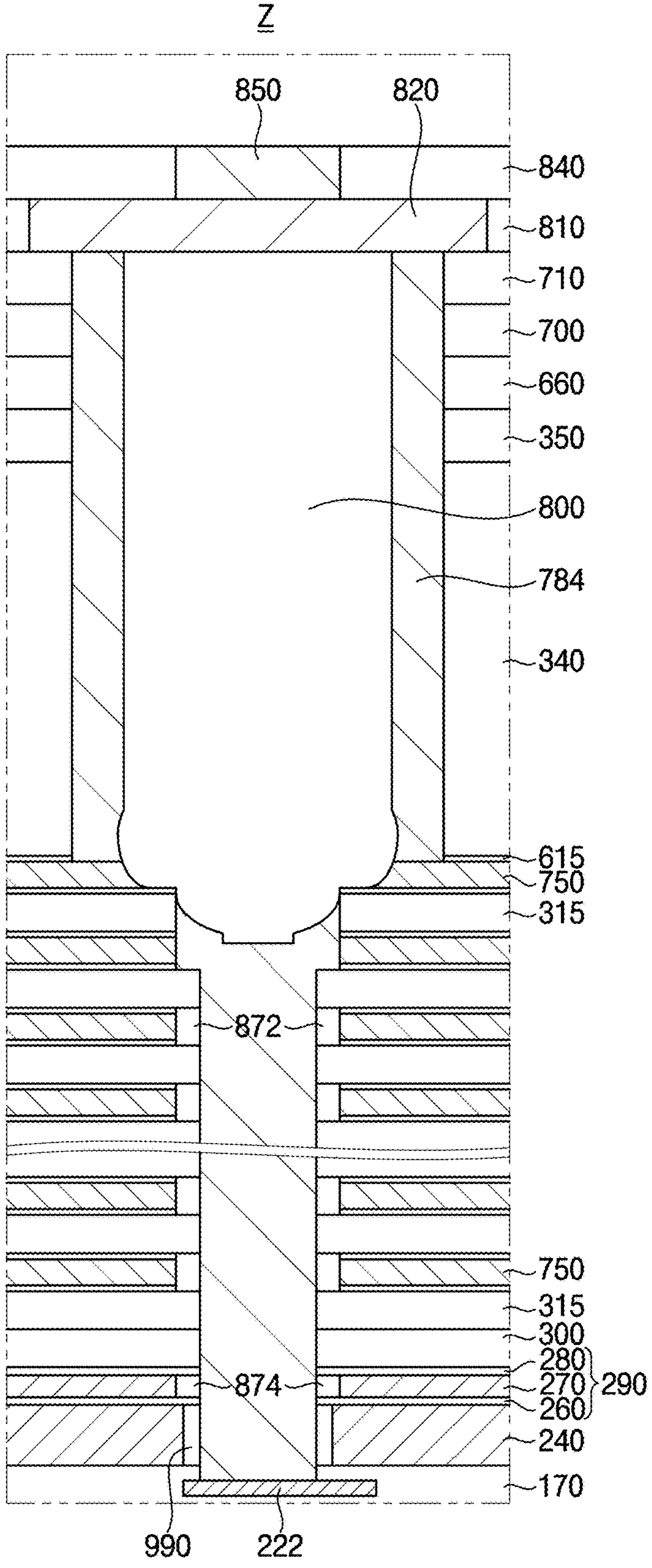
FIG. 43 is a cross-sectional view illustrating a semiconductor device in accordance with example embodiments.

FIG. 43 is a cross-sectional view illustrating a semiconductor device in accordance with example embodiments, which may correspond to FIG. 35. This semiconductor device may be substantially the same as or similar to that of FIG. 35, except for some elements. Thus, repeated explanations are omitted herein.

Referring to FIG. 43, the semiconductor device may include the fifth insulation pattern 872, instead of the third insulation pattern 770, and the semiconductor device may further include the sixth insulation pattern 874, as the semiconductor device of FIG. 39.

Figure 44:
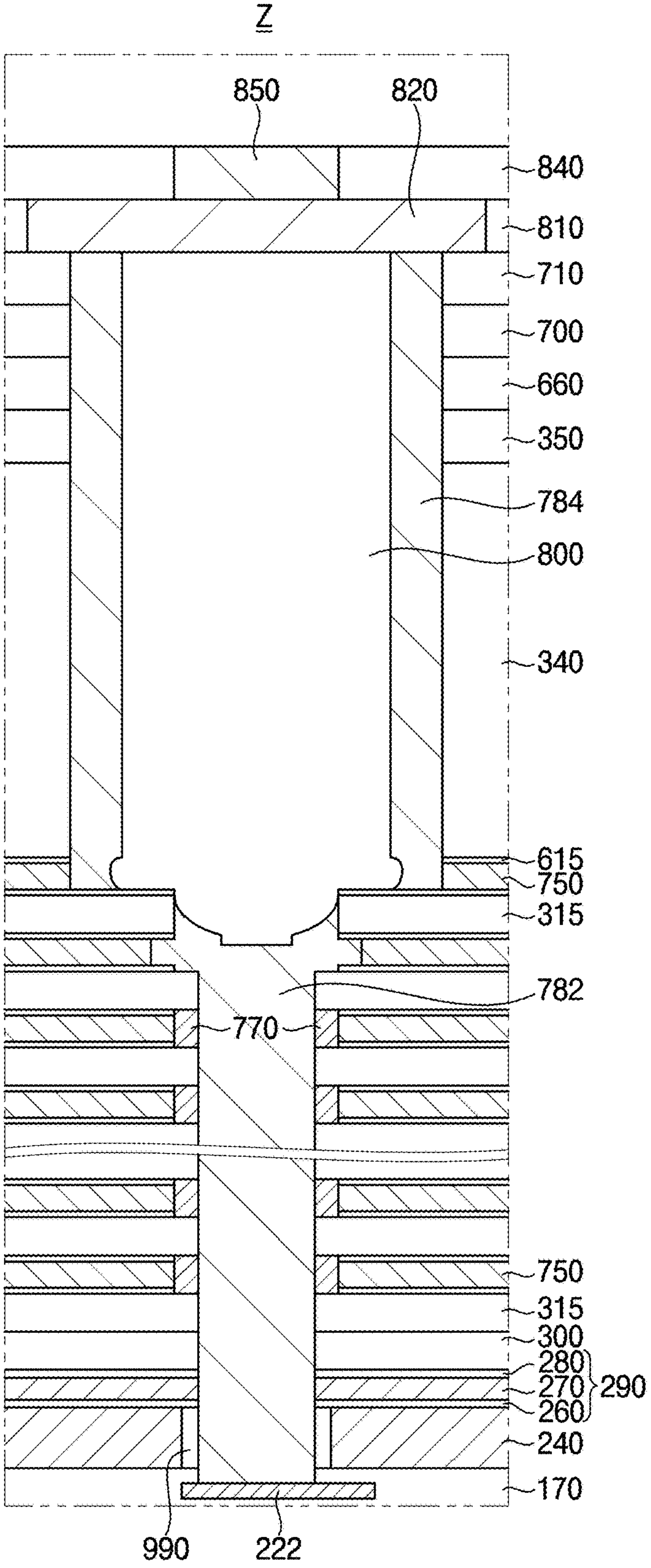
FIG. 44 is a cross-sectional view illustrating a semiconductor device in accordance with example embodiments.

FIG. 44 is a cross-sectional view illustrating a semiconductor device in accordance with example embodiments, which may correspond to FIG. 4. This semiconductor device may be substantially the same as or similar to that of FIG. 35, except for some elements. Thus, repeated explanations are omitted herein.

Referring to FIG. 44, an upper portion of the first upper contact plug 782 may protrude in the horizontal direction toward a lower one of the gate electrodes 750 in an uppermost one of the step layers, and thus may contact lower and upper surfaces of the second blocking pattern 615 on upper and lower surfaces of the lower one of the gate electrodes 750 in the uppermost one of the step layers.

Figure 45:
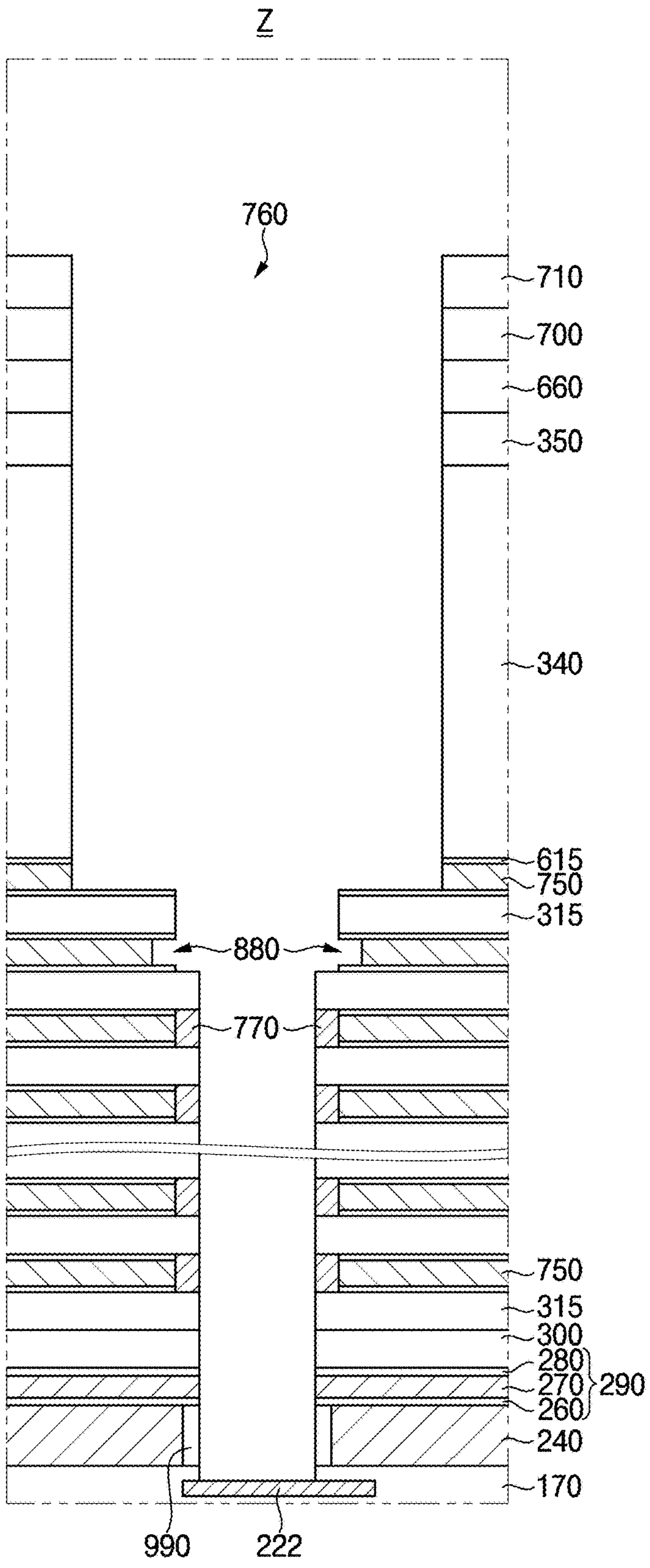
FIGS. 45 and 46 are cross-sectional views illustrating a method of manufacturing a semiconductor device in accordance with example embodiments.
Figure 46:
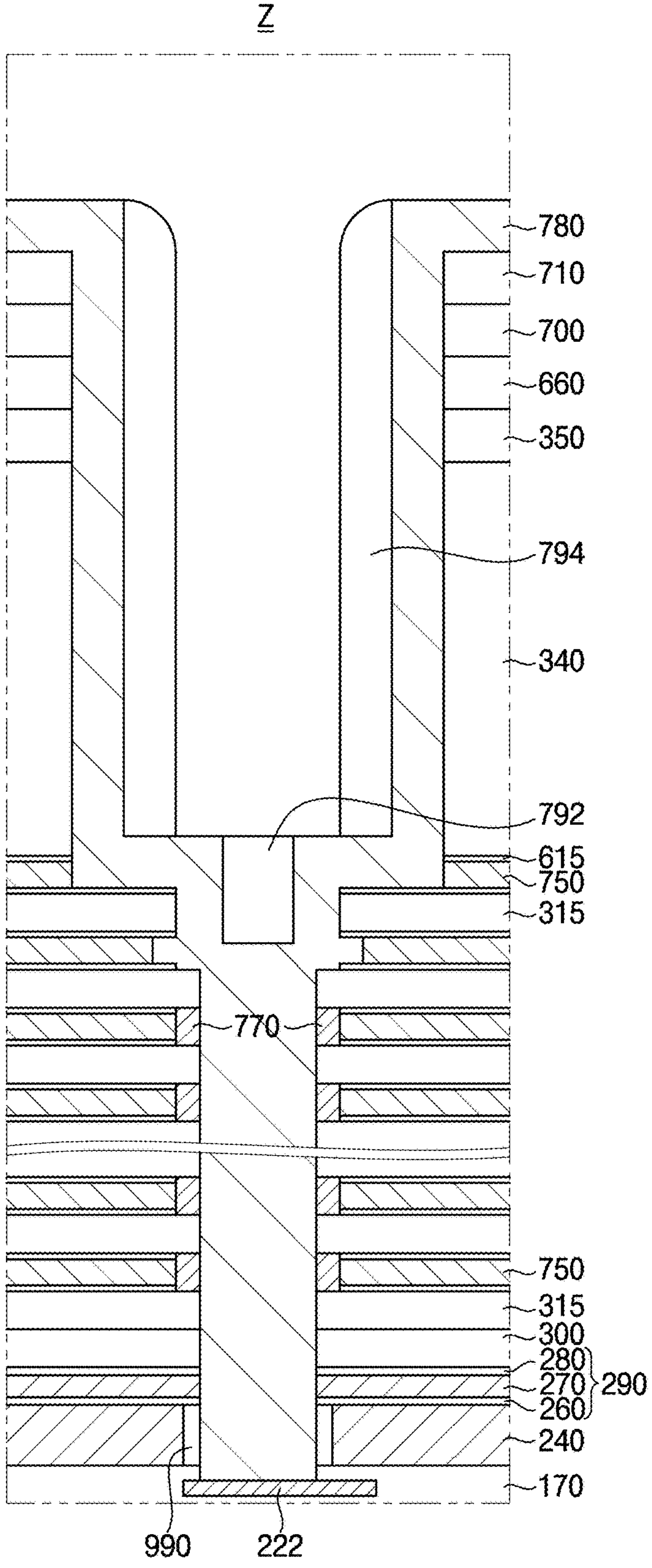

FIGS. 45 and 46 are cross-sectional views illustrating a method of manufacturing a semiconductor device in accordance with example embodiments, which may correspond to FIG. 4. This method may include processes substantially the same as or similar to those illustrated with reference to FIGS. 36 to 38 and FIG. 35, and thus repeated explanations thereof are omitted herein.

Referring to FIG. 45, processes substantially the same as or similar to those illustrated with reference to FIGS. 7 to 27 may be performed, and lateral portions of the gate electrodes 750 adjacent to the fourth hole 760 may be removed by, e.g., a wet etching process.

Thus, a portion of the uppermost one of the gate electrodes 750 exposed by the fourth hole 760 may be removed, and a lateral portion of a second one of the gate electrodes 750 from above may be removed to form a tenth recess 880.

Lateral portions of other ones of the gate electrodes 750 may be covered by the third insulation patterns 770, respectively, and thus may not be removed by the wet etching process.

Referring to FIG. 46, processes substantially the same as or similar to those illustrated with reference to FIGS. 36 and 37 may be performed to form the upper contact plug layer 780 and the second and third spacers 792 and 794.

Referring to FIG. 44 again, processes substantially the same as or similar to those illustrated with reference to FIG. 35 may be performed to complete the fabrication of the semiconductor device.

Figure 47:
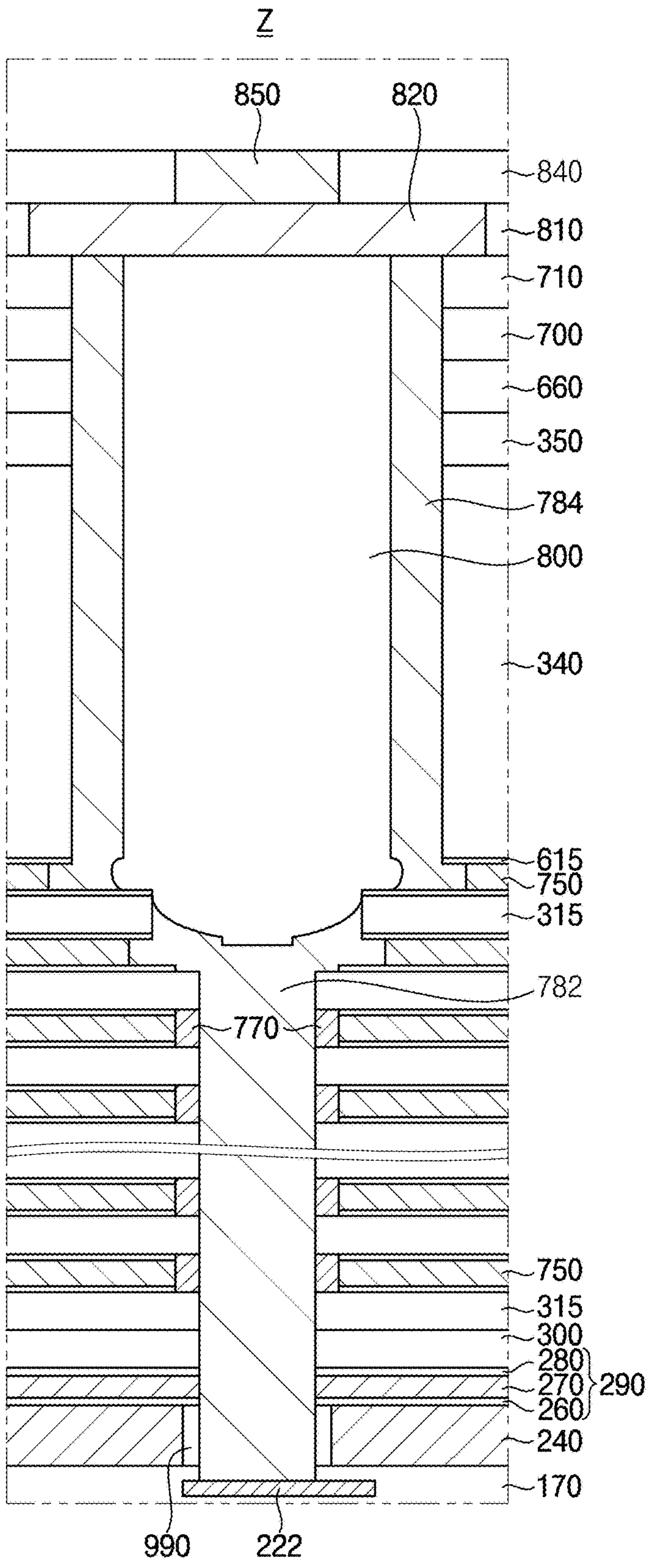
FIG. 47 is a cross-sectional view illustrating a semiconductor device in accordance with example embodiments.

FIG. 47 is a cross-sectional view illustrating a semiconductor device in accordance with example embodiments, which may correspond to FIG. 44. This semiconductor device may be substantially the same as or similar to that of FIG. 44, except for some elements. Thus, repeated explanations are omitted herein.

Referring to FIG. 47, a lower portion of the second upper contact plug 784 may protrude in the horizontal direction toward an upper one of the gate electrodes 750 in the uppermost one of the step layers, and thus may contact lower and upper surfaces of the second blocking pattern 615 on upper and lower surfaces of the upper one of the gate electrodes 750 in the uppermost one of the step layers.

Figure 48:
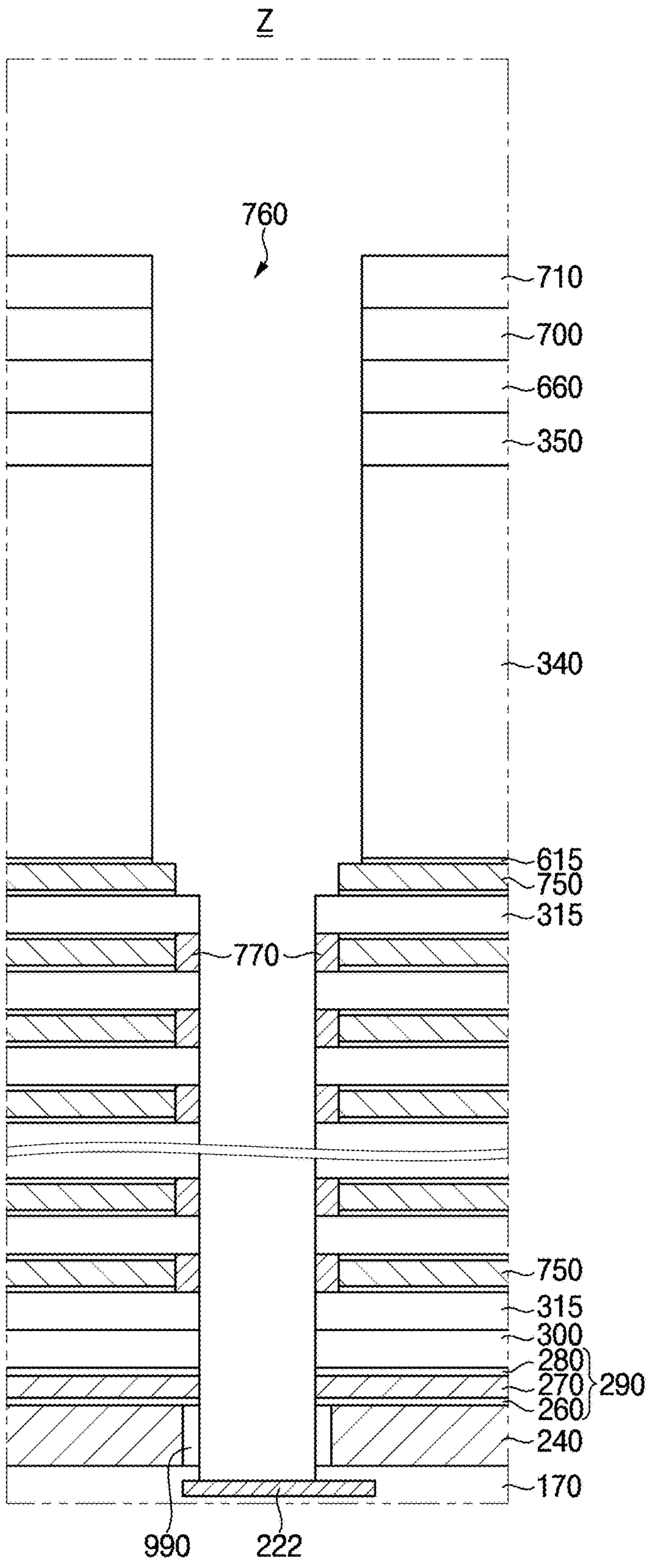
FIGS. 48 to 50 are cross-sectional views illustrating a method of manufacturing a semiconductor device in accordance with example embodiments.
Figure 49:
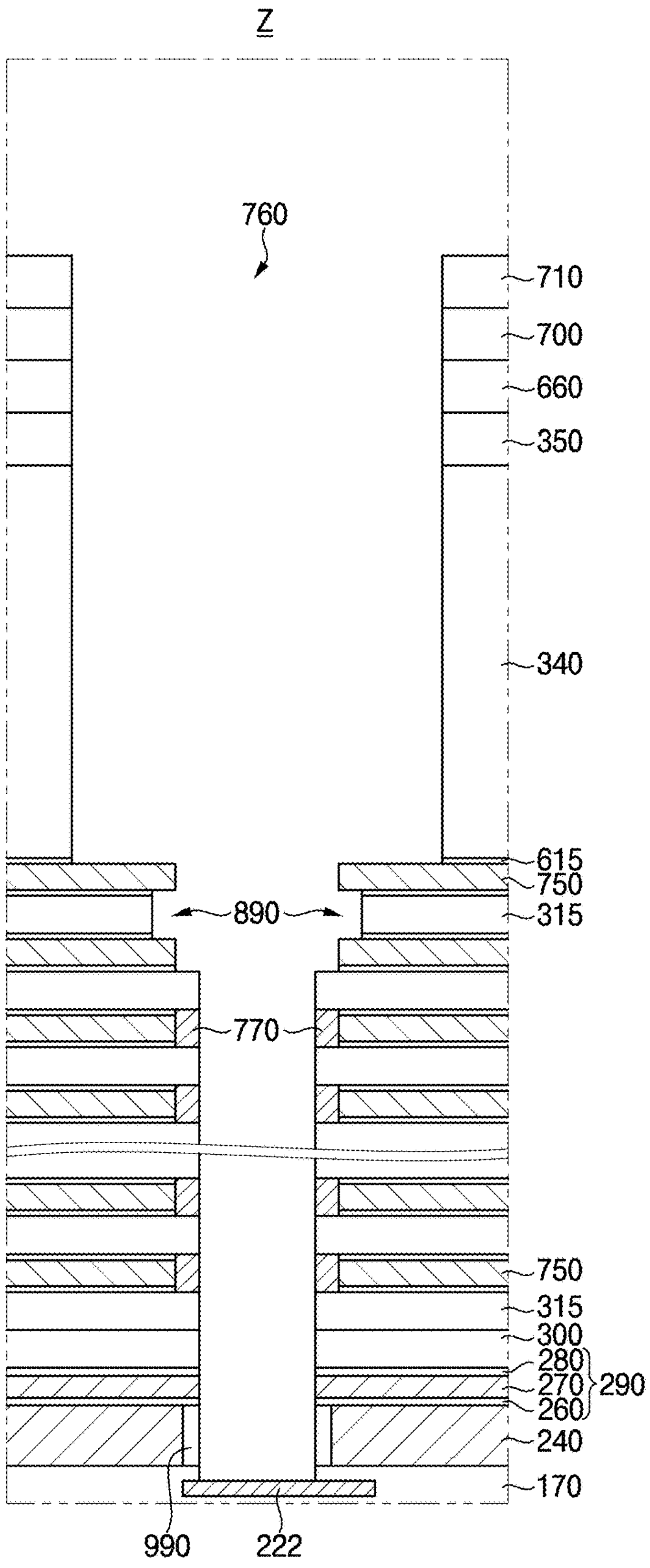
Figure 50:
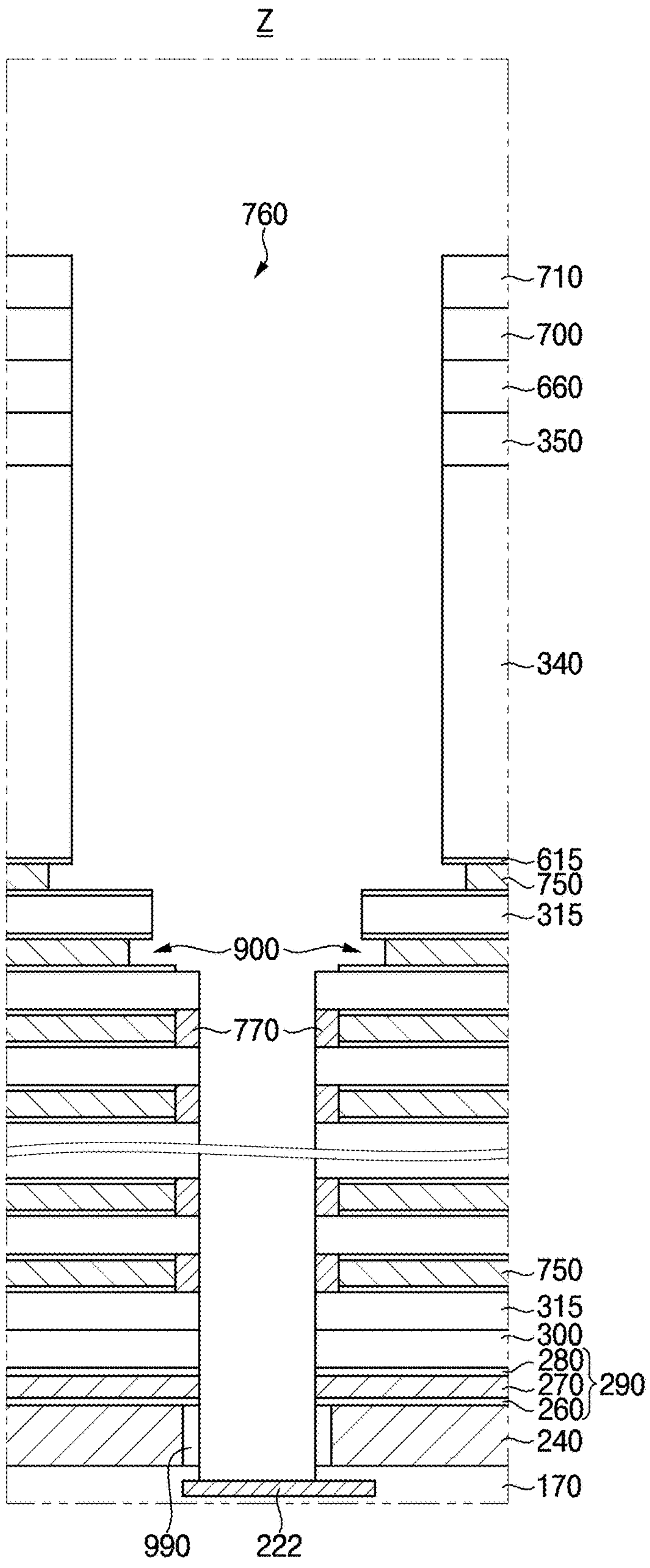

FIGS. 48 to 50 are cross-sectional views illustrating a method of manufacturing a semiconductor device in accordance with example embodiments, which may correspond to FIG. 4. This method may include processes substantially the same as or similar to those illustrated with reference to FIGS. 7 to 32 and FIGS. 1 to 6, and thus repeated explanations thereof are omitted herein.

Referring to FIG. 48, processes substantially the same as or similar to those illustrated with reference to FIGS. 7 to 25 may be performed, and a width in the horizontal direction of the fourth hole 760 may be enlarged by, e.g., a wet etching process to expose an upper surface of an uppermost one of the third insulation patterns 770.

During the wet etching process, portions of the third to seventh insulating interlayers 340, 350, 660, 700 and 710 adjacent to the fourth hole 760 and a portion of the second blocking pattern 615 thereunder may be removed.

The exposed uppermost one of the third insulation patterns 770 may be removed by, e.g., a plasma etching process.

Referring to FIG. 49, portions of the third to seventh insulating interlayers 340, 350, 660, 700 and 710 adjacent to the fourth hole 760 and a portion of the second blocking pattern 615 thereunder may be removed by, e.g., a wet etching process to enlarge a width in the horizontal direction of the fourth hole 760.

During the wet etching process, a lateral portion of an uppermost one of the second insulation patterns 315 adjacent to the fourth hole 760 and portions of the second blocking patterns 615 on lower and upper surfaces of the lateral portion of the uppermost one of the second insulation patterns 315 may also be removed to from an eleventh recess 890. Thus, an upper surface of a second one of the third insulation patterns 770 from above may be exposed.

The exposed second one of the third insulation patterns 770 may be removed by, e.g., a plasma etching process.

Referring to FIG. 50, the uppermost one of the gate electrodes 750 adjacent to the fourth hole 760 may be partially removed by, e.g., a wet etching process, and a lateral portion of a second one of the gate electrodes 750 from above may also be removed.

Referring to FIG. 47 again, processes substantially the same as or similar to those illustrated with reference to FIGS. 36 to 38 and FIG. 35 may be performed to complete the fabrication of the semiconductor device.

Figure 51:
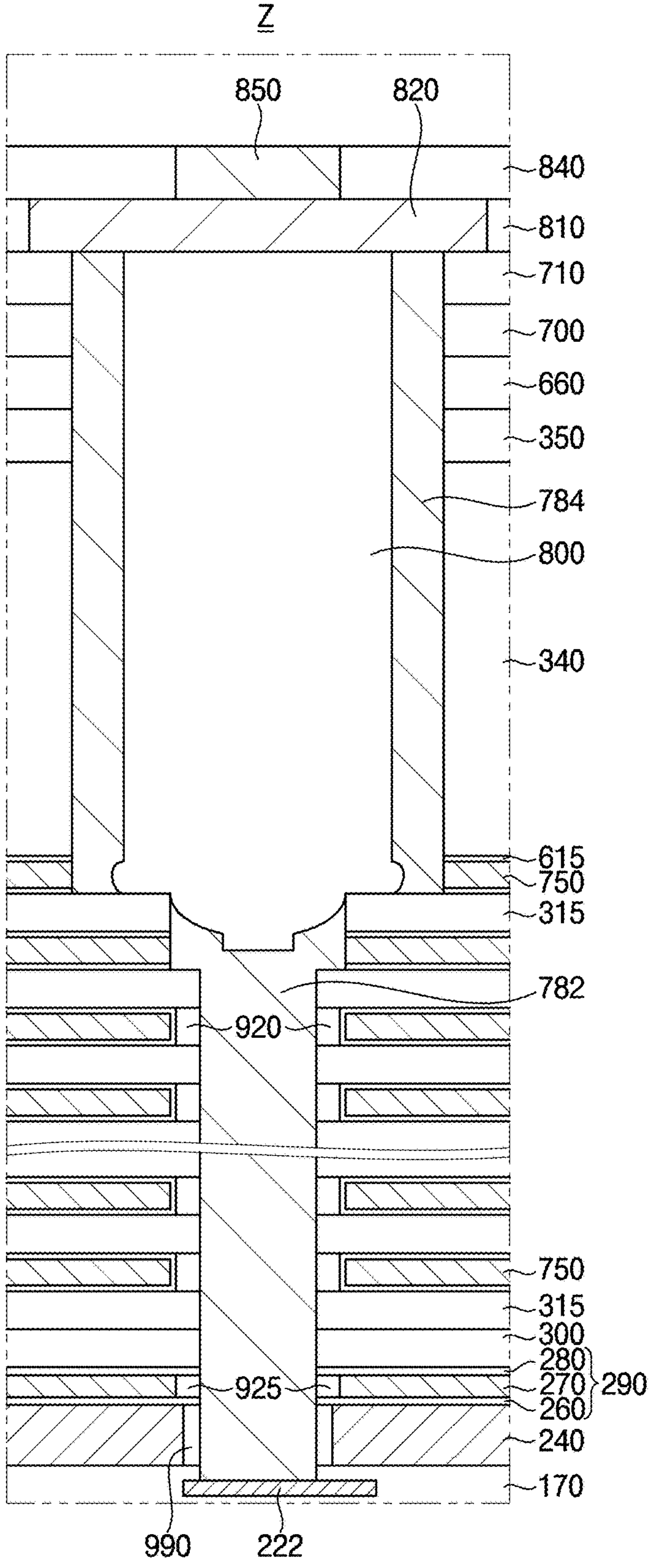
FIG. 51 is a cross-sectional view illustrating a semiconductor device in accordance with example embodiments.

FIG. 51 is a cross-sectional view illustrating a semiconductor device in accordance with example embodiments, which may correspond to FIG. 35. This semiconductor device may be substantially the same as or similar to that of FIG. 35, except for some elements. Thus, repeated explanations are omitted herein.

Referring to FIG. 51, the semiconductor device may include a seventh insulation pattern 920 including an oxide, e.g., silicon oxide, instead of the third insulation pattern 770 including an insulating nitride, e.g., silicon nitride.

The semiconductor device may further include an eighth insulation pattern 925 including an oxide, e.g., silicon oxide between the first upper contact plug 782 and the second sacrificial layer 270.

In example embodiments, the seventh insulation pattern 920 may contact a sidewall of the second blocking pattern 615 covering the upper and lower surfaces and the sidewall of the gate electrode 750.

FIGS. 52 to 57 are cross-sectional views illustrating a method of manufacturing a semiconductor device in accordance with example embodiments, which may correspond to FIG. 4. This method may include processes substantially the same as or similar to those illustrated with reference to FIGS. 7 to 32 and FIGS. 1 to 6, and thus repeated explanations thereof are omitted herein.

Figure 52:
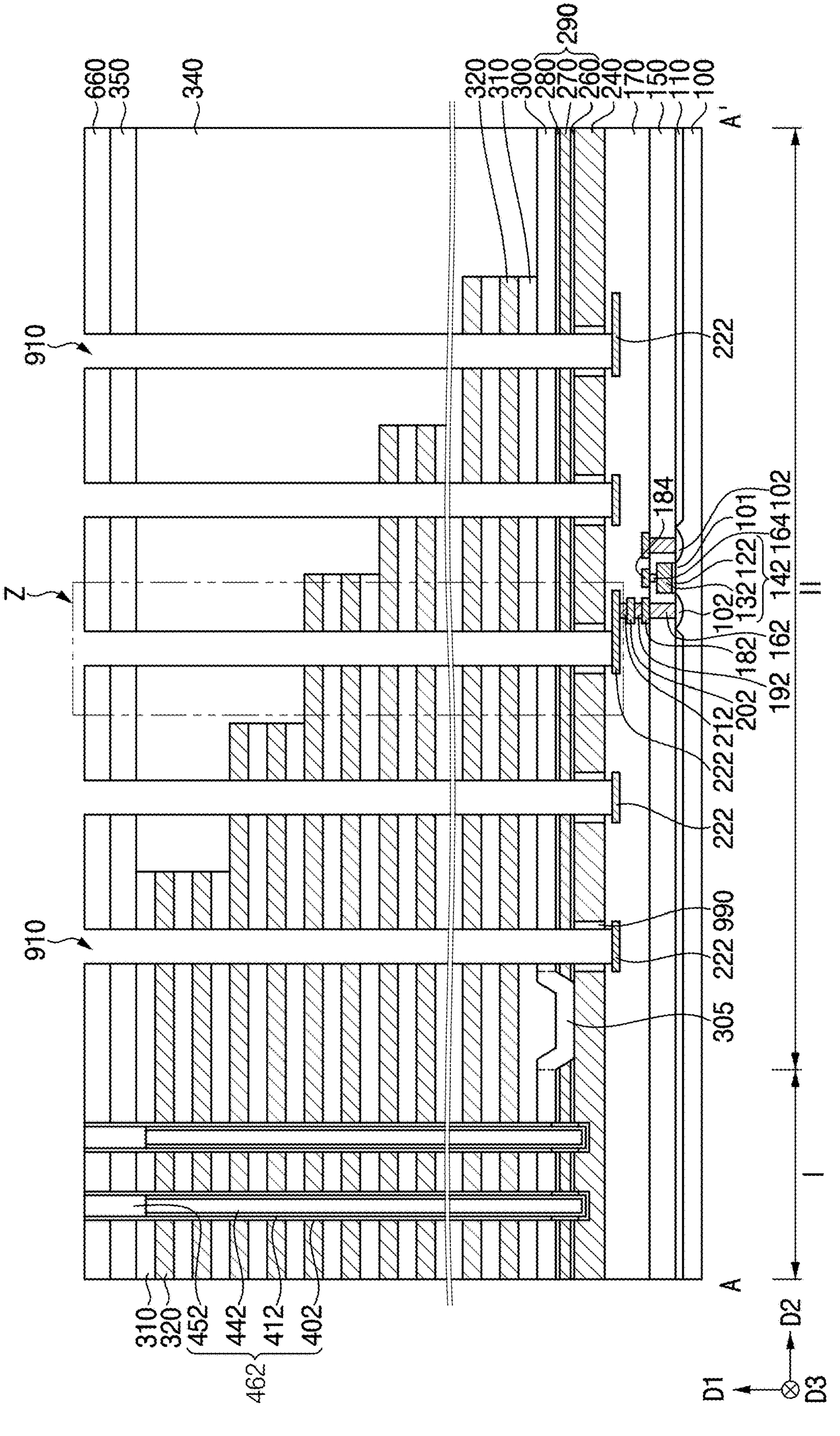
FIGS. 52 to 57 are cross-sectional views illustrating a method of manufacturing a semiconductor device in accordance with example embodiments.
Figure 53:
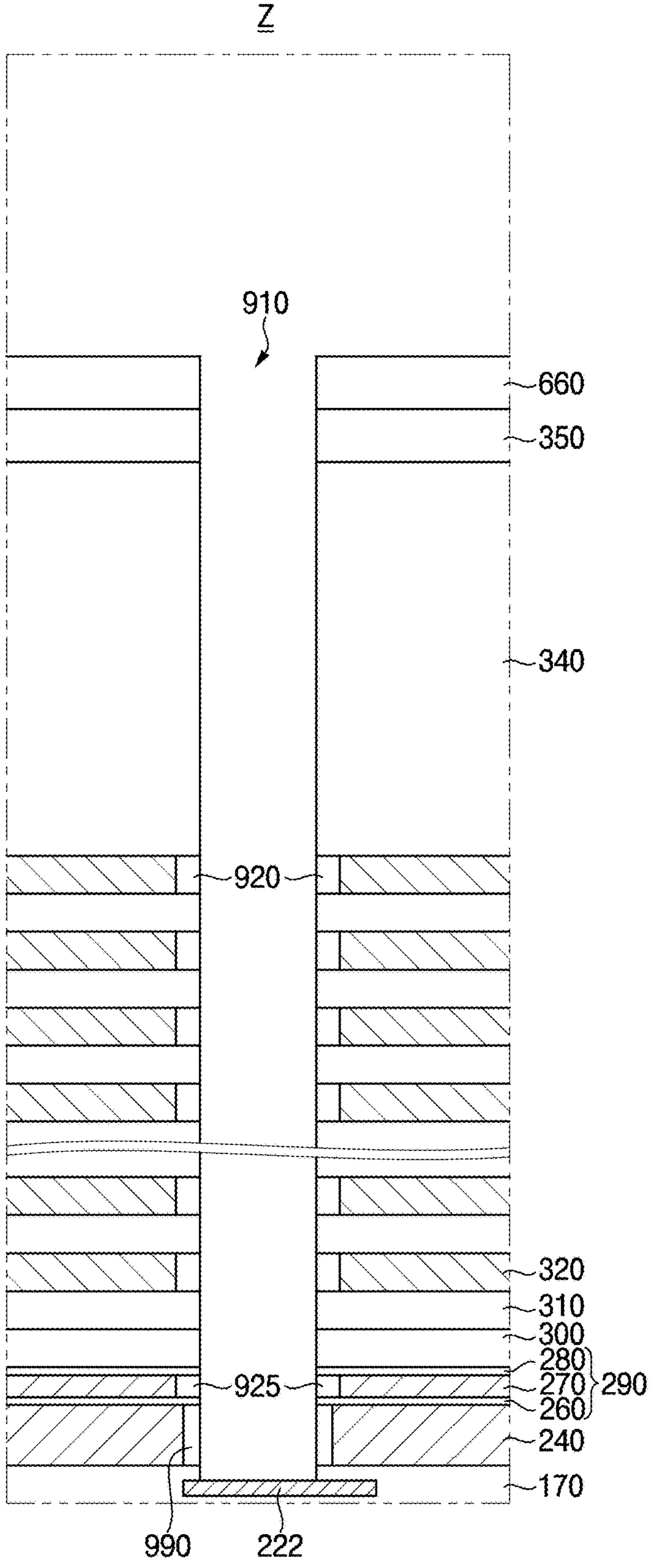

Referring to FIGS. 52 and 53, processes substantially the same as or similar to those illustrated with reference to FIGS. 7 to 14 may be performed, the fifth insulating interlayer 660 may be patterned to expose an upper surface of the seventh sacrificial pattern 630, the exposed seventh sacrificial pattern 630 may be removed to form a fifth hole 910, and a lower portion of the first insulation pattern 990 and an upper portion of the second insulating interlayer 170 may be removed to expose the upper surface of the sixth lower wiring 222.

A lateral portion of the fourth sacrificial layer 320 adjacent to the fifth hole 910 may be removed to form a twelfth recess, and a lateral portion of the second sacrificial layer 270 adjacent to the fifth hole 910 may also be removed to form a thirteenth recess. Seventh and eighth insulation patterns 920 and 925 may be formed in the twelfth and thirteenth recesses, respectively.

In an example embodiment, each of the seventh and eighth insulation patterns 920 and 925 may include an oxide, e.g., silicon oxide.

Figure 54:
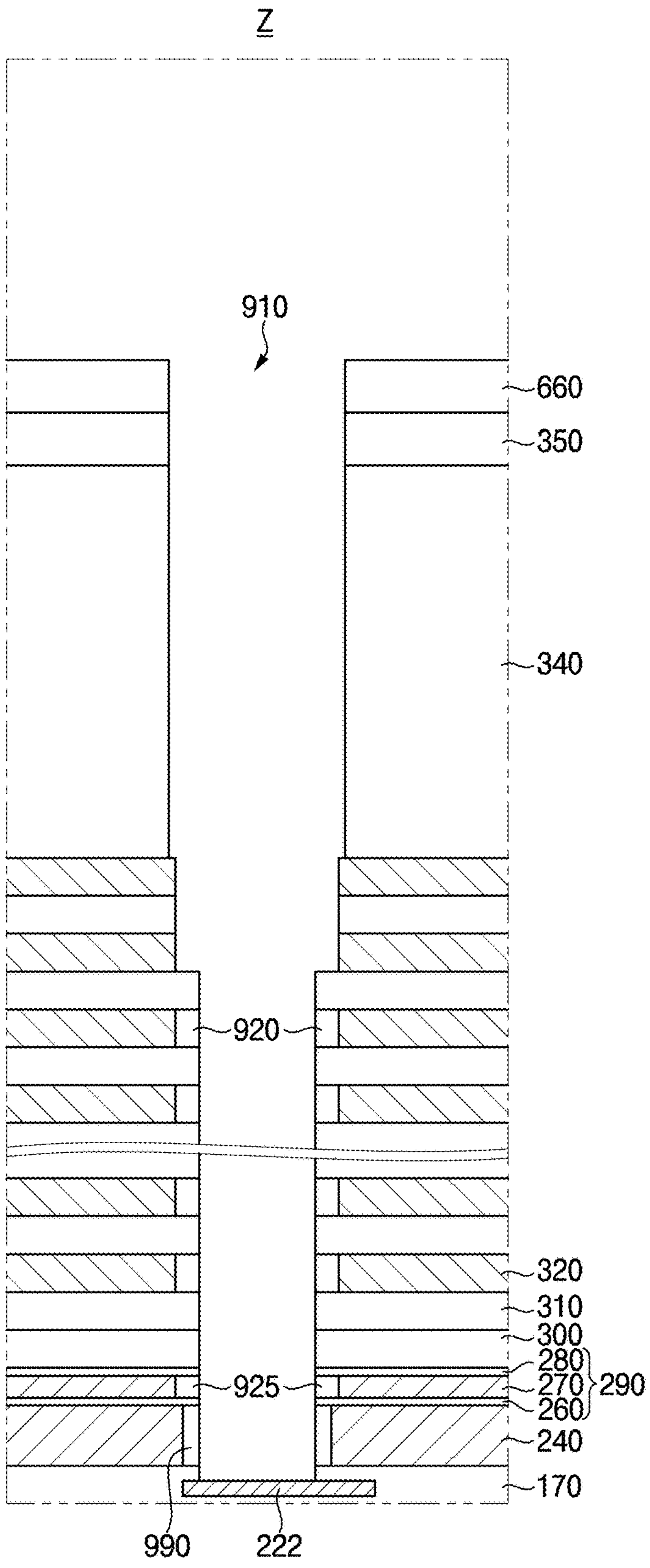

Referring to FIG. 54, portions of the third to fifth insulating interlayers 340, 350 and 660 adjacent to the fifth hole 910 may be removed by, e.g., a wet etching process to enlarge a width in the horizontal direction of the fifth hole 910 so that an upper surface of an uppermost one of the seventh insulation patterns 920 may be exposed, and two upper ones of the seventh insulation patterns 920 and a portion of the second insulation layer 310 therebetween may be removed.

Figure 55:
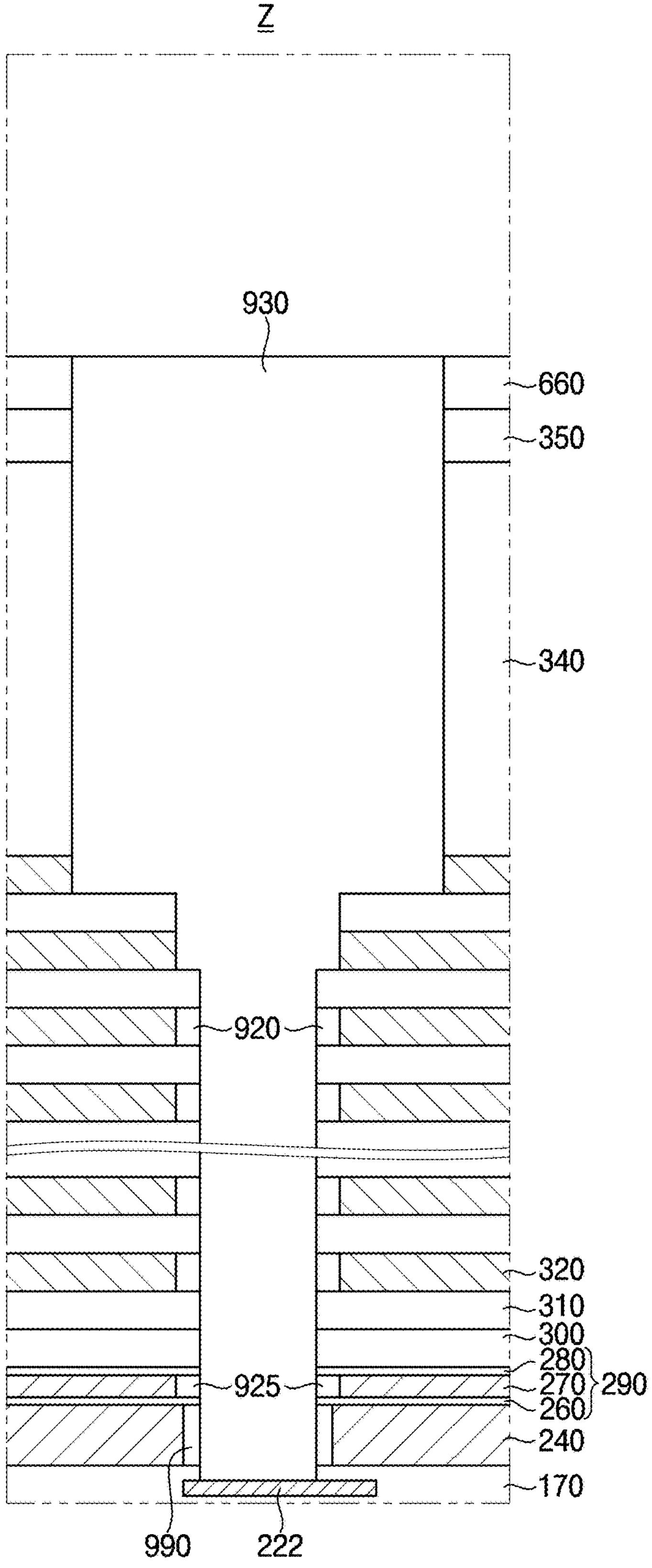

Referring to FIG. 55, portions of the third to fifth insulating interlayers 340, 350 and 660 adjacent to the fifth hole 910 may be removed by, e.g., a wet etching process to enlarge the width in the horizontal direction of the fifth hole 910 so that a portion of an upper surface of an uppermost one of the fourth sacrificial layers 320 adjacent to the fifth hole 910 may be exposed, and the exposed portion of the uppermost one of the fourth sacrificial layers 320 may be removed by, e.g., a plasma etching process.

A ninth sacrificial pattern 930 may be formed in the fifth hole 910. In an example embodiment, the ninth sacrificial pattern 930 may include, e.g., polysilicon.

Figure 56:
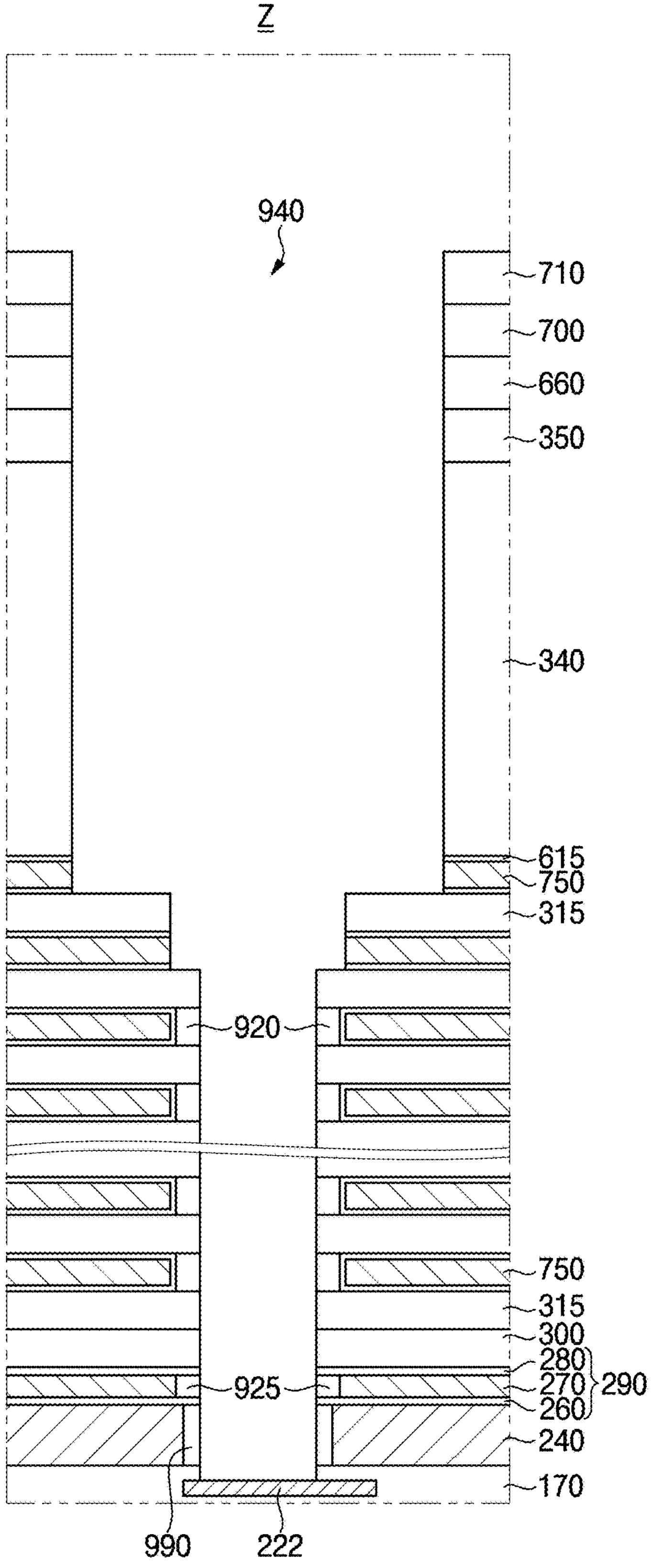

Referring to FIG. 56, processes substantially the same as or similar to those illustrated with reference to FIGS. 15 to 23 may be performed, the sixth and seventh insulating interlayers 700 and 710 may be patterned to expose the ninth sacrificial pattern 930, and the exposed ninth sacrificial pattern 930 may be removed to form a sixth hole 940 exposing the upper surface of the sixth lower wiring 222.

For example, a wet etching process may be performed on the third to seventh insulating interlayers 340, 350, 660, 700 and 710 adjacent to the sixth hole 940 to enlarge a width in the horizontal direction of the sixth hole 940, and a portion of the second blocking pattern 615 on a sidewall of the two upper ones of the gate electrodes 750 adjacent to the sixth hole 940 may also be removed.

Figure 57:
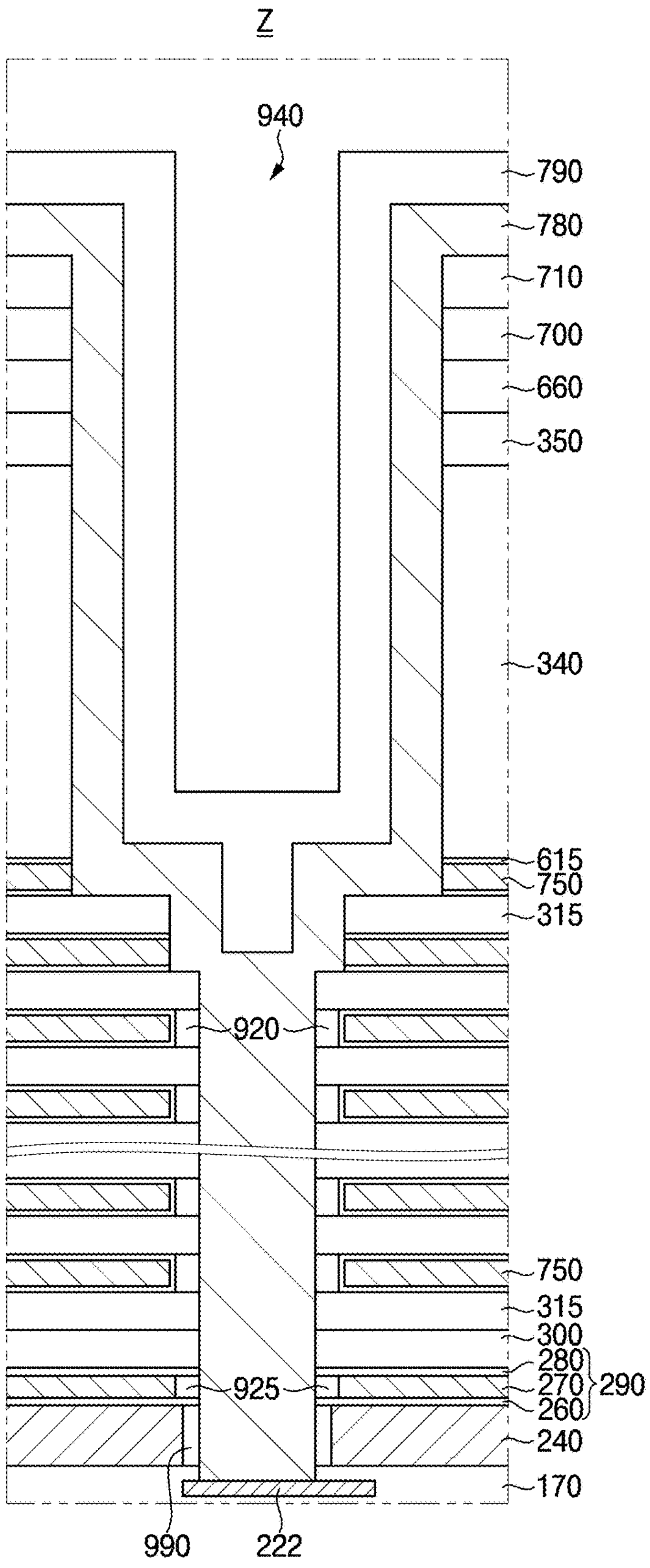

Referring to FIG. 57, processes substantially the same as or similar to those illustrated with reference to FIG. 36 may be performed to form the upper contact plug layer 780 and the spacer layer 790.

Referring to FIG. 51, processes substantially the same as or similar to those illustrated with reference to FIGS. 37 and 38 and FIG. 35 may be performed to complete the fabrication of the semiconductor device.

Figure 58:
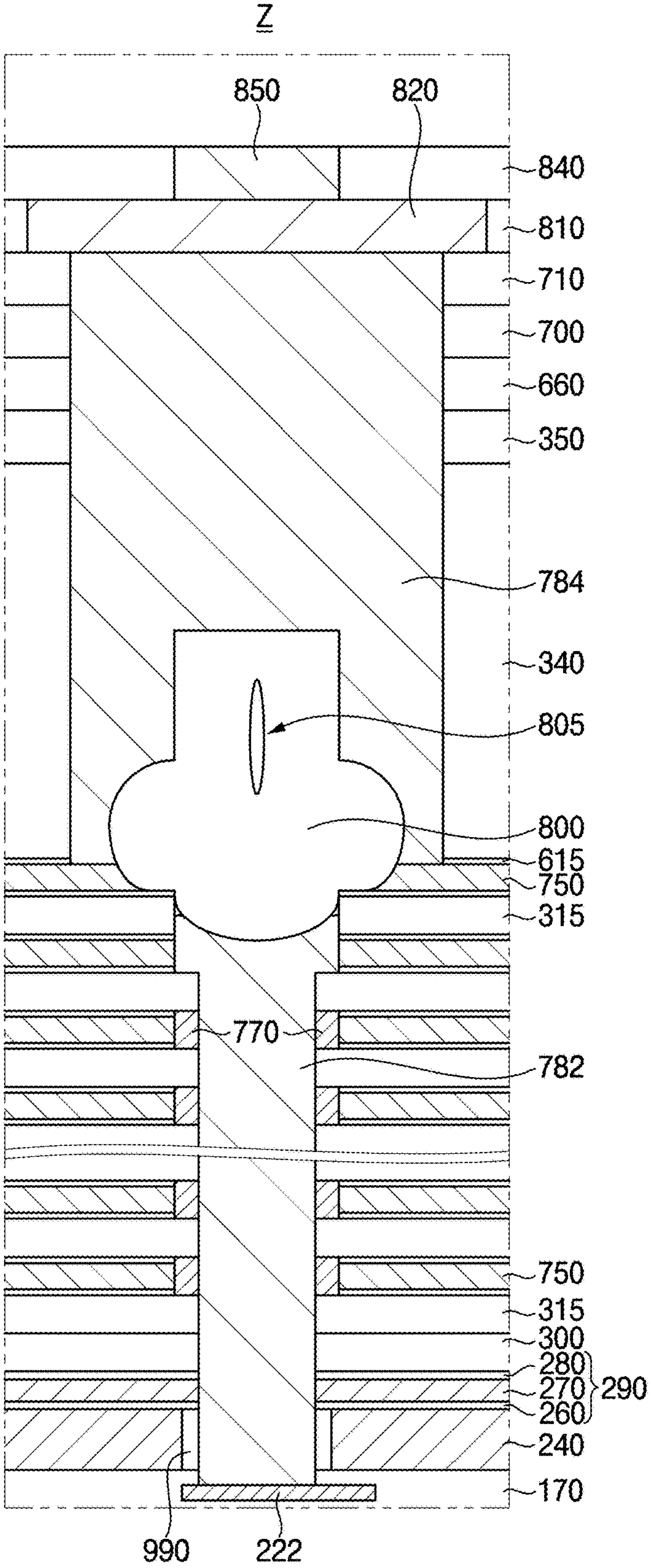
FIG. 58 is a cross-sectional view illustrating a semiconductor device in accordance with example embodiments.

FIG. 58 is a cross-sectional view illustrating a semiconductor device in accordance with example embodiments, which may correspond to FIG. 4. This semiconductor device may be substantially the same as or similar to that of FIGS. 1 to 6, except for some elements. Thus, repeated explanations are omitted herein.

Referring to FIG. 58, the second upper contact plug 784 may have a shape of a reversed cup.

For example, when compared to the second upper contact plug 784 shown in FIG. 4, which may have a shape of a hollow cylinder, the second upper contact plug 784 shown in FIG. 58 may include an upper portion having a pillar shape and a lower portion having a shape of a hollow cylinder.

The second upper contact plug 784 of FIG. 58 may be formed by performing processes substantially the same as or similar to those illustrated with reference to FIGS. 30 to 32 to form a fourth insulation layer filling the fourth hole 760, performing a planarization process on the fourth insulation layer until the upper surface of the seventh insulating interlayer 710 is exposed, performing an etch back process on an upper portion of the fourth insulation layer in the upper portion of the fourth hole 760 to remove the upper portion of the fourth insulation layer, and forming a conductive layer to fill a space that may be formed by removing the upper portion of the fourth insulation layer.

During the fourth insulation layer, a void 805 or seam may be formed in the fourth hole 760.

Figure 59:
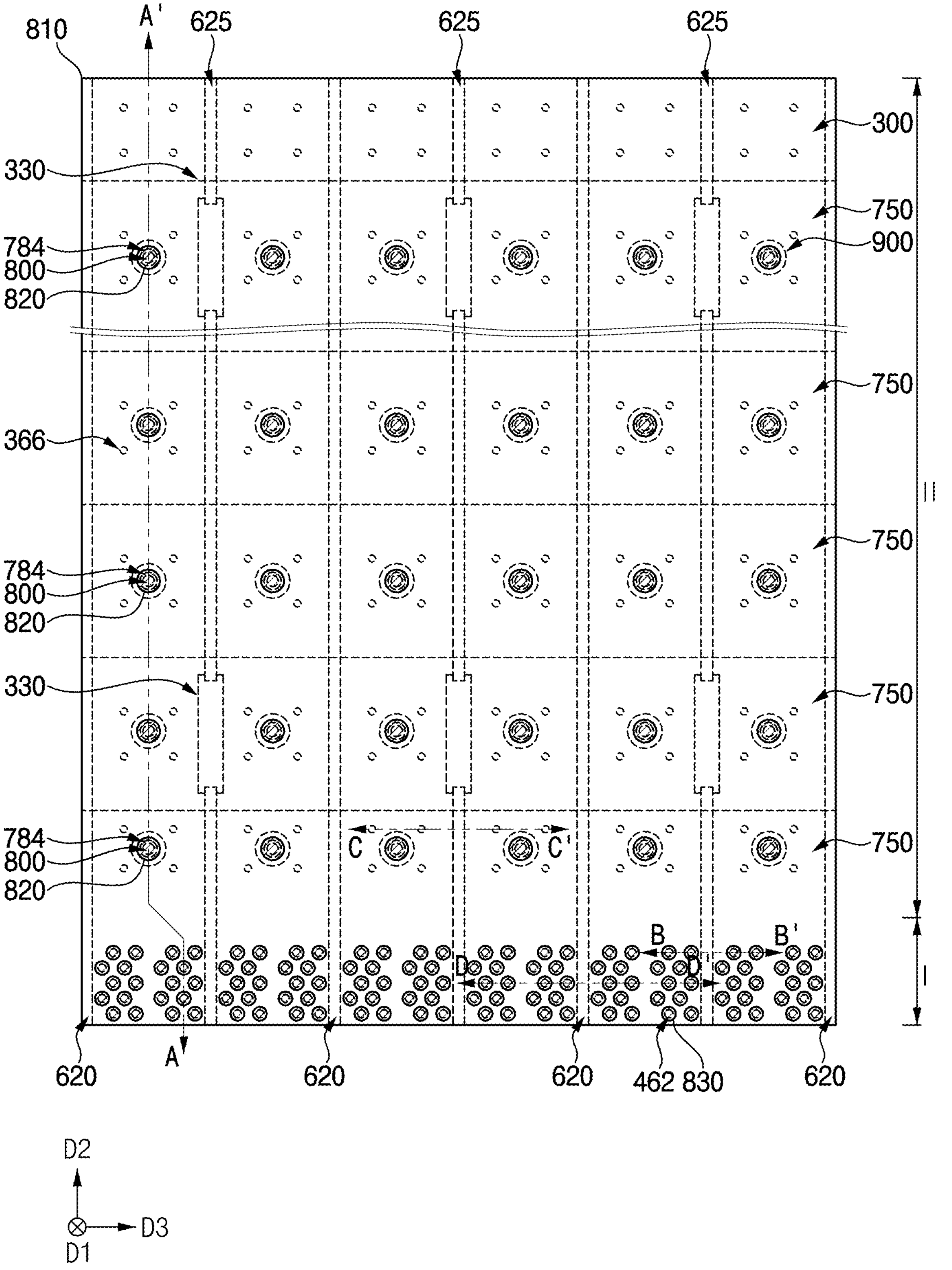
FIGS. 59 to 61 are a plan view and cross-sectional views illustrating a semiconductor device in accordance with example embodiments.
Figure 60:
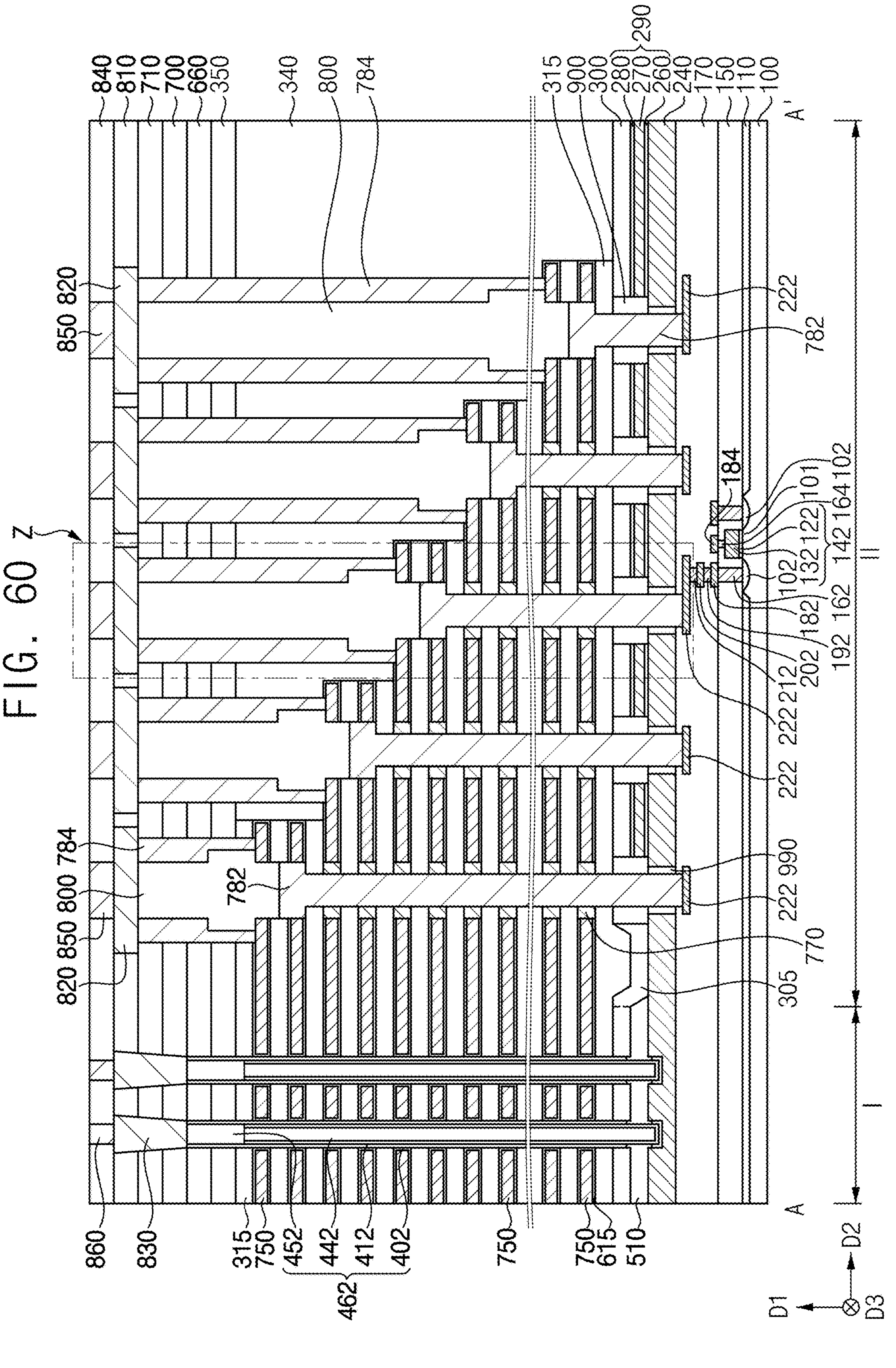
Figure 61:
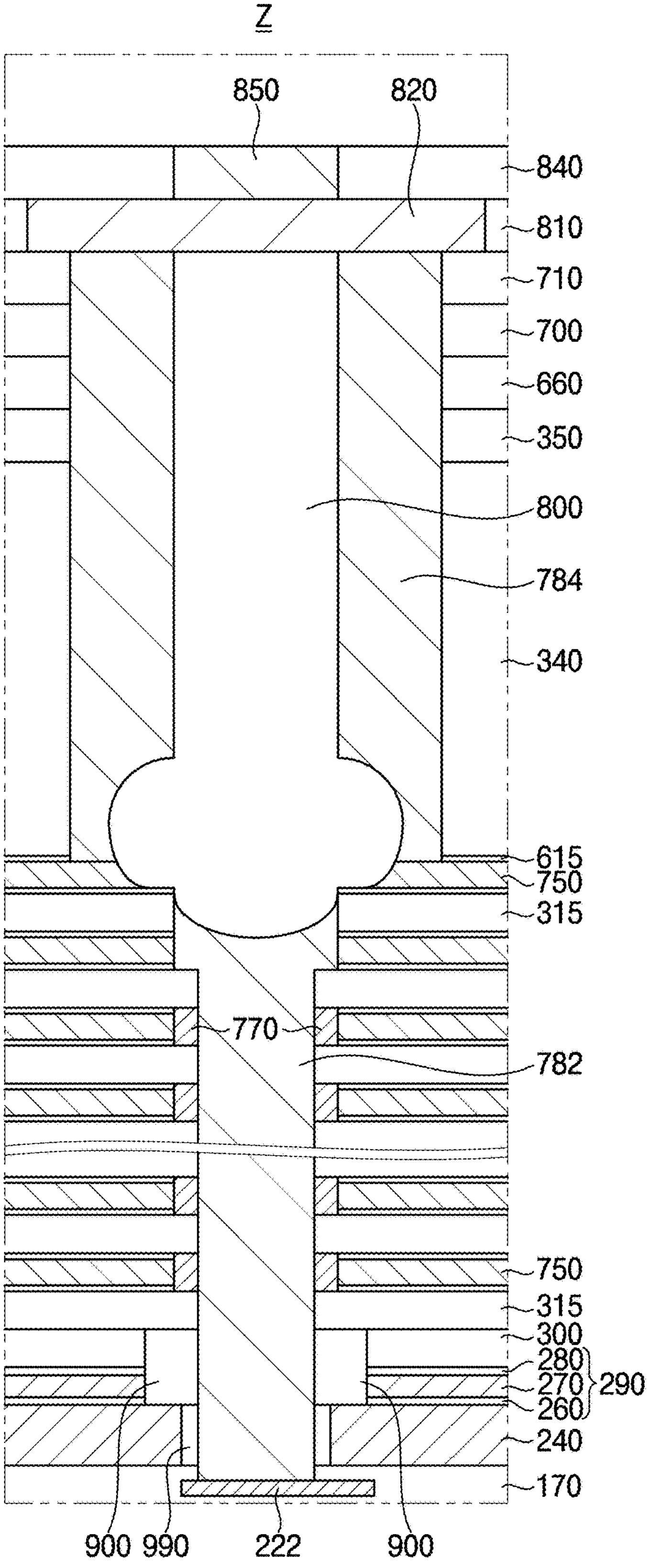

FIGS. 59 to 61 are a plan view and cross-sectional views illustrating a semiconductor device in accordance with example embodiments, which may correspond to FIGS. 2 to 4, respectively. This semiconductor device may be substantially the same as or similar to that of FIGS. 1 to 6, except for some elements. Thus, repeated explanations are omitted herein.

Referring to FIGS. 59 to 61, the semiconductor device may further include a ninth insulation pattern 900 contacting a lower portion of the first upper contact plug 782 and extend through the sacrificial layer structure 290 and the support layer 300.

The ninth insulation pattern 900 may include an oxide, e.g., silicon oxide, or an insulating nitride, e.g., silicon nitride.

The ninth insulation pattern 900 may be formed, after performing processes substantially the same as or similar to those illustrated with reference to FIGS. 7 and 8 to form the support layer 300 and the support pattern 305, to extend through the sacrificial layer structure 290 and the support layer 300. The ninth insulation pattern 900 may be formed at a region in which the first upper contact plug 782 is subsequently formed to have an area greater than that of the region.

Figure 62:
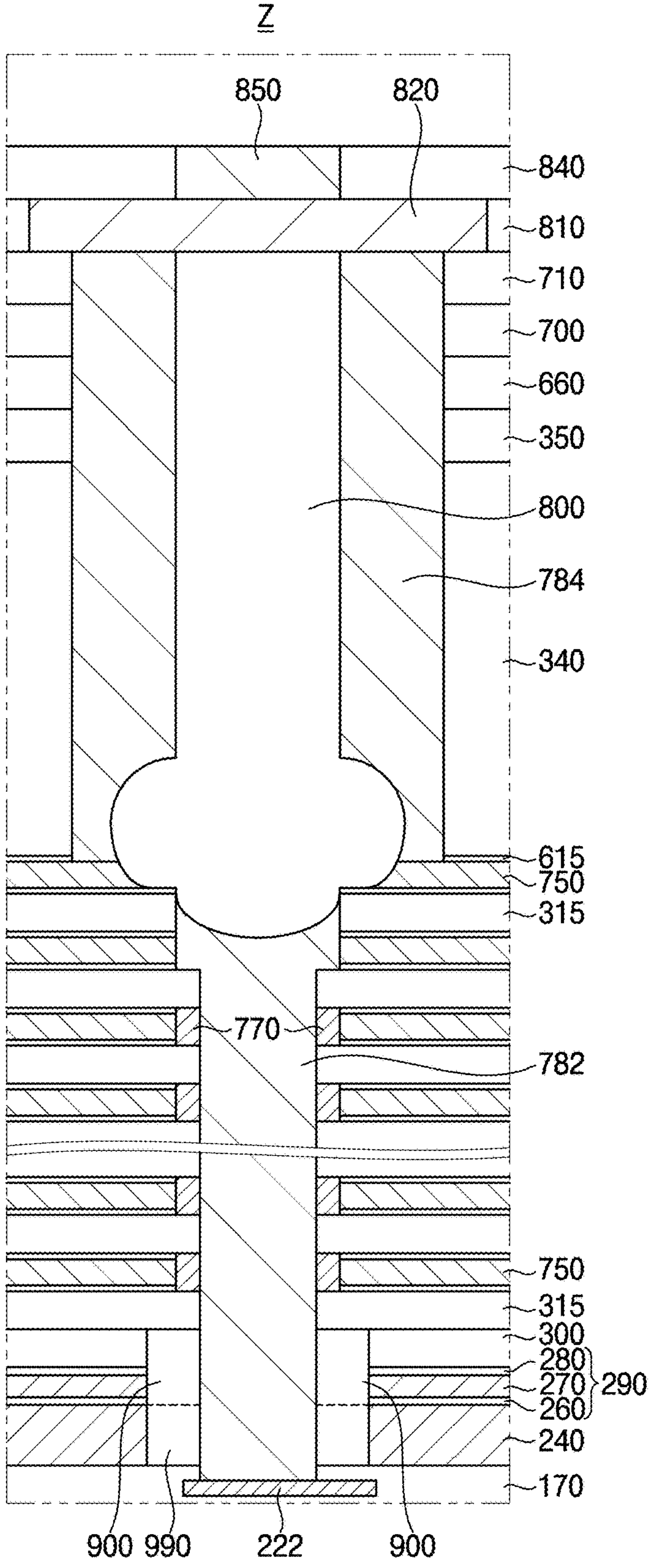
FIG. 62 is a cross-sectional view illustrating a semiconductor device in accordance with example embodiments.

FIG. 62 is a cross-sectional view illustrating a semiconductor device in accordance with example embodiments, which may correspond to FIG. 61. This semiconductor device may be substantially the same as or similar to that of FIGS. 59 to 61, except for some elements. Thus, repeated explanations are omitted herein.

Referring to FIG. 62, the ninth insulation pattern 900 may have a width in the horizontal direction substantially the same as a width in the horizontal direction of the first insulation pattern 990.

In example embodiments, the first and ninth insulation patterns 990 and 900 may be formed by the same process. For example, when the processes illustrated with reference to FIGS. 7 and 8 are performed, the sacrificial layer structure 290, the support layer 300 and the support pattern 305 may be formed on the CSP 240, a fourth opening may be formed through the sacrificial layer structure 290, the support layer 300 and the support pattern 305, a sixth insulation layer may be formed to fill the fourth opening, and the sixth insulation layer may be planarized until the upper surface of the support layer 300 is exposed to form the first and ninth insulation patterns 990 and 900 in the fourth opening.

The first insulation pattern 990 may contact a sidewall of the CSP 240, and the ninth insulation pattern 900 may contact sidewalls of the sacrificial layer structure 290 and the support layer 300. However, the first and ninth insulation patterns 990 and 900 may include substantially the same material, so as to have a single layer structure.

Figure 63:
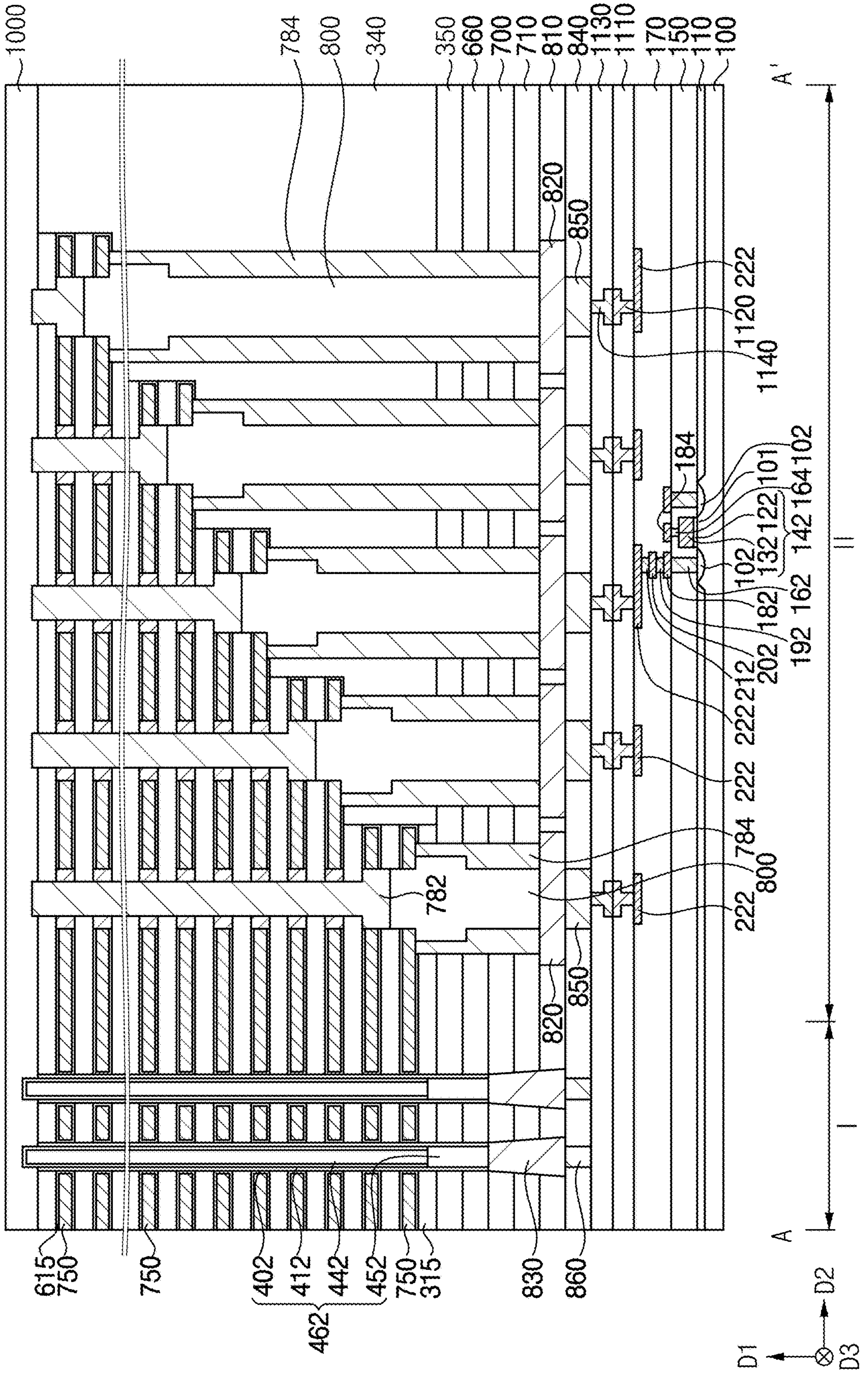
FIG. 63 is a cross-sectional view illustrating a semiconductor device in accordance with example embodiments.

FIG. 63 is a cross-sectional view illustrating a semiconductor device in accordance with example embodiments, which may correspond to FIG. 3.

This semiconductor device may be substantially the same as or similar to that of FIGS. 1 to 6, except that the semiconductor device is turned over and bonding structures are further formed.

Referring to FIG. 63, in example embodiments, tenth and eleventh insulating interlayers 1110 and 1130 may be sequentially stacked on the second insulating interlayer 170 and the sixth wiring 222. Additionally, first bonding patterns 1120 extending through the tenth insulating interlayer 1110 to contact the sixth lower wirings 222, respectively, and second bonding patterns 1140 extending through the eleventh insulating interlayer 1130 to contact the first bonding patterns 1120, respectively, may be formed.

Each of the first and second bonding patterns 1120 and 1140 may include a metal, e.g., copper.

An upper end of each of the first upper contact plug 782, the memory channel structure 462 and the support structure 366 may extend through a lower portion of an upper substrate 1000, and an upper surface and an upper sidewall of the channel 412 may not be covered by the charge storage structure 402 but may contact the upper substrate 1000. The upper substrate 100 may include a semiconductor material, e.g., silicon, germanium, silicon-germanium, etc., and may be doped with n-type or p-type impurities.

While example embodiments have been particularly shown and described, it will be understood by one of ordinary skill in the art that variations in form and detail may be made therein without departing from the spirit and scope of the claims.

What is claimed is:

1. A semiconductor device comprising:

a gate electrode structure including gate electrodes spaced apart from each other on a substrate in a first direction perpendicular to an upper surface of the substrate, each of the gate electrodes extending in a second direction parallel to the upper surface of the substrate, the gate electrode structure having a staircase shape and including step layers each of which includes two gate electrodes neighboring in the first direction among the gate electrodes, and steps of the step layers being disposed in the second direction;

a memory channel structure extending through the gate electrode structure on the substrate;

a first contact plug contacting an upper surface of a first gate electrode of the two gate electrodes included in a corresponding step layer of the step layers, the first gate electrode being disposed at an upper level between the two gate electrodes, and the first contact plug extending in the first direction; and a second contact plug contacting a sidewall of a second gate electrode of the two gate electrodes in the corresponding step layer of the step layers, the second gate electrode being disposed at a lower level between the two gate electrodes, the second contact plug extending in the first direction and being electrically insulated from ones of the gate electrodes disposed below the second gate electrode.

2. The semiconductor device of claim 1, wherein lengths in the second direction of the first and second gate electrodes are equal to each other.

3. The semiconductor device of claim 1, wherein the second contact plug includes a lower portion and an upper portion on the lower portion, the lower portion having a first width in the second direction, and the upper portion having a second width in the second direction that is greater than the first width, and wherein the upper portion of the second contact plug contacts the sidewall of the second gate electrode.

4. The semiconductor device of claim 1, wherein an upper surface of the second contact plug is concave.

5. The semiconductor device of claim 1, further comprising an insulation pattern between the second contact plug and each of the gate electrodes disposed below the second gate electrode.

6. The semiconductor device of claim 5, further comprising a blocking pattern covering lower and upper surfaces of each of the gate electrodes, wherein the insulation pattern contacts a sidewall of each of the gate electrodes disposed below the second gate electrode, and contacts a sidewall of the blocking pattern covering lower and upper surfaces of each of the gate electrodes disposed below the second gate electrode.

7. The semiconductor device of claim 5, further comprising a blocking pattern covering lower and upper surfaces of each of the gate electrodes, wherein the blocking pattern further covers a sidewall of each of the gate electrodes disposed below the second gate electrode, and wherein the insulation pattern contacts a sidewall of the blocking pattern.

8. The semiconductor device of claim 1, further comprising a blocking pattern covering lower and upper surfaces of each of the gate electrodes, wherein the second contact plug contacts a portion of lower and upper surfaces of the blocking pattern covering upper and lower surfaces, respectively, of the second gate electrode.

9. The semiconductor device of claim 1, wherein the first contact plug includes a lower portion and an upper portion on the lower portion, the lower portion having a first thickness in the second direction, and the upper portion having a second thickness in the second direction that is greater than the first thickness.

10. The semiconductor device of claim 1, wherein the second contact plug is disposed within an area defined by a contour of the first contact plug in a plan view.

11. The semiconductor device of claim 1, wherein the first contact plug has a shape of a hollow cylinder, and the second contact plug has a shape of a pillar.

12. The semiconductor device of claim 1, further comprising:

a lower circuit pattern on the substrate; and a common source plate (CSP) on the lower circuit pattern, wherein the gate electrode structure and the memory channel structure are disposed on the CSP, and wherein the second contact plug extends through the CSP, and is electrically connected to the lower circuit pattern.

13. A semiconductor device comprising:

a gate electrode structure including gate electrodes spaced apart from each other on a substrate in a first direction perpendicular to an upper surface of the substrate, each of the gate electrodes extending in a second direction parallel to the upper surface of the substrate;

a memory channel structure extending through the gate electrode structure on the substrate;

a first contact plug contacting an upper surface of a first gate electrode of the gate electrodes, the first contact plug extending in the first direction; and a second contact plug contacting a sidewall of a second gate electrode of the gate electrodes, the second gate electrode being directly under the first gate electrode, the second contact plug extending in the first direction and being electrically insulated from ones of the gate electrodes disposed below the second gate electrode, wherein the second contact plug is disposed within an area defined by a contour of the first contact plug in a plan view.

14. The semiconductor device of claim 13, wherein the first contact plug has a shape of a hollow cylinder, and the second contact plug has a shape of a pillar.

15. The semiconductor device of claim 13, wherein the first contact plug includes a lower portion and an upper portion on the lower portion, the lower portion of the first contact plug having a first thickness in the second direction, and the upper portion of the first contact plug having a second thickness in the second direction that is greater than the first thickness, and wherein the second contact plug includes a lower portion and an upper portion on the lower portion, the lower portion of the second contact plug having a first width in the second direction, and the upper portion of the second contact plug having a second width in the second direction that is greater than the first width.

16. The semiconductor device of claim 13, wherein an upper surface of the second contact plug is concave.

17. A semiconductor device comprising:

a lower circuit pattern on a substrate;

a common source plate (CSP) on the lower circuit pattern;

a gate electrode structure including gate electrodes spaced apart from each other on the substrate in a first direction perpendicular to an upper surface of the substrate, each of the gate electrodes extending in a second direction parallel to the upper surface of the substrate, the gate electrode structure having a staircase shape and including step layers each of which includes two gate electrodes neighboring in the first direction among the gate electrodes, and steps of the step layers being disposed in the second direction;

a memory channel structure extending through the gate electrode structure on the CSP;

a first contact plug contacting an upper surface of a first gate electrode of the two gate electrodes included in a corresponding step layer of the step layers, the first gate electrode being disposed at an upper level between the two gate electrodes, and the first contact plug extending in the first direction; and a second contact plug contacting a sidewall of a second gate electrode of the two gate electrodes in the corresponding step layer of the step layers, the second gate electrode being disposed at a lower level between the two gate electrodes, the second contact plug extending in the first direction and being electrically insulated from the CSP and ones of the gate electrodes disposed below the second gate electrode.

18. The semiconductor device of claim 17, wherein lengths in the second direction of the first and second gate electrodes are equal to each other.

19. The semiconductor device of claim 17, wherein an upper surface of the second contact plug is concave, and wherein the second contact plug has a shape of a pillar.

20. The semiconductor device of claim 17, wherein the first contact plug includes a lower portion and an upper portion on the lower portion, the lower portion having a first thickness in the second direction, and the upper portion having a second thickness in the second direction that is greater than the first thickness, and the second contact plug includes a lower portion and an upper portion on the lower portion, the lower portion of the second contact plug having a first width in the second direction, and the upper portion of the second contact plug having a second width in the second direction that is greater than the first width.

* * * * *